United States Patent
Yokoyama et al.

(10) Patent No.: US 9,153,938 B2
(45) Date of Patent: Oct. 6, 2015

(54) LASER DIODE ASSEMBLY AND SEMICONDUCTOR OPTICAL AMPLIFIER ASSEMBLY

(75) Inventors: Hiroyuki Yokoyama, Miyagi (JP); Shunsuke Kono, Miyagi (JP); Masaru Kuramoto, Kanagawa (JP)

(73) Assignees: Sony Corporation, Tokyo (JP); Tohoku University, Sendai-shi (JP)

( * ) Notice: Subject to any disclaimer, the term of this patent is extended or adjusted under 35 U.S.C. 154(b) by 633 days.

(21) Appl. No.: 13/248,741

(22) Filed: Sep. 29, 2011

(65) Prior Publication Data
US 2012/0099185 A1  Apr. 26, 2012

(30) Foreign Application Priority Data
Oct. 26, 2010  (JP) ................. 2010-239457

(51) Int. Cl.
*H01S 5/065* (2006.01)
*B82Y 20/00* (2011.01)
(Continued)

(52) U.S. Cl.
CPC ............... *H01S 5/0657* (2013.01); *B82Y 20/00* (2013.01); *H01S 5/141* (2013.01); *H01S 5/0064* (2013.01); *H01S 5/0071* (2013.01); *H01S 5/0078* (2013.01); *H01S 5/028* (2013.01); *H01S 5/0425* (2013.01); *H01S 5/06251* (2013.01); *H01S 5/101* (2013.01); *H01S 5/1014* (2013.01); *H01S 5/1085* (2013.01); *H01S 5/16* (2013.01); *H01S 5/2009* (2013.01); *H01S 5/22* (2013.01); *H01S 5/309* (2013.01); *H01S 5/3063* (2013.01); *H01S 5/3211* (2013.01); *H01S 5/3216* (2013.01); *H01S 5/34333* (2013.01); *H01S 5/50* (2013.01); *H01S 2301/176* (2013.01)

(58) Field of Classification Search
CPC ...  H01S 3/1106; H01S 3/1109; H01S 3/1112; H01S 5/143
USPC ............................................. 359/340; 372/18
See application file for complete search history.

(56) References Cited

U.S. PATENT DOCUMENTS 4,635,263 A * 1/1987 Mollenauer ........................ 372/3
4,677,635 A * 6/1987 Marciniak et al. ............... 372/55
(Continued)

FOREIGN PATENT DOCUMENTS

CN  201365066  12/2009
JP  H118441  1/1999
(Continued)

OTHER PUBLICATIONS

R. Paschotta, article on "External-cavity Diode Lasers" in the Encyclopedia of Laser Physics and Technology. As appeared on Aug. 19, 2008. http://web.archive.org/web/20080916164247/http://www.rp-photonics.com/external_cavity_diode_lasers.html.*

(Continued)

*Primary Examiner* — Ari M Diacou
(74) *Attorney, Agent, or Firm* — K&L Gates LLP

(57) ABSTRACT

A laser diode assembly includes a mode-locked laser diode device, where a light output spectrum shows long-wavelength shift by self-phase modulation, an external resonator, and a wavelength selective element. A long wavelength component of a pulsed laser beam emitted through the external resonator from the mode-locked laser diode device is extracted by the wavelength selective element, and output to the outside.

16 Claims, 30 Drawing Sheets

(51) Int. Cl.
| | | |
|---|---|---|
| *H01S 5/14* | (2006.01) | |
| *H01S 5/00* | (2006.01) | |
| *H01S 5/028* | (2006.01) | |
| *H01S 5/042* | (2006.01) | |
| *H01S 5/0625* | (2006.01) | |
| *H01S 5/10* | (2006.01) | |
| *H01S 5/16* | (2006.01) | |
| *H01S 5/20* | (2006.01) | |
| *H01S 5/22* | (2006.01) | |
| *H01S 5/30* | (2006.01) | |
| *H01S 5/32* | (2006.01) | |
| *H01S 5/343* | (2006.01) | |
| *H01S 5/50* | (2006.01) | |

(56) References Cited

U.S. PATENT DOCUMENTS

| | | | | |
|---|---|---|---|---|
| 5,097,471 | A * | 3/1992 | Negus et al. | 372/18 |
| 5,363,386 | A * | 11/1994 | Smith | 372/6 |
| 5,537,432 | A * | 7/1996 | Mehuys et al. | 372/50.11 |
| 5,553,093 | A * | 9/1996 | Ramaswamy et al. | 372/100 |
| 5,617,434 | A * | 4/1997 | Tamura et al. | 372/6 |
| 5,633,885 | A * | 5/1997 | Galvanauskas et al. | 372/25 |
| 5,652,763 | A * | 7/1997 | Delfyett, Jr. | 372/107 |
| 5,799,024 | A * | 8/1998 | Bowers et al. | 372/11 |
| 5,802,084 | A * | 9/1998 | Bowers et al. | 372/18 |
| 6,331,991 | B1 * | 12/2001 | Mahgerefteh | 372/33 |
| 6,608,854 | B1 * | 8/2003 | Watanabe | 372/96 |
| 6,698,941 | B2 | 3/2004 | Yokoyama | |
| 6,741,619 | B1 * | 5/2004 | Thoen et al. | 372/18 |
| 6,816,515 | B1 * | 11/2004 | Yun et al. | 372/18 |
| 7,245,419 | B2 * | 7/2007 | Brennan et al. | 359/333 |
| 7,477,666 | B2 * | 1/2009 | Liu | 372/6 |
| 7,535,631 | B2 * | 5/2009 | Brown et al. | 359/341.1 |
| 7,561,605 | B1 * | 7/2009 | Delfyett et al. | 372/25 |
| 7,733,923 | B2 * | 6/2010 | Doerr | 372/18 |
| 7,907,644 | B2 * | 3/2011 | Kopf et al. | 372/12 |
| 7,960,092 | B2 | 6/2011 | Yamatsu et al. | |
| 2001/0026574 | A1 | 10/2001 | Yagi | |
| 2002/0064353 | A1 | 5/2002 | Yokoyama | |
| 2003/0058904 | A1 * | 3/2003 | Krainer et al. | 372/25 |
| 2003/0118060 | A1 * | 6/2003 | Spuehler et al. | 372/18 |
| 2005/0226278 | A1 * | 10/2005 | Gu et al. | 372/6 |
| 2006/0092993 | A1 * | 5/2006 | Frankel | 372/18 |
| 2007/0064755 | A1 * | 3/2007 | Tanaka et al. | 372/43.01 |
| 2010/0020838 | A1 * | 1/2010 | Oota et al. | 372/45.013 |
| 2010/0260214 | A1 * | 10/2010 | Fermann et al. | 372/6 |
| 2011/0157671 | A1 * | 6/2011 | Koplow | 359/238 |
| 2012/0099610 | A1 * | 4/2012 | Kono et al. | 372/18 |

FOREIGN PATENT DOCUMENTS

| | | |
|---|---|---|
| JP | 2001-284716 | 10/2001 |
| JP | 2002-164614 | 6/2002 |
| JP | 2009-049310 | 3/2009 |

OTHER PUBLICATIONS

R. Paschotta, article on "Mode-locked Diode Lasers" in the Encyclopedia of Laser Physics and Technology. As appeared on Dec. 16, 2008. http://web.archive.org/web/20081216114223/http://www.rp-photonics.com/mode_locked_diode_lasers.html.*

R. Paschotta, article on "Self-phase Modulation" in the Encyclopedia of Laser Physics and Technology. As appeared on Dec. 10, 2008. http://web.archive.org/web/20081210050941/http://www.rp-photonics.com/self_phase_modulation.html.*

"Single-angled-facet laser diode for widely tunable external cavity semiconductor lasers with high spectral purity" Electronics Letters vol. 33 No. 16 pp. 1387-1389, Jul. 31, 1997.

"Electronically tunable external-cavity laser diode" Optics Letters vol. 24 No. 22 pp. 1573-1574, Nov. 15, 1999.

Extended European Search Report dated Feb. 18, 2014 in corresponding European Patent Application No. 11008076.9.

Brenner, Semiconductor Diode Lasers for Terahertz Technology, J Infrared Milli Terahz Waves, 2011, 32:1253-1266.

Elsmere, High-Repetition-Rate Subpicosecond Source of Fiber-Amplified Vertical-External-Cavity Surface-Emitting Semiconductor Laser Pulses, IEEE Photonics Tech Letters, Apr. 15, 2008, vol. 20, No. 8.

Dupriez, High-power, single-mode picosecond fiber laser based on amplification of a passively mode-locked 1055-nm VECSEL, IEEE, 2006.

Schlauch, High peak power femtosecond pulses fro modelocked semiconductor laser in external cavity, Electronics Letters, May 22, 2008, vol. 44, No. 11.

Archundia, External cavity multiwavelength semiconductor hybrid mode-locked laser intracavity gain dynamics, Applied Physics Letters 88, 2006, 191117.

100 W peak-power 1 GHz repetition picoseconds optical pulse generation using blue-violet GaInN diode laser mode-locked oscillator and optical amplifier, Applied Physics Letters 97, 2010, 201101.

Japanese Office Action issued Mar. 11, 2014 in corresponding Japanese Patent Application No. 2010-239457.

Japanese Office Action issued Sep. 26, 2014 in corresponding Japanese Application No. 2010-239457.

Koda, 100 W peak-power 1 GHz repetition picoseconds optical pulse generation using blue-violet GaInN diode laser mode-locked oscillator and optical amplifier, Applied Physicals Letters 97, 021101 (2010).

Chinese Office Action issued Mar. 3, 2015 in corresponding Chinese Application No. 201110319081.8.

* cited by examiner

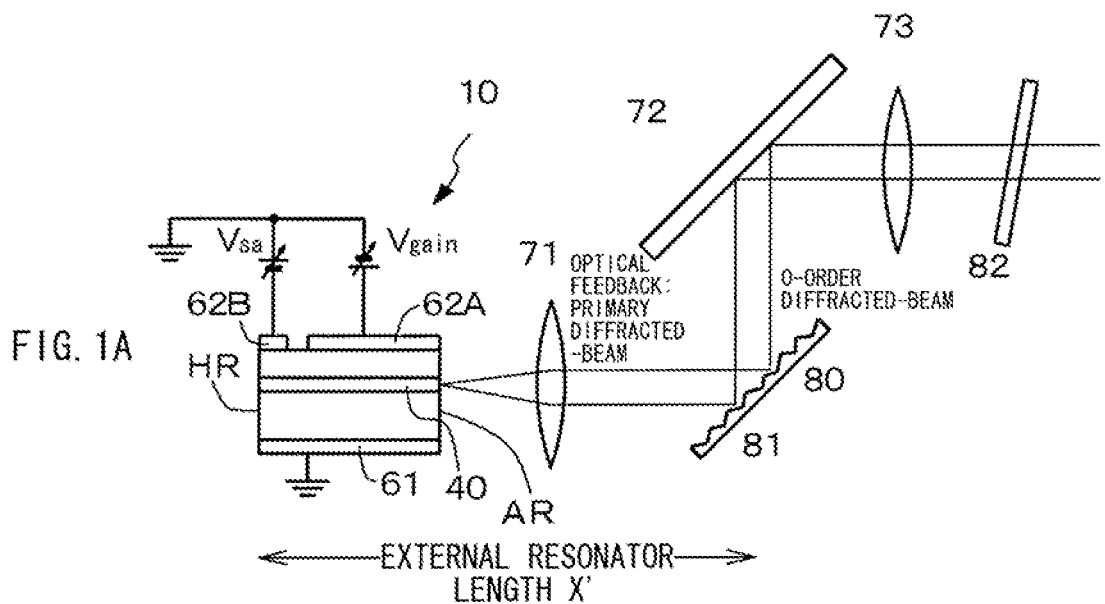
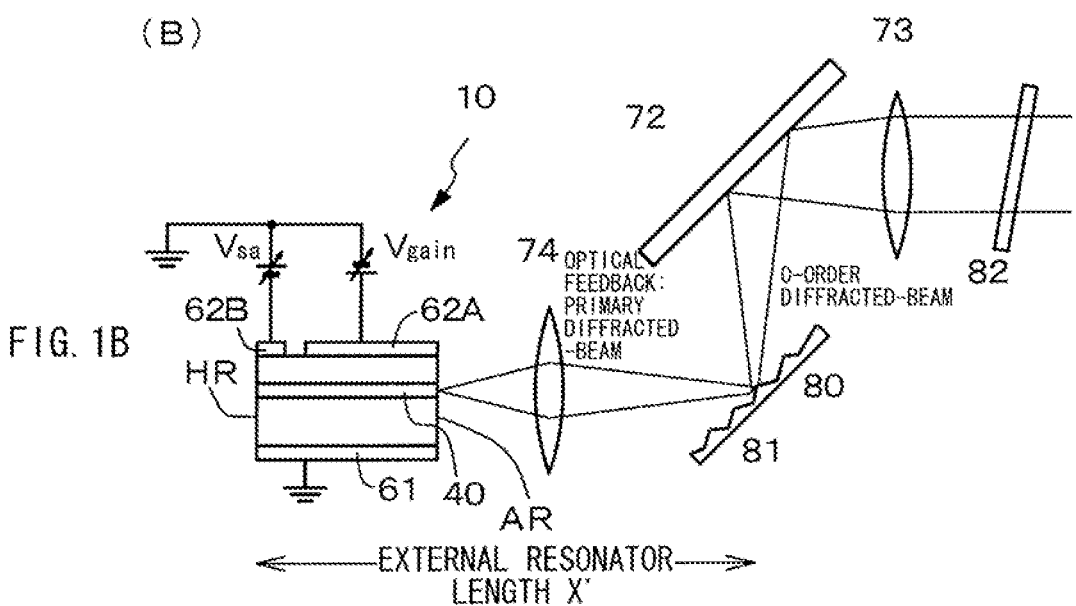

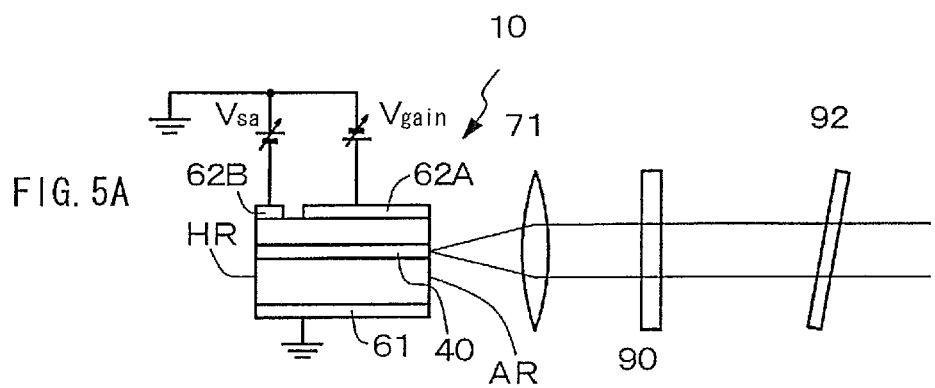
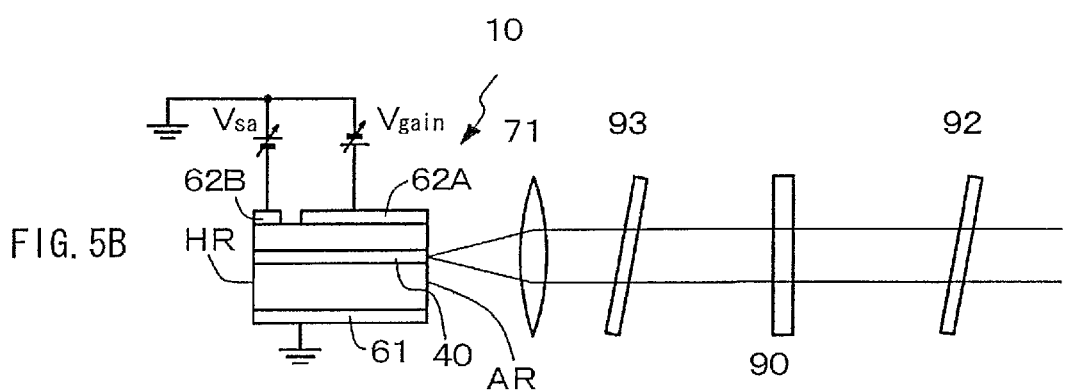
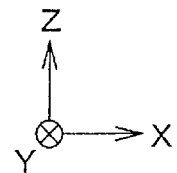

15 μm

15 μm

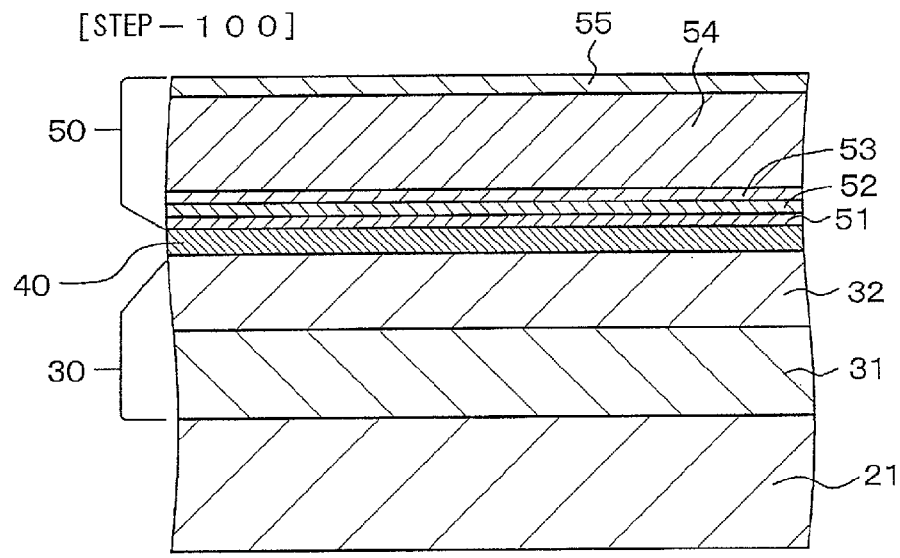
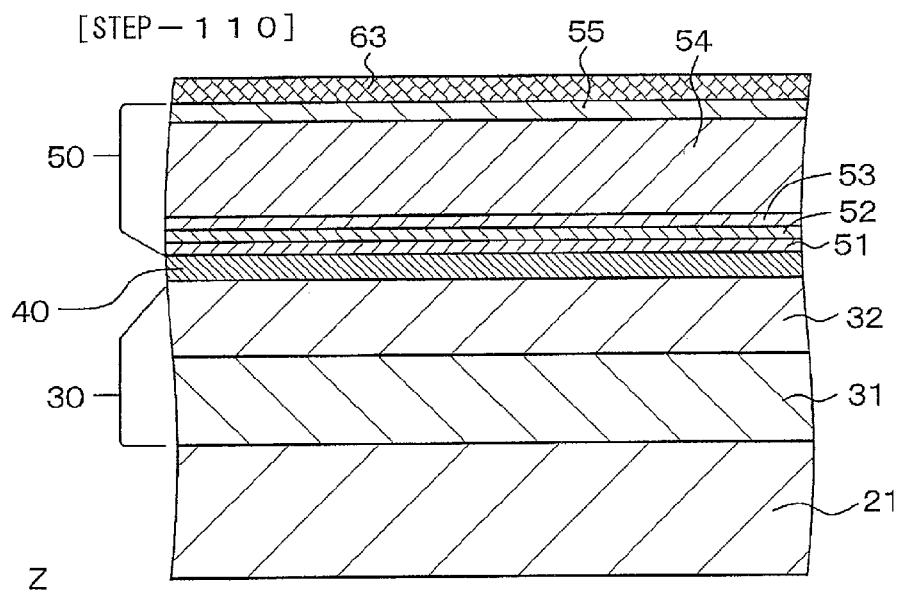
FIG. 28A
FIG. 28B

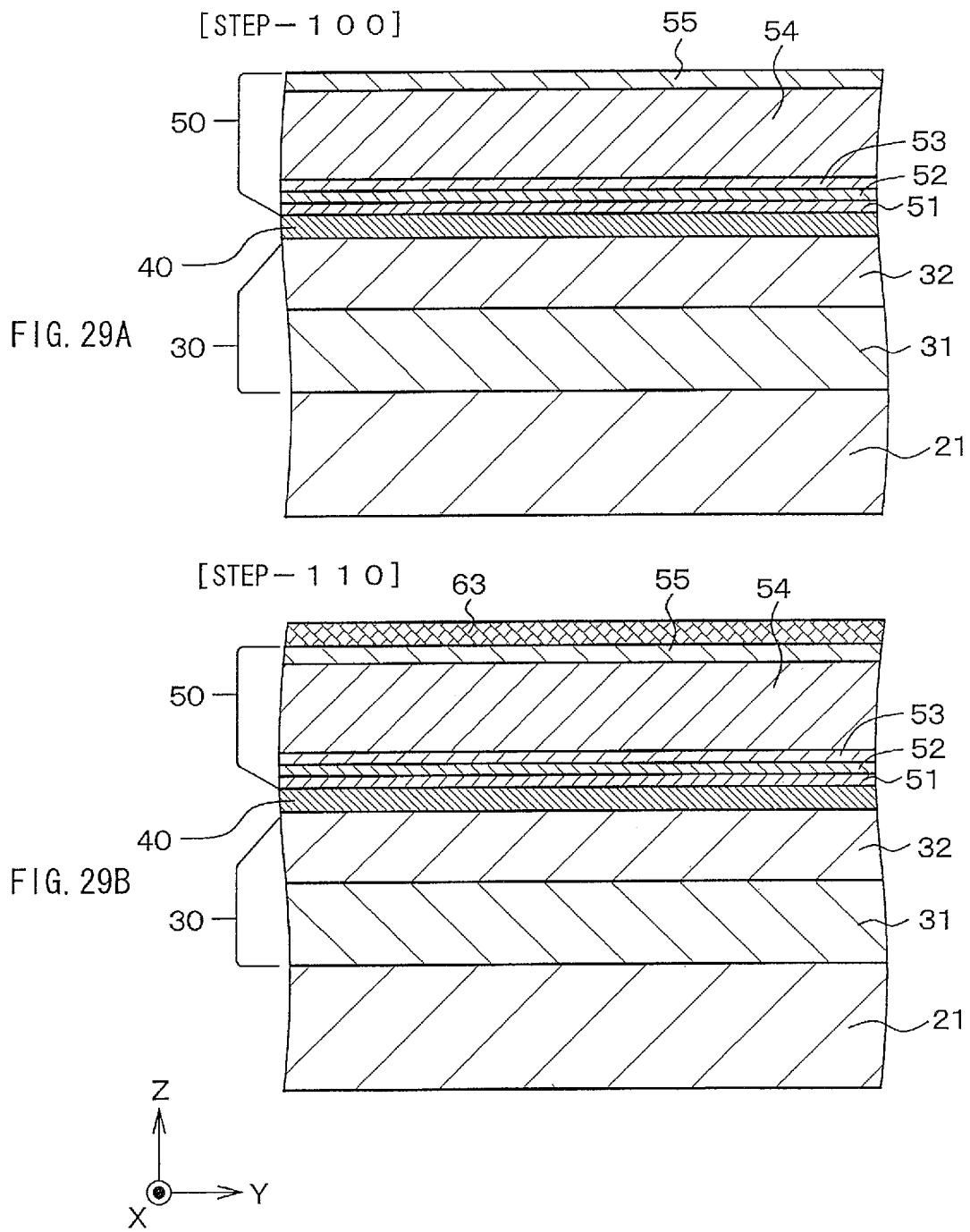

LASER DIODE ASSEMBLY AND SEMICONDUCTOR OPTICAL AMPLIFIER ASSEMBLY

CROSS REFERENCE TO RELATED APPLICATIONS

The present disclosure claims priority to that disclosed in Japanese Priority Patent Application JP 2010-239457 filed in the Japan Patent Office on Oct. 26, 2010, the entire content of which is hereby incorporated by reference.

BACKGROUND

The present disclosure relates to a laser diode assembly and a semiconductor optical amplifier assembly.

Today, ultrashort-pulse ultrahigh-power laser is actively used for study of advanced scientific areas using a laser beam with a pulse time in attoseconds or femtoseconds. The ultrashort pulse laser is actively studied from scientific interest of elucidation of ultrafast phenomenon in picoseconds or femtoseconds, and besides, actively studied for practical use such as microfabrication or two-photon imaging using high peak power. A high-power ultrashort-pulse laser diode device including a GaN-based compound semiconductor with an emission wavelength band of a 405 nm is expected as a light source of a volumetric optical disk system expected as a next-generation optical disk system following the Blu-ray optical disk system, as a light source demanded in a medical or bioimaging field, or as a coherent light source covering the entire visible light range.

For example, titanium/sapphire laser is known as the ultrashort-pulse ultrahigh-power laser. However, the titanium/sapphire laser is an expensive, large solid-state laser light source, which is a main factor of disturbing spread of the laser technology. If the ultrashort-pulse ultrahigh-power laser may be achieved by laser diode or a laser diode device, size reduction, price reduction, low power consumption, and high stability are achieved, which is conceivably breakthrough in promoting spread of the laser technology in the above fields.

A laser diode assembly having an overall semiconductor configuration as such a high-peak-power picosecond-pulse light source in the 405 nm band typically has an MOPA (Master Oscillator and Power Amplifier) configuration. Specifically, the assembly is configured of laser diode generating a picosecond pulse, and a semiconductor optical amplifier (SOA) amplifying the generated picosecond pulse. Here, the optical amplifier directly amplifies a light signal without converting the light signal into an electrical signal, and has a laser structure without a resonator, and thus amplifies incident light with optical gain of the amplifier. A pulse light source generating a picosecond pulse with the MOPA configuration specifically includes a mode-locked laser diode assembly having an external resonator.

The mode-locked laser diode assembly is achieved by, for example, a multi-electrode mode-locked laser diode device and an external resonator disposed on an optical axis of the laser diode device. One end face of the multi-electrode mode-locked laser diode device often has a high-reflective coating layer thereon, and thus also serves as a mirror opposed to the external resonator. In addition, a wavelength selective element such as a diffraction grating or a bandpass filter including a dielectric multilayer film is disposed, making it possible to select an oscillation wavelength.

When the diffraction grating is used as the wavelength selective element, the external resonator is configured of the diffraction grating, and primary diffracted-light is returned to the laser diode device, thereby an oscillation wavelength may be selected. Such an arrangement is known as Littrow arrangement or Littman arrangement, and used for a continuous-oscillation tunable laser (for, example, see Japanese Unexamined Patent Application Publication No. 2001-284716, Heim et al, Electronics Letters, vol. 33, 16, p 1387 (1997), and Struckmeier et al, Optics Letters, vol. 24, 22, p 1573 (1999)). When a bandpass filter is used as the wavelength selective element, the bandpass filter is disposed between a laser diode device and an external resonator to provide wavelength selectivity (for example, see Japanese Unexamined Patent Application Publication No. 2002-164614).

SUMMARY

In the mode-locked laser diode device or the laser diode amplifier, when a light pulse is generated or amplified, the number of carriers in an active medium varies in an extremely short time, sub-picoseconds to picoseconds. Since such temporal change of the number of carriers causes change in energy distribution of carriers, which determines a wavelength of light being generated and amplified, the temporal change may be a cause of change of wavelength within duration of a light pulse. In addition, change of the number of carriers corresponds to change in refractive index of the active medium, which is also a cause of wavelength modulation within duration of a light pulse. These phenomena, called self-phase modulation, lead to long-wavelength shift (wavelength shift to a longer wavelength side) of a light output spectrum. In the mode-locked laser diode device or the laser diode amplifier, since a generation or amplification process of a light pulse involves such a complicated process, a light pulse, which is constant in wavelength within duration of the light pulse and even in phase, is difficult to be generated or amplified.

A light pulse emitted from the mode-locked laser diode device or the laser diode amplifier typically has a component containing fluctuation of light intensity within duration of the pulse due to such self-phase modulation, and therefore, for example, the light pulse may be inappropriately used for nonlinear optical phenomena such as two-photon absorption involving high peak power.

It is desirable to provide a laser diode assembly and a semiconductor optical amplifier assembly that may eliminate fluctuation of light intensity within duration of a pulsed laser beam emitted by a mode-locked laser diode device or a semiconductor optical amplifier, where a light output spectrum shows long-wavelength shift by self-phase modulation.

A laser diode assembly according to an embodiment includes a mode-locked laser diode device, where a light output spectrum shows long-wavelength shift by self-phase modulation, an external resonator, and a wavelength selective element. A long wavelength component of a pulsed laser beam emitted through the external resonator from the mode-locked laser diode device is extracted by the wavelength selective element, and output to the outside.

A semiconductor optical amplifier assembly according to an embodiment includes a semiconductor optical amplifier, where a light output spectrum shows long-wavelength shift by self-phase modulation, and a wavelength selective element. A long wavelength component of a pulsed laser beam output from the semiconductor optical amplifier is extracted by the wavelength selective element, and output to the outside.

In the laser diode assembly according to the embodiment, when a light pulse is generated and amplified, the number of carriers in an active medium varies in an extremely short time, sub-picoseconds to picoseconds. Such temporal change of the number of carriers changes energy distribution of carriers determining a wavelength of light being generated and amplified, causing change of wavelength within duration of a light pulse. As a result, the laser beam contains a large amount of undesired wavelength components. Specifically, a laser beam emitted from the mode-locked laser diode device or the semiconductor optical amplifier is in a noisy state. Such a phenomenon caused by change of the number of carriers includes self-phase modulation. In the mode-locked laser diode device, a light output spectrum shows long-wavelength shift by self-phase modulation. In the semiconductor optical amplifier assembly according to the embodiment, a light output spectrum of the semiconductor optical amplifier shows long-wavelength shift by self-phase modulation. It has been experimentally learned that such a long-wavelength shift component forms a coherent pulse. In the case of the mode-locked laser diode device, a long wavelength component of a pulsed laser beam output through the external resonator from the laser diode device, or in the case of the semiconductor optical amplifier, a long wavelength component of a pulsed laser beam output from the amplifier is extracted by the wavelength selective element and output to the outside. This makes it possible to eliminate fluctuation of light intensity within duration of the output laser beam, and consequently a laser beam having a desired wavelength is output to the outside. Moreover, pulse duration may be shortened, coherence of a laser beam may be improved, a laser beam may be compressed while high throughput is maintained, and high peak power may be achieved. Generally, a long wavelength component is less noisy, or more pure, than a short wavelength component. As a result of the above, a laser beam optimally usable for various technical fields is provided.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding, and are incorporated in and constitute a part of this specification. The drawings illustrate embodiments and, together with the specification, serve to explain the principles of the technology.

FIGS. 1A and 1B are conceptual diagrams of a laser diode assembly of Example 1 and a modification thereof, respectively.

FIGS. 5A and 5B are conceptual diagrams of a laser diode assembly of Example 2 and a modification thereof, respectively.

FIGS. 28A and 28B are schematic partial section views of a substrate and other layers for explaining a method of manufacturing the mode-locked laser diode device in the Example 1.

FIGS. 29A and 29B are schematic partial section views of the substrate and other layers for explaining the method of manufacturing the mode-locked laser diode device in the Example 1 following FIG. 28B.

DETAILED DESCRIPTION

Figure 2A:
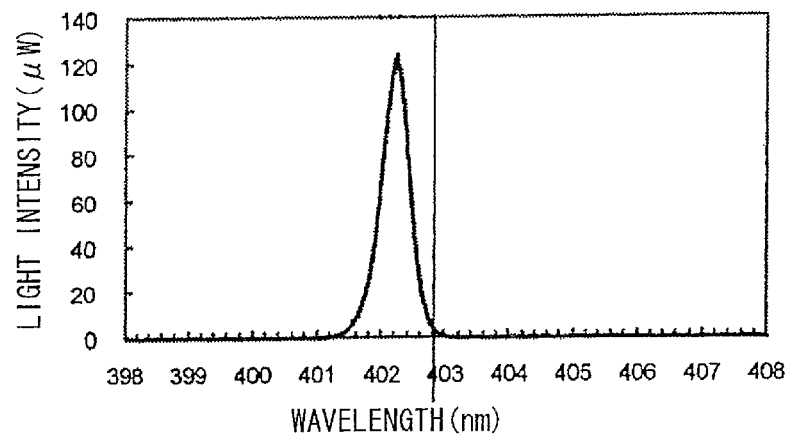
FIGS. 2A to 2C are charts showing light output spectra of a semiconductor optical amplifier assembly of the Example 1.

While the disclosure is described according to Examples with reference to drawings hereinafter, the disclosure is not limited to the Examples, and various numerical values or materials in the Examples are merely shown as an example. Description is made in the following order.
1. General description of laser diode assembly and semiconductor optical amplifier assembly according to an embodiment
2. Example 1 (laser diode assembly according to the embodiment)
3. Example 2 (modification of Example 1)
4. Example 3 (another modification of Example 1)
5. Example 4 (semiconductor optical amplifier assembly according to a first embodiment)
6. Example 5 (modification of Example 4)
7. Example 6 (semiconductor optical amplifier assemblies according to second and third embodiments)
8. Example 7 (modification of Example 6), and others General Description of Laser diode Assembly and Semiconductor Optical Amplifier Assembly According to an Embodiment In a laser diode assembly according to an embodiment, a light output spectrum of a pulsed laser beam emitted through an external resonator from a mode-locked laser diode device contains a plurality of peaks, and one of the peaks is extracted by a wavelength selective element, and output to the outside.

In the laser diode assembly including the above preferable configuration, the external resonator is configured of a diffraction grating, or of a partial transmission mirror (half mirror).

In the laser diode assembly including each of the preferable configurations, the wavelength selective element is configured of a bandpass filter, or of a diffraction grating and an aperture that selects a primary or higher diffracted-beam output from the diffraction grating. The aperture is configured of, for example, a transmissive liquid crystal display having a large number of segments. The bandpass filter is achieved by, for example, alternately stacking dielectric thin-films having a low dielectric constant and dielectric thin-films having a high dielectric constant. In addition, an incidence angle of the pulsed laser beam to the bandpass filter is changed, making it possible to select a wavelength of the laser beam output from the bandpass filter.

Furthermore, in the laser diode assembly including each of the preferable configurations, a second wavelength selective element may be provided between the mode-locked laser diode device and the external resonator. In this case, wavelength selective spectrum width of the second wavelength selective element is wider than that of the wavelength selective element. In this way, the second wavelength selective element is provided, so that only a long-wavelength shift component caused by self-phase modulation is extracted among laser spectra output from the external resonator, and consequently coherent pulses may be advantageously generated.

In a semiconductor optical amplifier assembly according to an embodiment, a light output spectrum of a pulsed laser beam output from a semiconductor optical amplifier contains a plurality of peaks, and one of the peaks is extracted by a wavelength selective element, and output to the outside.

In the semiconductor optical amplifier assembly including the preferable configuration, the wavelength selective element is configured of a bandpass filter, or of a diffraction grating and an aperture that selects a primary or higher diffracted-beam output from the diffraction grating. The aperture is configured of, for example, a transmissive liquid crystal display having a large number of segments.

The laser diode assembly including each of the described preferable configurations may be appropriately combined with the semiconductor optical amplifier assembly including each of the described preferable configurations.

In the laser diode assembly, light output spectrum of the mode-locked laser diode device shows long-wavelength shift by self-phase modulation. In the semiconductor optical amplifier assembly, light output spectrum of the semiconductor optical amplifier shows long-wavelength shift by self-phase modulation. Here, a degree of the long-wavelength shift may be checked by evaluating a light output spectrum of the mode-locked laser diode device in continuous oscillation, or by comparing a light output spectrum of a laser beam, output from the semiconductor optical amplifier receiving a pulse laser beam, to a spectrum of the input light pulse. When an envelope of spectra after long-wavelength shift is lowered below a half-value of a peak at a wavelength after the shift, spectral width given by a half-value of the envelope may be set as a wavelength to be output to the outside. When the envelope of spectra is not lowered to the half-value of the peak and continued to a different peak, a spectral component between a wavelength corresponding to a minimum of the envelope and a wavelength corresponding to a half-value of the envelope, or a spectral component between a wavelength corresponding to a minimum of the envelope and a wavelength corresponding to another minimum of the envelope can be set as a wavelength to be output to the outside.

In the laser diode assembly, when the external resonator is configured of a diffraction grating, among pulsed laser beams emitted from the mode-locked laser diode device, the diffraction grating returns a primary or higher diffracted-beam to the mode-locked laser diode device, and outputs a zero-order diffracted-beam to the wavelength selective element. Here, an image formation device is provided between the mode-locked laser diode device and the diffraction grating for performing image formation, on the diffraction grating, of an image from a beam-output end face of the mode-locked laser diode device. While the image formation device is configured of a lens, this is not limiting, and other devices, for example, a concave mirror or a combination of a concave mirror and a lens may be used. In this case, a laser beam, which is output from the beam-output end face of the mode-locked laser diode device and input to (impinging on) the diffraction grating, is not a parallel beam. Accordingly, even if mechanical vibration or the like is applied to the external resonator, as long as condensed beams do not deviate from an aperture of an image formation lens, the beam-output end face and an image formed on the resonator each are hardly changed in position. This allows suppression of reduction in stability of mode-locked operation. In this case, when lateral length of a laser beam on the beam-output end face of the mode-locked laser diode device is denoted as $L_1$, and lateral length of the image, which is output from the beam-output end face of the mode-locked laser diode device and formed on the diffraction grating, is denoted as $L_2$, the following is preferably satisfied:

$1*10 \leq L_2/L_1 \leq 1*10^2$, desirably $20 \leq L_2/L_1 \leq 50$.

The number of lattice patterns of the diffraction grating involved in a laser beam input to (impinging on) the diffraction grating includes, for example, 1200 to 3600 both inclusive, desirably 2400 to 3600 both inclusive. Alternatively, a lens is disposed between the mode-locked laser diode device and the diffraction grating for making a laser beam emitted from the mode-locked laser diode device into a parallel beam.

In the described laser diode assemblies including the preferable configurations (hereinafter, these may be generally called "laser diode assemblies according to an embodiment"), the mode-locked laser diode device includes a bi-section laser diode device, and the bi-section laser diode device includes: a stacked structure where a first compound semiconductor layer including a GaN-based compound semiconductor having a first conductive type, a third compound semiconductor layer (active layer) configuring a light emitting region including a GaN-based compound semiconductor and a saturable absorption region, and a second compound semiconductor layer including a GaN-based compound semiconductor having a second conductive type different from the first conductive type are sequentially stacked; a strip-shaped second electrode formed on the second compound semiconductor layer; and a first electrode electrically connected to the first compound semiconductor layer, where the second electrode is separated, by an isolation trench, into a first portion that applies a direct current to the first electrode via the light emitting region to produce a forward bias state, and a second portion for applying an electric field to the saturable absorption region.

An electric resistance value between the first and second portions of the second electrode is $1*10$ times or more as high as an electric resistance value between the second and first electrodes, which is preferably $1*10^2$ times or more, and more preferably $1*10^3$ times or more. Such a mode-locked laser diode device is called "first-configuration of mode-locked laser diode device" for convenience. Alternatively, the electric resistance value between the first and second portions of the second electrode is $1*10^2\Omega$ or more, preferably $1*10^3\Omega$ or more, and more preferably $1*10^4\Omega$ or more. Such a mode-locked laser diode device is called "second-configuration of mode-locked laser diode device" for convenience.

In the first-configuration or second-configuration of mode-locked laser diode device, a direct current is applied from the first portion of the second electrode to the first electrode via the light emitting region to produce the forward bias state, and voltage is applied between the first electrode and the second portion of the second electrode to apply an electric field to the saturable absorption region, allowing mode-locked operation.

In the first-configuration or second-configuration of mode-locked laser diode device, the electric resistance value between the first and second portions of the second electrode is 10 times or more as high as the electric resistance value between the second and the first electrodes, or $1*10^2\Omega$ or more. This may securely suppress leakage current from the first portion to the second portion of the second electrode. Specifically, reverse bias voltage $V_{sa}$ applied to the saturable absorption region (non-carrier-injection region) may be increased, making it possible to achieve single-mode mode-locked operation with a short laser beam. Such a high electric resistance value between the first and second portions of the second electrode may be achieved by merely separating the second electrode into the first and second portions by the isolation trench.

In the first-configuration or second-configuration of mode-locked laser diode device, unrestrictedly, the third compound semiconductor layer has a quantum well structure having a well layer and a barrier layer, where thickness of the well layer is 1 nm or more and 10 nm or less, and preferably 1 nm or more and 8 nm or less, and impurity doping concentration of the barrier layer is unrestrictedly $2*10^{18}$ cm$^{-3}$ or more and $1*10^{20}$ cm$^{-3}$ or less, and preferably $1*10^{19}$ cm$^{-3}$ or more and $1*10^{20}$ cm$^{-3}$ or less. Such a mode-locked laser diode device may be called "third-configuration of mode-locked laser diode device" for convenience.

In this way, thickness of the well layer configuring the third compound semiconductor layer is determined to be 1 nm or more and 10 nm or less, and impurity doping concentration of the barrier layer configuring the third compound semiconductor layer is determined to be $2*10^{18}$ cm$^{-3}$ or more and $1*10^{20}$ cm$^{-3}$ or less. That is, thickness of the well layer is reduced, and the number of carriers in the third compound semiconductor layer is increased, which allows influence of piezoelectric polarization to be reduced, resulting in a laser light source that may generate a single-peaked light pulse having a short duration and a small amount of subpulse components. In addition, this enables mode-locked drive at a low reverse bias voltage, and makes it possible to generate a light pulse train in synchronization with an external signal (electric signal or optical signal). While the impurity doped to the barrier layer is silicon (Si), this is not limiting, and the impurity may be oxygen (O).

The mode-locked laser diode device may be a laser diode device having a ridge-stripe-type separate confinement heterostructure (SCH). Alternatively, the mode-locked laser diode device may be formed to be a laser diode device having an oblique ridge-stripe-type separate confinement heterostructure.

In the first-configuration or second-configuration of mode-locked laser diode device, desirably, width of the second electrode is 0.5 μm or more and 50 μm or less, preferably 1 μm or more and 5 μm or less, height of a ridge structure is 0.1 μm or more and 10 μm or less, preferably 0.2 μm or more and 1 μm or less, and width of the isolation trench for separating the second electrode into the first and second portions is 1 μm or more and 50% or less of resonator length of the mode-locked laser diode device (hereinafter, simply called "resonator length"), preferably 10 μm or more and 10% or less of the resonator length. While the resonator length includes, for example, 0.6 mm, this is not limiting. While width of the ridge structure includes, for example, 2 μm or less, and a lower limit value of the ridge structure includes, for example, 0.8 μm, this is not limiting. A distance (D) from a top face of the second compound semiconductor layer in a region outside both sides of a ridge portion to the third compound semiconductor layer (active layer) is preferably $1.0*10-7$ m (0.1 μm) or more. The distance (D) is determined in this way, making it possible to securely form the saturable absorption region on both sides (in a Y direction) of the third compound semiconductor layer.

An upper limit of the distance (D) may be determined based on increase in threshold current, temperature characteristics, or deterioration of current rising rate during long-term drive. In the following description, a resonator length direction is assumed as X direction, and a thickness direction of the stacked structure is assumed as Z direction.

In the first-configuration or second-configuration of mode-locked laser diode device including the above preferable configuration, the second electrode includes a palladium (Pd) single layer, a nickel (Ni) single layer, and a platinum (Pt) single layer, a stacked structure of a palladium layer and a platinum layer with the palladium layer in contact with the second compound semiconductor layer, or a stacked structure of a palladium layer and a nickel layer with the palladium layer in contact with the second compound semiconductor layer. When a lower metal layer includes palladium, and an upper metal layer includes nickel, thickness of the upper metal layer is desirably 0.1 µm or more and preferably 0.2 µm or more. Alternatively, the second electrode is preferably configured of palladium (Pd) single layer. In such a case, thickness of the electrode is desirably 20 nm or more, preferably 50 nm or more. Alternatively, the second electrode is preferably configured of a palladium (Pd) single layer, a nickel (Ni) single layer, and a platinum (Pt) single layer, or stacked structure of a lower metal layer and an upper metal layer with the lower metal layer in contact with the second compound semiconductor layer (where the lower metal layer includes one of metals selected from the group consisting of palladium, nickel and platinum, and the upper metal layer includes a metal, the etching rate of which is equal to, or approximately equal to, or higher than an etching rate of the lower metal layer when the isolation trench is formed in the second electrode in a step (D) described later,). When the isolation trench is formed in the second electrode in the step (D), aqua regia, nitric acid, sulfuric acid, hydrochloric acid, or a mixed solution of two or more of the acids (specifically, a mixed solution of nitric acid and sulfuric acid, or a mixed solution of sulfuric acid and hydrochloric acid) is desirably used as an etchant. Width of the second electrode is desirably 0.5 µm or more and 50 µm or less, preferably 1 µm or more and 5 µm or less.

In the first-configuration or second-configuration of mode-locked laser diode device including each of the described, preferable configurations, length of the saturable absorption region is shorter than length of the light emitting region. Alternatively, length of the second electrode (total length of the first and second portions) is shorter than length of the third compound semiconductor layer (active layer). A disposed state of the first and second portions of the second electrode specifically includes (1) a state where one first portion of the second electrode and one second portion thereof are provided, and the first portion and the second portion are disposed across the isolation trench, (2) a state where one first portion of the second electrode and two second portions thereof are provided, and one end of the first portion is opposed to one second portion across one isolation trench, and the other end of the first portion is in opposed to the other second portion across the other isolation trench, (3) a state where two first portion of the second electrode and one second portion thereof are provided, an end of the second portion is opposed to one first portion across one isolation trench, and the other end of the second portion is opposed to the other first portion across the other isolation trench (a structure of the second electrode where the second portion is sandwiched by the first portions).

In a broad sense, the disposed state includes (4) a state where N first portions of the second electrode and (N-1) second portions of the second electrode are provided in such a manner that the first portions are disposed across each of the second portions, and (5) a state where N second portions of the second electrode and (N-1) first portions thereof are provided, and the second portions are disposed across each of the first portions. In other words, the states of (4) and (5) correspond to (4') a state where N light emitting regions (carrier injection regions and gain regions) and (N-1) saturable absorption regions (non-carrier injection regions) are provided, and the light emitting regions are disposed across each of the saturable absorption regions, and (5') a state where N saturable absorption regions (non-carrier injection regions) and (N-1) light emitting regions (carrier injection regions and gain regions) are provided, and the saturable absorption regions are disposed across each of the light emitting regions, respectively.

Each of the structures of (3), (5), and (5') is used, allowing a beam-output end face of the mode-locked laser diode device to be less likely to be damaged.

The mode-locked laser diode device is manufactured by, for example, the following method. Specifically, the laser diode device is manufactured by a method including the following steps:

(A) a stacked structure is formed in such a manner that a first compound semiconductor layer including a GaN-based compound semiconductor having a first conductive type, a third compound semiconductor layer configuring a light emitting region and a saturable absorption region including a GaN-based compound semiconductor, and a second compound semiconductor layer including a GaN-based compound semiconductor having a second conductive type different from the first conductive type are sequentially stacked on a substrate, and then, (B) a strip-shaped second electrode is formed on the second compound semiconductor layer, and then, (C) at least part of the second compound semiconductor layer is etched with the second electrode as an etching mask, so that a ridge stripe structure is formed, and then (D) a resist layer is formed for forming an isolation trench in the second electrode, and then the isolation trench is formed in the second electrode by wet etching with the resist layer as a wet etching mask, thereby the second electrode is separated into first and second portions by the isolation trench.

Such a manufacturing method is used, that is, at least part of the second compound semiconductor layer is etched with the strip-shaped second electrode as an etching mask, so that the ridge stripe structure is formed, that is, the ridge stripe structure is formed in a self-alignment manner using a patterned second electrode as the etching mask, and therefore the second electrode is hardly misaligned with the ridge stripe structure. In addition, the isolation trench is formed in the second electrode by wet etching. In this way, wet etching is used instead of dry etching, making it possible to suppress deterioration of electrical or optical characteristics of the second compound semiconductor layer. Consequently, deterioration of emission characteristics is securely prevented.

In the step (C), the second compound semiconductor layer is partly or entirely etched in a thickness direction, or the second compound semiconductor layer and the third compound semiconductor layer are etched in the thickness direction, or the second compound semiconductor layer, the third compound semiconductor layer, and part of the first compound semiconductor layer are etched in the thickness direction.

In the step (D) where the isolation trench is formed in the second electrode, when an etching rate of the second electrode is denoted as $ER_0$, and an etching rate of the stacked structure is denoted as $ER_1$, $ER_0/ER_1 \geq 1*10$, preferably, $ER_0/ER_1 \geq 1*10^2$ is desirably satisfied. $ER_0/ER_1$ satisfies such a relationship, making it possible to surely etch the second electrode without etching the stacked structure (or with slight etching of the stacked structure).

In the semiconductor optical amplifier assembly according to the embodiment, the semiconductor optical amplifier includes (a) a stacked structure formed in such a manner that a first compound semiconductor layer including a GaN-based compound semiconductor having a first conductive type, a third compound semiconductor layer having a light amplification region (a carrier injection region and a gain region) including a GaN-based compound semiconductor, and a second compound semiconductor layer including a GaN-based compound semiconductor having the second conductive type different from the first conductive type are sequentially stacked, (b) a second electrode formed on the second compound semiconductor layer, and (c) a first electrode electrically connected to the first compound semiconductor layer, where the stacked structure has a ridge stripe structure, and when width of the ridge stripe structure is denoted as $W_{out}$ on a beam-output end face, and width thereof is denoted as $W_{in}$ on the beam-input end face, $W_{out} > W_{in}$ is satisfied.

In the semiconductor optical amplifier having such a configuration, a non-carrier injection region is desirably provided along an axis of the semiconductor optical amplifier over a certain region of the stacked structure from the beam-output end face. Such a semiconductor optical amplifier assembly according to the embodiment is called "semiconductor optical amplifier assembly according to a first embodiment" for convenience.

Alternatively, in the semiconductor optical amplifier having such a configuration, width of the second electrode is desirably narrower than width of the ridge stripe structure. Such a semiconductor optical amplifier assembly according to the embodiment is called "semiconductor optical amplifier assembly according to a second embodiment" for convenience.

Alternatively, in the semiconductor optical amplifier having such a configuration, when maximum width of the ridge stripe structure is denoted as $W_{max}$, $W_{max} > W_{out}$ is desirably satisfied. Such a semiconductor optical amplifier assembly according to the embodiment is called "semiconductor optical amplifier assembly according to a third embodiment" for convenience.

In the semiconductor optical amplifier assembly according to each of the first to third embodiments, when width of the ridge stripe structure is denoted as $W_{out}$ on the beam-output end face, and width of the ridge stripe structure is denoted as $W_{in}$ on the beam-input end face, $W_{out} > W_{in}$ is satisfied. Specifically, width of a light guide is expanded from a light guide having a narrow width on a light input side satisfying a single mode condition to a light guide having a wide width on a light output side. Accordingly, a mode field may be expanded in accordance with width of the light guide, allowing high light output of the semiconductor optical amplifier to be achieved, and a laser beam to be optically amplified while a single transverse mode is maintained.

In addition, in the semiconductor optical amplifier assembly according to the first embodiment, the non-carrier injection region is provided along the axis of the semiconductor optical amplifier over a certain region of the stacked structure from the beam-output end face. Accordingly, width of a laser beam output from the beam-output end face may be expanded, making it possible to increase light output, and improve reliability. In the semiconductor optical amplifier assembly according to the second embodiment, width of the second electrode is narrower than width of the ridge stripe structure. In the third embodiment, when maximum width of the ridge stripe structure is denoted as $W_{max}$, $W_{max} > W_{out}$ is satisfied. This provides stable transverse-mode amplified light, preventing a laser beam output from the semiconductor optical amplifier assembly from being unstable.

In the semiconductor optical amplifier assembly according to the first embodiment, $W_{out}$ is 5 µm or more. An upper limit value of $W_{out}$ unrestrictedly includes, for example, $4*10^2$ µm. In the semiconductor optical amplifier assembly including such a configuration, $W_{in}$ is 1.4 µm to 2.0 µm both inclusive. These preferable configurations may be also applied to the semiconductor optical amplifier assemblies according to the second and third embodiments.

In the semiconductor optical amplifier assembly according to the second embodiment, a value of a ratio of width of the second electrode to width of the ridge stripe structure is desirably 0.2 to 0.9 both inclusive, preferably 0.6 to 0.9 both inclusive. Here, the width of each of the second electrode and the ridge stripe structure means width of each of the two obtained when the semiconductor optical amplifier is cut along a certain virtual plane orthogonal to an axis of the semiconductor optical amplifier.

In the semiconductor optical amplifier assembly according to the third embodiment, $0.2 \leq W_{out}/W_{max} \leq 0.9$, preferably $0.5 \leq W_{out}/W_{max} \leq 0.9$ is desirably satisfied.

Moreover, in the semiconductor optical amplifier assemblies according to the second and third embodiments including the above preferable configurations, the non-carrier injection region is provided along an axis of the semiconductor optical amplifier over a certain region of the stacked structure from the beam-output end face in the same way as the semiconductor optical amplifier assembly according to the first embodiment. Furthermore, in each of the semiconductor optical amplifier assemblies according to the first to third embodiments, the non-carrier injection region is also provided along the axis of the semiconductor optical amplifier over a certain region of the stacked structure from the beam-input end face.

In the semiconductor optical amplifier assemblies according to the first to third embodiments including the above preferable configurations, the non-carrier injection region has no second electrode, or the second electrode is configured of first and second portions separated from each other by the isolation trench, and the second portion of the second electrode is provided in the non-carrier injection region. In the latter case, a voltage equal to or lower than the built-in voltage is desirably applied to the second portion of the second electrode. Specifically, a voltage of 1.2398/λ or less is desirably applied. Here, λ denotes a wavelength (µm) of an incident laser beam to the semiconductor optical amplifier, and "1.2398" is a constant. For example, when a laser beam having a wavelength of 0.4 µm is inputted, a voltage of 3.0995 V or less is desirably applied. A lower limit value of voltage applied to the second portion of the second electrode unrestrictedly includes, for example, −20 V. While voltage is applied to the first portion of the second electrode for light amplification as an original function of the semiconductor optical amplifier, voltage is applied to the second portion of the second electrode to allow monitoring of light intensity or measurement for position adjustment. In addition, this enables control of a near-field image.

In the semiconductor optical amplifier assemblies according to the first to third embodiments including the above preferable configurations, the axis of the semiconductor optical amplifier and an axis of the ridge stripe structure may cross each other at a predetermined angle. Here, the predetermined angle θ includes, for example, $0.1 \le \theta \le 10$ degrees. The axis of the ridge stripe structure corresponds to a straight line connecting a midpoint between both ends of the ridge stripe structure on the beam-output end face to a midpoint between both ends thereof in the beam-input end face.

In the semiconductor optical amplifier assemblies according to the first to third embodiments including the above preferable configurations, a low-reflective coating layer is formed on each of the beam-input end face and the beam-output end face, the coating layer including a stacked structure of two or more layers selected from the group consisting of a titanium oxide layer, a tantalum oxide layer, a zirconium oxide layer, a silicon oxide layer, and an aluminum oxide layer.

In the semiconductor optical amplifier assemblies according to the first to third embodiments including the above preferable configurations, light intensity density of a laser beam output from the semiconductor optical amplifier is unrestrictedly 60 kW or more per 1 $cm^2$ of the third compound semiconductor layer configuring the beam-output end face, and preferably 600 kW or more.

In the semiconductor optical amplifier assemblies according to the first to third embodiments including the above preferable configurations, a value of a ratio of width of the ridge stripe structure on the beam-output end face to width of a laser beam output from the semiconductor optical amplifier is 1.1 to 10 both inclusive, preferably 1.1 to 5 both inclusive.

In the semiconductor optical amplifier assemblies according to the first to third embodiments including the above preferable configurations (hereinafter, these may be generally called "semiconductor optical amplifier assemblies according to an embodiment and others"), the semiconductor optical amplifier is unrestrictedly configured of a transmissive semiconductor optical amplifier.

In the semiconductor optical amplifier assemblies according to an embodiment and others, when width of the ridge stripe structure is $W_{out}$ on the beam-output end face, and width of the ridge stripe structure is $W_{in}$ on the beam-input end face, $W_{out} > W_{in}$ is satisfied. Here, each end of the ridge stripe structure is configured of one segment (the semiconductor optical amplifier assemblies according to the first and second embodiments), or configured of two or more segments (the semiconductor optical amplifier assemblies according to the first to third embodiments). In the former case, for example, width of the ridge stripe structure is monotonically gradually expanded in a tapered manner from the beam-input end face to the beam-output end face. In the latter case, in the semiconductor optical amplifier assemblies according to the first and second embodiments, for example, width of the ridge stripe structure is initially constant, and then monotonically gradually expanded in a tapered manner from the beam-input end face to the beam-output end face. In the latter case, in the semiconductor optical amplifier assembly according to the second embodiment, for example, width of the ridge stripe structure is initially gradually expanded from the beam-input end face to the beam-output end face, and when the width reaches the maximum width, then the width is narrowed.

In a preferable configuration of the semiconductor optical amplifier assembly according to the first embodiment or each of the semiconductor optical amplifier assemblies according to the second and third embodiments, while the non-carrier injection region is provided along the axis of the semiconductor optical amplifier over the certain region of the stacked structure from the beam-output end face, length of the non-carrier injection region $L_{NC}$ along the axis of the semiconductor optical amplifier (width of the non-carrier injection region) includes, for example, 0.1 μm to 100 μm both inclusive.

Alternatively, in a preferable configuration of the semiconductor optical amplifier assembly according to the first embodiment, or in a preferable configuration of each of the semiconductor optical amplifier assemblies according to the second and third embodiments, while the second electrode is configured of the first and second portions separated from each other by the isolation trench, and the non-carrier injection region has the second portion of the second electrode, when length of the first portion is denoted as $L_{Amp-1}$, and length of the second portion is denoted as $L_{Amp-2}$, $0.001 \le L_{Amp-2}/L_{Amp-1} \le 0.01$, preferably $0.0025 \le L_{Amp-2}/L_{Amp-1} \le 0.01$ is desirably satisfied. An electric resistance value between the first and second portions of the second electrode of the semiconductor optical amplifier is desirably $1*10^2 \Omega$ or more, preferably $1*10^3 \Omega$ or more, and more preferably $1*10^4 \Omega$ or more. Alternatively, the electric resistance value between the first and second portions of the second electrode is desirably, $1*10$ times or more as high as an electric resistance value between the second and first electrodes, preferably $1*10^2$ times or more, and more preferably $1*10^3$ times or more. Alternatively, width of the isolation trench for separating the second electrode into the first and second portions is desirably 1 μm or more and 50% or less of length of the semiconductor optical amplifier, and preferably 10 μm or more and 10% or less of the length of the semiconductor optical amplifier. Alternatively, width of the isolation trench includes, for example, 3 μm to 20 μm both inclusive, and length of the second portion $L_{Amp-2}$ of the second electrode includes, for example, 3 μm to 100 μm both inclusive.

In the semiconductor optical amplifier assemblies according to the embodiment and others, a laser light source is configured of each of the laser diode assemblies according to the embodiment. Alternatively, the laser light source is configured of the mode-locked laser diode device in such a manner that a laser beam emitted by the mode-locked laser diode device is input to the semiconductor optical amplifier. In this case, the laser light source emits a pulsed laser beam based on mode-locked operation.

However, the laser light source is not limited to such configurations, and various types/forms of well-known pulse oscillation laser light sources including a gain switching type and a loss switching type (Q switching type) or a laser light source such as titanium-sapphire laser may be used. The semiconductor optical amplifier assembly according to the embodiment directly amplifies a light signal without converting the signal into an electrical signal, and has a laser structure where a resonator effect is eliminated as much as possible, and amplifies incident light with optical gain of the semiconductor optical amplifier. Specifically, the semiconductor optical amplifier of the semiconductor optical amplifier assemblies according to the embodiment and others may have substantially the same configuration or structure as the mode-locked laser diode device of the laser diode assemblies according to the embodiment, or may have a different configuration or structure from that.

Semiconductor optical amplifiers of the semiconductor optical amplifier assemblies according to an embodiment, having the first-configuration or second-configuration of mode-locked laser diode device including each of the preferable configurations described above or having substantially the same configuration or structure as the first-configuration or second-configuration of mode-locked laser diode device including the preferable configuration described above, may be generally called "mode-locked laser diode devices according to an embodiment" or simply called "mode-locked laser diode devices", hereinafter.

In the mode-locked laser diode devices according to an embodiment and others, the stacked structure is specifically configured of an AlGaInN-based compound semiconductor. More specifically, the AlGaInN-based compound semiconductor includes GaN, AlGaN, GaInN, and AlGaInN. Furthermore, the compound semiconductors may contain on demand boron (B) atoms, thallium (Tl) atoms, arsenic (As) atoms, phosphorus (P) atoms, or antimony (Sb) atoms. In addition, the third compound semiconductor layer (active layer) configuring the light emitting region or light amplification region (gain region) and the saturable absorption region desirably has a quantum well structure. Specifically, the semiconductor layer has a single quantum well structure (QW structure) or a multi-quantum-well structure (MQW structure). The third compound semiconductor layer (active layer) having the quantum well structure has a stacked structure of one or more well layers and one or more barrier layers, where a combination of a compound semiconductor configuring the well layer and a compound semiconductor configuring the barrier layer includes, for example, $In_yGa_{(1-y)}N$ and GaN, $In_yGa_{(1-y)}N$ and $In_zGa_{(1-z)}N$ (where y>z), and $In_yGa_{(1-y)}N$ and AlGaN.

Furthermore, the mode-locked laser diode devices according to an embodiment and others have a structure where the second compound semiconductor layer has a superlattice structure including p-type GaN layers and p-type AlGaN layers stacked alternately, where thickness of the superlattice structure is 0.7 µm or less. The mode-locked laser diode device have such a structure including the superlattice structure, thereby a series resistance component of the mode-locked laser diode devices may be decreased while a high refractive index necessary for a cladding layer is maintained, leading to low operation voltage of the mode-locked laser diode devices. A lower limit value of thickness of the superlattice structure unrestrictedly includes, for example, 0.3 µm, thickness of the p-type GaN layer configuring the superlattice structure includes, for example, 1 nm to 5 nm both inclusive, thickness of the p-type AlGaN layer configuring the superlattice structure includes, for example, 1 nm to 5 nm both inclusive, and the total layer number of the p-type GaN layers and the p-type AlGaN layers includes, for example, 60 to 300 both inclusive. A distance from the third compound semiconductor layer to the second electrode is 1 µm or less, preferably 0.6 µm or less. The distance from the third compound semiconductor layer to the second electrode is determined in this way, making it possible to reduce thickness of the p-type second compound semiconductor layer having high resistance, leading to reduction in operation voltage of the mode-locked laser diode device. A lower limit value of the distance from the third compound semiconductor layer to the second electrode unrestrictedly includes, for example, 0.3 µm. In addition, the second compound semiconductor layer is doped with Mg of $1*10^{19}$ cm$^{-3}$ or more, and the absorption coefficient of the second compound semiconductor layer to light having a wavelength of 405 nm emitted from the third compound semiconductor layer is 50 cm$^{-1}$ or more. The atomic concentration of Mg is based on a material property: the semiconductor layer has a maximum hole concentration at a Mg atom concentration value of $2*10^{19}$ cm$^{-3}$, and provided as a result of a design to achieve maximum hole concentration, or minimum specific resistance of the second compound semiconductor layer. The absorption coefficient of the second compound semiconductor layer is determined from a point of view that resistance of the mode-locked laser diode devices is lowered as much as possible, as a result, light absorption coefficient of the second compound semiconductor layer is typically 50 cm$^{-1}$. However, the doping amount of Mg may be intentionally set to the concentration of $2*10^{19}$ cm$^{-3}$ or more in order to increase the absorption coefficient. In such a case, an upper limit of the doping amount of Mg to obtain a practical hole concentration is, for example, $8*10^{19}$ cm$^{-3}$. The second compound semiconductor layer has a non-doped compound semiconductor layer and a p-type compound semiconductor layer from a third compound semiconductor layer side, and a distance from the third compound semiconductor layer to the p-type compound semiconductor layer is $1.2*10^{-7}$ m or less.

The distance from the third compound semiconductor layer to the p-type compound semiconductor layer is determined in this way, thereby internal loss may be suppressed within a range without causing decrease in internal quantum efficiency, making it possible to reduce threshold current density at which laser oscillation starts. A lower limit value of the distance from the third compound semiconductor layer to the p-type compound semiconductor layer unrestrictedly includes, for example, $5*10^{-8}$ m. A stacked insulating film including a $SiO_2$/Si stacked structure is formed on both sides of a ridge portion, and difference in effective refractive index between the ridge portion and the stacked insulating film is $5*10^{-3}$ to $1*10^{-2}$ both inclusive. Such a stacked insulating film is used, thereby even if high output operation of more than 100 mW is performed, a single basic transverse mode may be maintained. In the second compound semiconductor layer, for example, a non-doped GaInN layer (p-side light guide layer), a non-doped AlGaN layer (p-side cladding layer), a Mg-doped AlGaN layer (electron barrier layer), a superlattice structure (superlattice cladding layer) of (Mg-doped) GaN layers/AlGaN layers, and a Mg-doped GaN layer (p-side contact layer) are stacked from a third compound semiconductor layer side. In the third compound semiconductor layer, bandgap of a compound semiconductor configuring the well layer is desirably 2.4 eV or more. A wavelength of a laser beam emitted from the third compound semiconductor layer (active layer) is desirably 360 nm to 500 nm both inclusive, preferably 400 nm to 410 nm both inclusive. It is needless to say that the described various configurations may be appropriately combined.

In the mode-locked laser diode device according to an embodiment and others, the various GaN-based compound semiconductor layers configuring the mode-locked laser diode device are sequentially formed on a substrate, where the substrate may include, in addition to the sapphire substrate, a GaAs substrate, a GaN substrate, a SiC substrate, an alumina substrate, a ZnS substrate, a ZnO substrate, an MN substrate, a LiMgO substrate, a $LiGaO_2$ substrate, a $MgAl_2O_4$ substrate, an InP substrate, and a Si substrate, each of which may have a base layer or buffer layer formed on a surface (major surface) thereof. When the GaN-based compound semiconductor layer is mainly formed on a substrate, while the GaN substrate is preferably used due to a low defect density thereof, the GaN substrate is known to be changed in property between polar, nonpolar, and semipolar depending on growth faces. A formation method of the various GaN-based compound semiconductor layers configuring the mode-locked laser diode devices may include organic metal chemical vapor deposition (MOCVD or MOVPE), molecular beam epitaxy (MBE), and hydride vapor deposition, in which halogen contributes to transport or a reaction.

An organic gallium source gas in MOCVD may include trimethyl gallium (TMG) gas and triethyl gallium (TEG) gas, and a nitrogen source gas may include ammonia gas and hydrazine gas. To form a GaN-based compound semiconductor layer having the n-type conductive type, for example, silicon (Si) is doped as an n-type impurity (n-type dopant), and to form a GaN-based compound semiconductor layer having the p-type conductive type, for example, magnesium (Mg) is doped as a p-type impurity (p-type dopant). When aluminum (Al) or indium (In) is contained as a constituent atom of the GaN-based compound semiconductor layer, trimethyl aluminum (TMA) gas is used as an Al source, and trimethyl indium (TMI) gas is used as an In source. Furthermore, monosilane gas ($SiH_4$ gas) is used as a Si source, and cyclopentadienyl magnesium gas, methyl cyclopentadienyl magnesium, or bis(cyclopentadienyl)magnesium ($Cp_2Mg$) is used as a Mg source. The n-type impurity (n-type dopant) may include, in addition to Si, Ge, Se, Sn, C, Te, S, O, Pd, and Po, and the p-type impurity (p-type dopant) may include, in addition to Mg, Zn, Cd, Be, Ca, Ba, C, Hg, and Sr.

When the first conductive type is the n type, the first electrode electrically connected to the first compound semiconductor layer having the n-type conductive type desirably has a single-layer or multilayer configuration containing one or more metal selected from the group consisting of Gold (Au), silver (Ag), palladium (Pd), Al (aluminum), Ti (titanium), tungsten (W), Cu (copper), Zn (zinc), tin (Sn) and indium (In), and, for example, includes Ti/Au, Ti/Al, Ti/Pt/Au. The first electrode is electrically connected to the first compound semiconductor layer, which includes a configuration where the first electrode is formed on the first compound semiconductor layer, and a configuration where the first electrode is connected to the first compound semiconductor layer with a conductive material layer and a conductive substrate in between. The first or second electrode may be deposited by a PVD method, for example, a vacuum evaporation method or a sputtering method.

A pad electrode may be provided on the first or second electrode for electrical connection with an external electrode or circuit. The pad electrode desirably has a single-layer or multilayer configuration containing one or more metal selected from the group consisting of Ti (titanium), aluminum (Al), Pt (platinum), Au (gold), and Ni (nickel). Alternatively, the pad electrode may be formed in a multilayer configuration, for example, a multilayer configuration of Ti/Pt/Au or a Ti/Au.

As described before, the first or second configuration of mode-locked laser diode device is desirably configured such that reverse bias voltage is applied between the first electrode and the second portion, namely, configured such that the first electrode is a cathode and the second portion is an anode. The second portion of the second electrode may be applied with a pulse current or pulse voltage in synchronization with a pulse current or pulse voltage applied to the first portion of the second electrode, or may be applied with a DC bias. Alternatively, an electric current is applied to the first electrode via a light emitting region from the second electrode, and an external electric signal is superimposed to the first electrode from the second electrode via the light emitting region. This enables a laser beam to be synchronized with the external electric signal. Alternatively, a light signal is input from one end face of the stacked structure. This also enables a laser beam to be synchronized with the external electric signal. In the mode-locked laser diode devices according to an embodiment, a non-doped compound semiconductor layer (for example, non-doped GaInN layer or non-doped AlGaN layer) may be formed in the second compound semiconductor layer between the third compound semiconductor layer and the electron barrier layer. Furthermore, a non-doped GaInN layer as a light guide layer may be formed between the third compound semiconductor layer and the non-doped compound semiconductor layer. A Mg-doped GaN layer (p-side contact layer) may be provided as a top layer of the second compound semiconductor layer.

As described above, the described configurations of the mode-locked laser diode device may by substantially used even for the semiconductor optical amplifier of the semiconductor optical amplifier assembly according to the embodiment depending on a configuration of the amplifier. In addition, even the semiconductor optical amplifier of the semiconductor optical amplifier assembly according to the embodiment may be unrestrictedly manufactured, depending on a configuration of the amplifier, by the same method as the manufacturing method of the mode-locked laser diode device as described above.

The laser diode assembly or the semiconductor optical amplifier assembly according to the embodiment may be applied to various fields, for example, an optical disk system, communication, optical information, an opto-electronic integrated circuit, application of nonlinear optical phenomena, an optical switch, laser measurement or various analyses, ultrafast spectroscopy, multiphoton-excited spectroscopy, mass spectrometry, microscopic spectroscopy using multiphoton absorption, quantum control of chemical reactions, nano-3D processing, various processing using multi-photon absorption, medical service, and bioimaging.

Example 1

Figure 3:
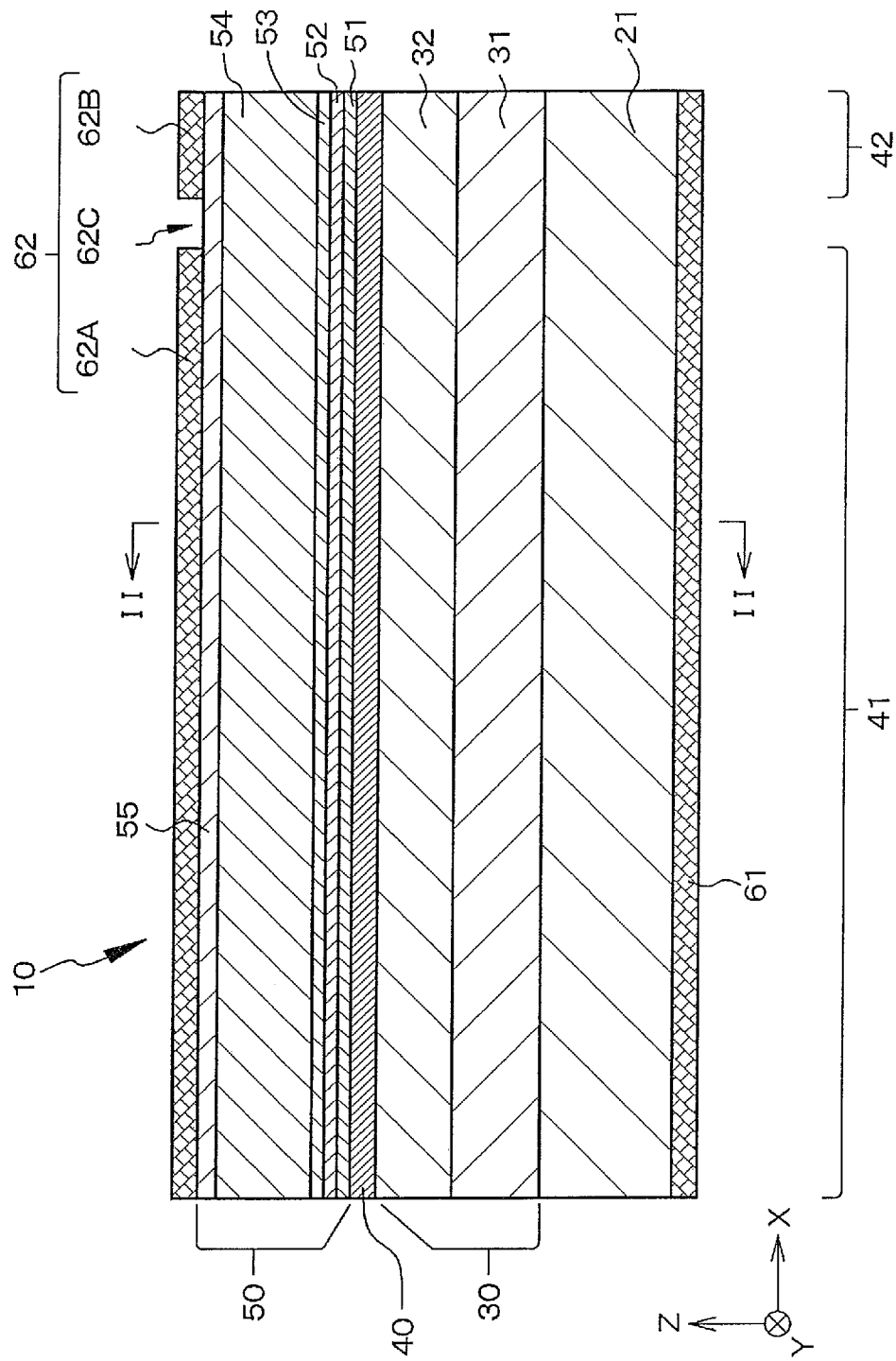
FIG. 3 is a schematic end view of a mode-locked laser diode device in the Example 1 along an extending direction of a resonator.
Figure 4:
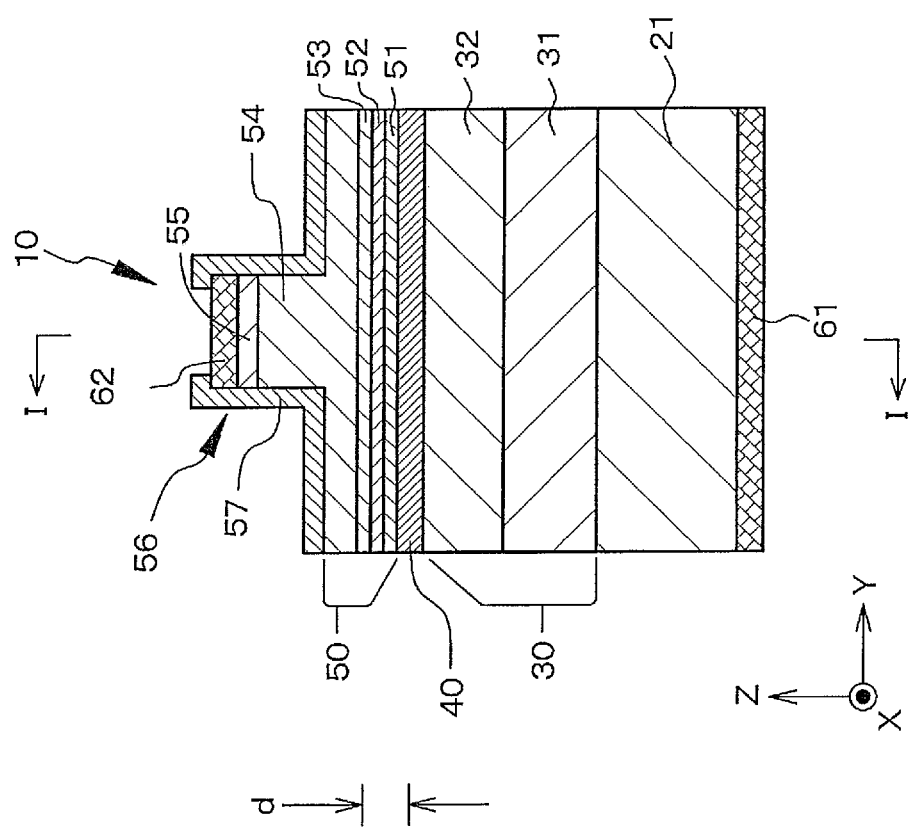
FIG. 4 is a schematic section view of the mode-locked laser diode device in the Example 1 along a direction perpendicular to the extending direction of the resonator.

Example 1 relates to the laser diode assembly according to the embodiment. FIG. 1A illustrates a conceptual diagram of the laser diode assembly of the Example 1. FIG. 3 illustrates a schematic end view of a mode-locked laser diode device in the Example 1 along an extending direction of a resonator (schematic end view as cut along an XZ plane), and FIG. 4 illustrates a schematic section view thereof along a direction perpendicular to the extending direction of the resonator (schematic section view as cut along a YZ plane). FIG. 3 is a schematic end view along an arrow I-I in FIG. 4, and FIG. 4 is a schematic section view along an arrow II-II in FIG. 3.

The laser diode assembly of the Example 1 includes a mode-locked laser diode device 10, where a light output spectrum shows long-wavelength shift by self-phase modulation, an external resonator 80, and a wavelength selective element 82.

A long wavelength component of a pulsed laser beam emitted from the mode-locked laser diode device 10 through the external resonator 80 is extracted by the wavelength selective element 82, and output to the outside.

In the laser diode assembly of the Example 1, the external resonator 80 is configured of a diffraction grating 81. The diffraction grating 81 returns, among laser beams emitted from the mode-locked laser diode device 10, primary or higher diffracted-beam (primary diffracted-beam in each Example) to the mode-locked laser diode device 10, and outputs zero-order diffracted-beam to the wavelength selective element 82. The diffraction grating 81 configures an external resonator, and serves as an output coupler. The wavelength selective element 82 is configured of a bandpass filter.

A lens 71 having a positive power is disposed between the mode-locked laser diode device 10 and the diffraction grating 81 for making a laser beam from the laser diode device 10 into a parallel beam. The zero-order diffracted-beam output from diffraction grating 81 is reflected by a reflecting mirror 72, and then collimated by a collimation lens 73 into parallel beams, and then provided as laser output through the wavelength selective element 82.

A mode-locked laser diode device 10 with an emission wavelength band of 405 nm in the Example 1 or Examples 2 to 3 described later, or a laser light source 100 of the semiconductor optical amplifier assembly according to an embodiment as described later on demand (hereinafter, these may be generally called "mode-locked laser diode device 10 in the Example 1 and others") is configured of the first-configuration or second-configuration of mode-locked laser diode device, and includes a bi-section laser diode device. The bi-section laser diode device includes: a stacked structure, in which a first compound semiconductor layer 30 including a GaN-based compound semiconductor having the first conductive type (specifically, n-type conductive type in each Example), a third compound semiconductor layer (active layer) 40 configuring a light emitting region (gain region) 41 and a saturable absorption region 42 including a GaN-based compound semiconductor, and a second compound semiconductor layer 50 including a GaN-based compound semiconductor having a second conductive type different from the first conductive type (specifically, p type conductive type in each Example) are sequentially stacked; a strip-shaped second electrode 62 formed on the second compound semiconductor layer 50; and a first electrode 61 electrically connected to the first compound semiconductor layer 30.

Specifically, the mode-locked laser diode device 10 in the Example 1 and others has a ridge-stripe-type separate confinement heterostructure (SCH). More specifically, the mode-locked laser diode device 10 is an index-guide-type GaN-based laser diode device including AlGaInN developed for a Blu-ray optical disk system, and has a ridge structure (ridge stripe structure). Specifically, the first compound semiconductor layer 30, the third compound semiconductor layer 40, and the second compound semiconductor layer 50 each include an AlGaInN-based compound semiconductor. More specifically, in the Example 1 or Example 2 described later, the layers have a layer configuration as shown in the following Table 1. In Table 1, a compound semiconductor layer listed on a lower side corresponds to a layer nearer to an n-type GaN substrate 21. In the third compound semiconductor layer 40, a bandgap of a compound semiconductor configuring a well layer is 3.06 eV. The mode-locked laser diode device 10 in the Example 1 and others is provided on a (0001) plane of the n-type GaN substrate 21, and the third compound semiconductor layer 40 has a quantum well structure. The (0001) plane of the n-type GaN substrate 21, called "C plane", is a crystal plane having polarity.

TABLE 1

Second compound semiconductor layer 50

(Mg-doped) p-type GaN contact layer 55
(Mg-doped) p-type GaN/AlGaN superlattice cladding layer 54
(Mg-doped) p-type AlGaN electron barrier layer 53
Non-doped AlGaN cladding layer 52
Non-doped GaInN light guide layer 51
Third compound semiconductor layer 40

GaInN quantum well active layer
(well layer: $Ga_{0.92}In_{0.08}N$/barrier layer: $Ga_{0.98}In_{0.02}N$)

TABLE 1-continued

First compound semiconductor layer 30

N-type GaN cladding layer 32
N-type AlGaN cladding layer 31
where
Well layer (double layer) 10.5 nm, non-doped
Barrier layer (triple layer) 14 nm, non-doped Part of the p-type GaN contact layer 55 and part of the p-type GaN/AlGaN superlattice cladding layer 54 are removed by an RIE method, so that a ridge structure (ridge portion 56) is formed. A stacked insulating film 57 including $SiO_2$/Si is formed on both sides of the ridge portion 56. A $SiO_2$ layer is a lower layer, and a Si layer is an upper layer. A difference in effective refractive index between the ridge portion 56 and the stacked insulating film 57 is $5*10^{-3}$ to $1*10^{-2}$ both inclusive, specifically $7*10^{-3}$. A second electrode (p-side ohmic electrode) 62 is formed on the p-type GaN contact layer 55 corresponding to a top surface of the ridge portion 56. A first electrode (n-side ohmic electrode) 61 including Ti/Pt/Au is formed on a back of the n-type GaN substrate 21.

In the mode-locked laser diode device 10 in the Example 1 and others, the p-type AlGaN electron barrier layer 53 as a Mg-doped compound semiconductor layer, the p-type GaN/AlGaN superlattice cladding layer 54, and the p-type GaN contact layer 55 are prevented, as much as possible, from being overlapped on light density distribution generated from the third compound semiconductor layer 40 and the neighborhood thereof, thereby internal loss is suppressed within a range without reducing internal quantum efficiency. This reduces threshold current density at which laser oscillation starts. Specifically, a distance d from the third compound semiconductor layer 40 to the p-type AlGaN electron barrier layer 53 is 0.10 μm, height of the ridge portion (ridge structure) is 0.30 μm, thickness of the second compound semiconductor layer 50 located between the second electrode 62 and the third compound semiconductor layer 40 is 0.50 μm, and thickness of a portion of the p-type GaN/AlGaN superlattice cladding layer 54 located below the second electrode 62 is 0.40 μm.

In the mode-locked laser diode device 10 in the Example 1 and others, the second electrode 62 is separated, by an isolation trench 62C, into the first portion 62A for producing a forward bias state by applying a direct current to the first electrode 61 via the light emitting region (gain region) 41, and the second portion 62B for applying an electric field to the saturable absorption region 42 (second portion 62B for applying a reverse bias voltage $V_{sa}$ to the saturable absorption region 42). An electric resistance value between the first portion 62A and the second portion 62B of the second electrode 62 (the value may be called "separation resistance value" below) is $1*10$ times or more as high as an electric resistance value between the second electrode 62 and the first electrode 61, specifically $1.5*10^3$ times. The electric resistance value (separation resistance value) between the first portion 62A and the second portion 62B of the second electrode 62 is $1*10^2 \Omega$ or more, specifically $1.5*10^4 \Omega$.

In the laser diode assembly of the Example 1, a diffraction grating 81 includes a holographic-type diffraction grating, and grooves are formed at the rate of 3600/mm on the grating.

Figure 31A:
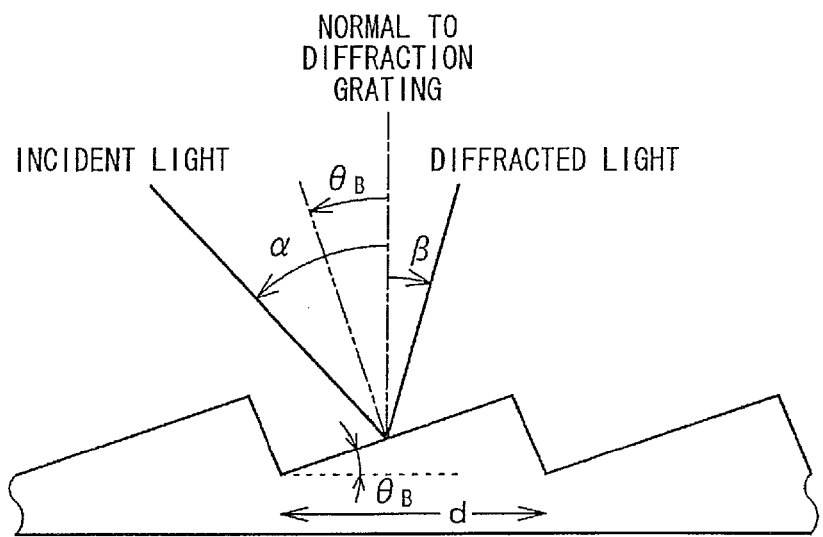
FIGS. 31A and 31B are schematic partial section views of a diffraction grating.

As illustrated in FIG. 31A, it is assumed that light having a wavelength λ enters a reflective diffraction grating at an angle α, and is diffracted at an angle β. Here, the angle α or β is an angle from the normal to the diffraction grating, and counterclockwise direction is assumed to be positive. Thus, the grating equation is as follows. N is the number of grooves per millimeter of diffraction grating (a reciprocal of a period of the diffraction grating), and m is the order of diffraction (m=0, ±1, ±2 . . . ).

$$\sin(\alpha)+\sin(\beta)=N*m*\lambda \quad (A)$$

When incident light and the m-order diffracted light are in a relationship of mirror reflection with respect to a slope of the groove, most energy concentrates on the m-order diffracted light. Here, when an inclination angle of the groove, which is called blaze angle, is denoted as $\theta_B$, the following is given:

$$\theta_B=(\alpha+\beta)/2.$$

In this state, when a wavelength of the light, which is called blaze wavelength, is denoted as $\lambda_B$, the following is given:

$$\lambda_B=\{2/(N*m)\} \sin(\theta_B)*\cos(\alpha-\theta_B).$$

Figure 31B:
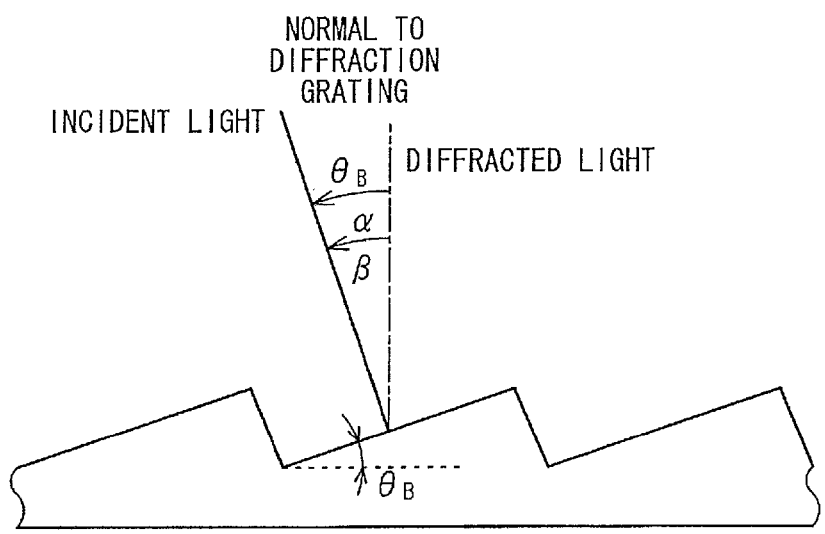

When a wavelength of plus first-order diffracted light, returning in a direction of the incident light as illustrated in FIG. 31B, is denoted as $\lambda_1$, $\alpha=\beta=\beta_B$ is given, and eventually the following is given.

$$\lambda_1=(2/N)\sin(\theta_B) \quad (B)$$

Such an arrangement is called Littrow arrangement.

An anti-reflective (AR) coating layer or a low-reflective coating layer is formed on the beam-output end face, opposed to the lens 71, of the mode-locked laser diode device 10 in the Example 1 and others. A high-reflective coating layer (HR) is formed on an end face, opposite the beam-output end face, of the mode-locked laser diode device 10. The saturable absorption region 42 is provided on the end face side opposite the beam-output end face of the mode-locked laser diode device 10. The anti-reflective coating layer (low-reflective coating layer) may include a stacked structure of two or more layers selected from the group consisting of a titanium oxide layer, a tantalum oxide layer, a zirconium oxide layer, a silicon oxide layer, and an aluminum oxide layer.

Pulse repetition frequency of the mode-locked laser diode device 10 in the Example 1 and others is assumed as 1 GHz. A distance (X') between the end face, opposite the beam-output end face, of the mode-locked laser diode device 10 and the external resonator is 150 mm. Repetition frequency f of a light pulse train is determined by the external resonator length X', and expressed by the following expression. In the expression, c denotes the velocity of light, and n denotes a refractive index of a waveguide.

$$f=c/(2n*X')$$

The laser beam emitted from the mode-locked laser diode device 10 has a certain wavelength range. Specifically, when the mode-locked laser diode device 10 generates a laser beam, self-phase modulation occurs, so that a light output spectrum shows long-wavelength shift. Such generated laser beam is inconstant in wavelength within duration of the beam, and uneven in phase. In addition, the laser beam contains a large amount of undesired wavelength components. Specifically, the laser beam emitted from the mode-locked laser diode device 10 is in a noisy state. In the Example 1, a long wavelength component of such a pulsed laser beam, which is emitted through the external resonator 80 from the mode-locked laser diode device 10, is extracted by the wavelength selective element 82, and output to the outside. Accordingly, a laser beam output to the outside may be eliminated in fluctuation of light intensity within the duration of the output laser beam, and has a desired wavelength. In addition, pulse duration may be shortened, and coherence of the laser beam may be improved. Furthermore, the laser beam may be compressed while high throughput is maintained, leading to high peak power.

Resonator length of the mode-locked laser diode device 10 is 600 μm, and respective lengths of the first portion 62A, the second portion 62B, and the isolation trench 62C of the second electrode 62 are 550 μm, 30 μm, and 20 μm. In the laser diode assembly of the Example 1 having such a mode-locked laser diode device 10, when an electric current of 100 mA was applied to the first portion 62A of the second electrode 62, and a reverse bias voltage of 17.5 V (−17.5 V) was applied to the first portion 62A thereof, mean power was 5.9 mW at an operation temperature of 25° C.

Figure 2B:
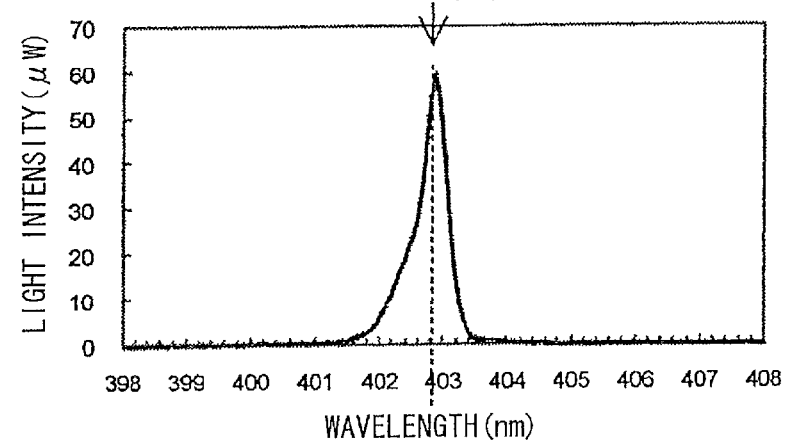
Figure 2C:
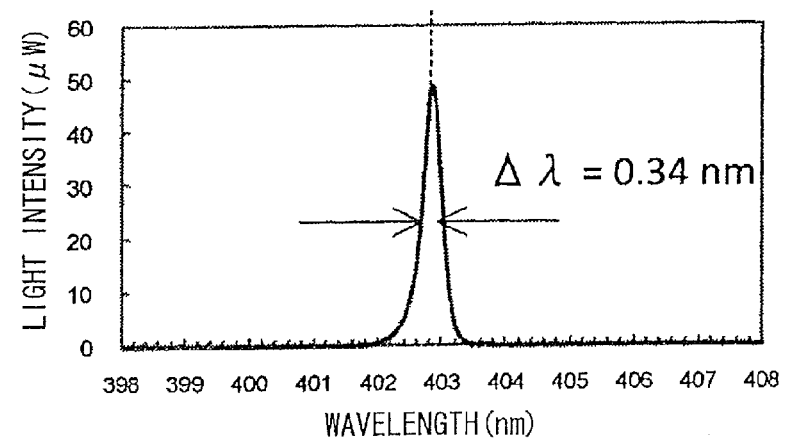

FIGS. 2A to 2C illustrate light output spectra of the semiconductor optical amplifier assembly of the Example 1. FIG. 2A is a chart illustrating a light output spectrum of a laser beam obtained when the mode-locked laser diode device 10 is continuously oscillated, FIG. 2B is a chart illustrating a light output spectrum of a laser beam obtained when the mode-locked laser diode device 10 is pulse-oscillated, and FIG. 2C illustrates a light output spectrum of a laser beam after extracting, by the wavelength selective element 82 including a bandpass filter, a main peak on a long wavelength side from a pulsed laser beam emitted from the mode-locked laser diode device 10. Various specifications in respective states illustrated in FIGS. 2A to 2C are shown in the following Table 2. In Table 2, "Electric current 1" means an electric current (mA) applied to the first portion 62A of the second electrode 62, "Reverse bias voltage" means a reverse bias voltage (V) applied to the first portion 62A of the second electrode 62, a positive value corresponds to a value of voltage applied from the first portion 62A of the second electrode 62 to the first electrode 61, and a negative value corresponds to a value of voltage applied from the first electrode 61 to the first portion 62A of the second electrode 62.

TABLE 2

|  | FIG. 2A | FIG. 2B | FIG. 2C |
| --- | --- | --- | --- |
| Electric current 1 | 120 mA | 120 mA | 120 mA |
| Reverse bias voltage | +4 V | −18 V | −18 V |
| Mean power | 45.6 mW | 16.16 mW | 7.8 mW |
| Peak wavelength | 02.24 nm | 402.87 nm | 402.87 nm |
| Δλ |  |  | 0.34 nm |
| Pulse width |  | 1.68 ps | 1.31 ps |
| Peak power |  | 9.6 W | 5.95 W |

In this way, when the mode-locked laser diode device 10 is changed from a continuous oscillation state to a pulsed oscillation state, a peak wavelength of the laser beam is shifted by 0.63 nm to a long wavelength side. When the mode-locked laser diode device 10 is pulse-oscillated, pulse width of a laser beam (see FIG. 2B) is 1.68 picoseconds. On the other hand, pulse width of a laser beam (see FIG. 2C) after extracting, by the wavelength selective element 82, a main peak on a long wavelength side from a pulsed laser beam emitted from the mode-locked laser diode device 10 is 1.31 picoseconds, showing that duration of the generated laser beam is decreased as a result of spectrum extraction by the wavelength selective element 82. That is, laser light output, which is coherent and has short pulse duration, is provided. Transmission spectral width of the wavelength selective element 82 used herein is Δλ=0.40 nm. Actual spectral width of light after passing through the wavelength selective element 82 was Δλ=0.34 nm.

Mean power of a laser beam was 7.8 mW after extracting, by the wavelength selective element 82, a main peak on the long wavelength side from a pulsed laser beam emitted from the mode-locked laser diode device 10. Mean power of a pulsed laser beam emitted from the mode-locked laser diode device 10 was 16.16 mW. The respective kinds of mean power are expressed to be 5.95 W and 9.6 W in peak power characterizing a property of a laser beam. In this way, in the laser diode assembly of the Example 1, use of the wavelength selective element 82 allows decrease in peak power to be smaller than decrease in mean power, which contributes to generation of a coherent laser beam.

When a light output spectrum of a pulsed laser beam emitted through the external resonator from the mode-locked laser diode device 10 contains a plurality of peaks, one of the peaks may be extracted by the wavelength selective element 82, and output to the outside. For example, when the light output spectrum of the pulsed laser beam mainly contains a plurality of peaks, 402.4 nm and 402.87 nm, a peak of 402.87 nm as one of the plurality of peaks may be extracted by the wavelength selective element 82, and output to the outside.

As illustrated in the conceptual diagram of FIG. 1B, the image formation device 74, which performs image formation, on the diffraction grating 81, of an image from the beam-output end face of the mode-locked laser diode device 10, may be disposed between the mode-locked laser diode device 10 and the diffraction grating 81. The image formation device 74 is configured of a lens having a positive power, and specifically configured of, for example, an aspherical convex lens having a focal distance of 4.5 mm. When lateral length of a laser beam on the beam-output end face of the mode-locked laser diode device 10 is denoted as $L_1$, and lateral length of an image, which is output from the beam-output end face of the mode-locked laser diode device 10 and formed on the diffraction grating 81, is denoted as $L_2$, $L_1$=1.6 µm and $L_2$=53 µm are given, satisfying $20 \leq L_2/L_1 \leq 50$. In this way, a laser beam, output from the beam-output end face of the mode-locked laser diode device 10 and input to the diffraction grating 81, is prevented from being formed into a parallel beam, making it possible to suppress unstable mode-locked operation.

As described above, the second electrodes 62 having a separation resistance value of $1*10^2 \Omega$ or more is desirably formed on the second compound semiconductor layer 50. In the case of a GaN-based laser diode device, since the mobility of the compound semiconductor having the p-type conductive type is small unlike a GaAs-based laser diode device in the past, the second electrode 62 formed on the second compound semiconductor layer 50 is separated by the isolation trench 62C without increasing, by ion implantation, resistance of the second compound semiconductor layer 50 having the p-type conductive type, thereby an electric resistance value between the first portion 62A and the second portion 62B of the second electrode 62 may be made 10 times or more as high as an electric resistance value between the second electrode 62 and the first electrode 61, or may be made $1*10^2 \Omega$ or more.

The second electrode 62 is demanded to have the following properties:

(1) the electrode has a function of an etching mask in etching the second compound semiconductor layer 50;

(2) the electrode may be wet-etched without causing deterioration of electrical or optical characteristics of the second compound semiconductor layer 50;

(3) when the electrode is deposited on the second compound semiconductor layer 50, the electrode exhibits a contact specific resistance value of $10^{-2}$ $\Omega$*cm$^2$ or less;

(4) when the electrode is formed of a stacked structure, a material configuring a lower metal layer has a large work function and a relatively low contact specific resistance value to the second compound semiconductor layer 50, and may be wet-etched; and (5) when the electrode is formed of a stacked structure, a material configuring an upper metal layer has etching resistance in the case of forming the ridge structure (for example, resistance to $Cl_2$ gas used in RIE), and may be wet-etched.

In the mode-locked laser diode device 10 of the Example 1 and others, the second electrode 62 is configured of a Pd single-layer having a thickness of 0.1 µm.

Thickness of the p-type GaN/AlGaN superlattice cladding layer 54 having a superlattice structure, in which p-type GaN layers and p-type AlGaN layers are alternately stacked, is 0.7 µm or less, specifically 0.4 µm, thickness of the p-type GaN layer configuring the superlattice structure is 2.5 nm, thickness of the p-type AlGaN layer configuring the superlattice structure is 2.5 nm, and the total layer number of the p-type GaN layers and the p-type AlGaN layers is 160. In addition, a distance from the third compound semiconductor layer 40 to the second electrode 62 is 1 µm or less, specifically 0.5 µm. The p-type AlGaN electron barrier layer 53, the p-type GaN/AlGaN superlattice cladding layer 54, and the p-type GaN contact layer 55, which collectively configure the second compound semiconductor layer 50, are doped with Mg of $1*10^{19}$ cm$^{-3}$ or more (specifically $2*10^{19}$ cm$^{-3}$), so that the absorption coefficient of the second compound semiconductor layer 50 to light having a wavelength of 405 nm is 50 cm$^{-1}$ or more, specifically 65 cm$^{-1}$. While the second compound semiconductor layer 50 has, from a third compound semiconductor layer 40 side, a non-doped compound semiconductor layer (non-doped GaInN light guide layer 51 and non-doped AlGaN cladding layer 52), and a p-type compound semiconductor layer, a distance (d) from the third compound semiconductor layer 40 to the p-type compound semiconductor layer (specifically, p-type AlGaN electron barrier layer 53) is $1.2*10^{-7}$ m or less, specifically 100 nm.

Figure 30:
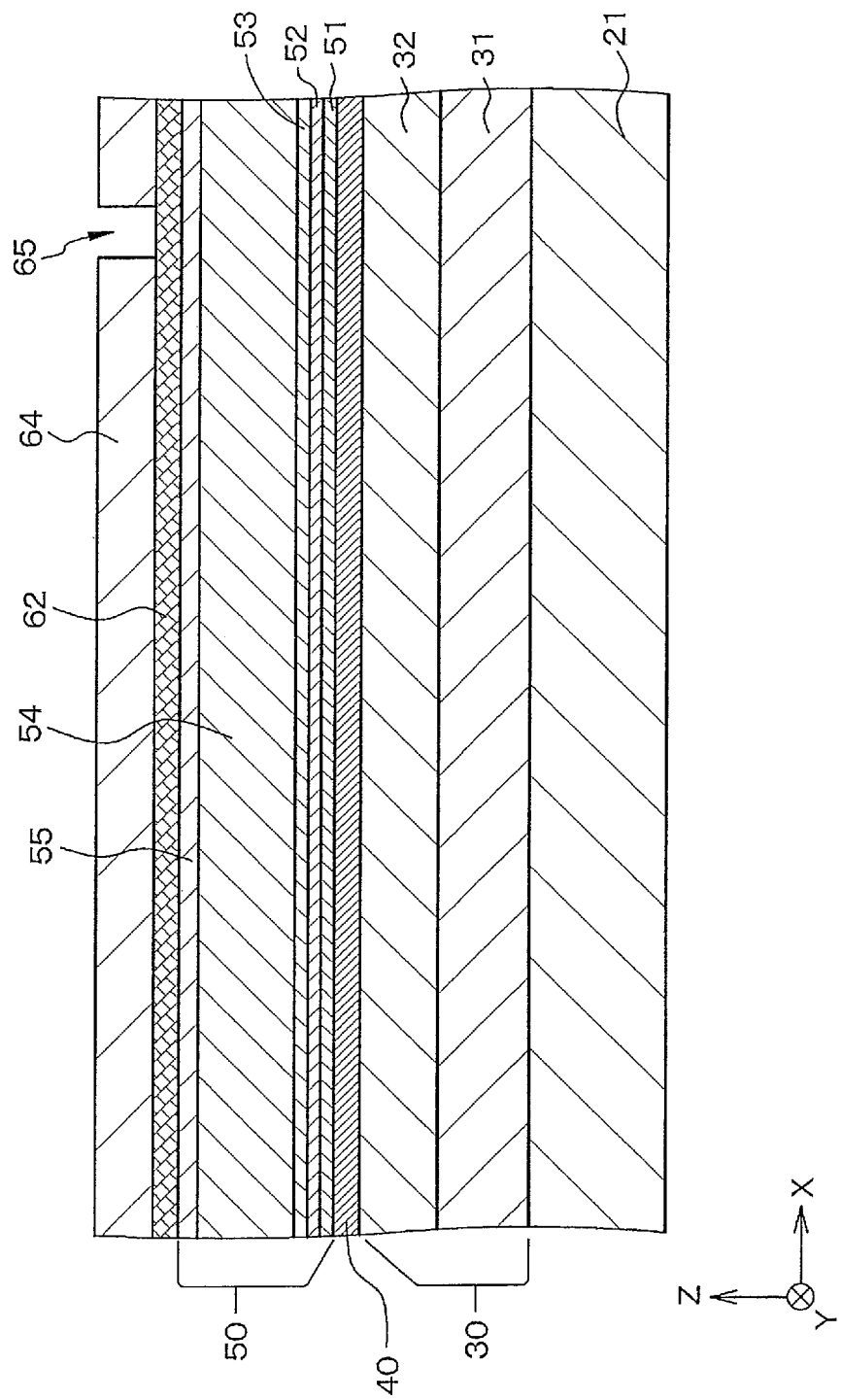
FIG. 30 is a schematic partial end view of the substrate and other layers for explaining the method of manufacturing the mode-locked laser diode device in the Example 1 following FIG. 29B.

A method of manufacturing the mode-locked laser diode device in the Example 1 and others is described below with reference to FIGS. 28A and 28B, FIGS. 29A and 29B, and FIG. 30. FIGS. 28A and 28B and FIGS. 29A and 29B are schematic partial section views of a substrate and other layers as cut along a YZ plane, and FIG. 30 is a schematic partial end view thereof as cut along an XZ plane.

[Step-100]

First, a stacked structure is formed in such a manner that the first compound semiconductor layer 30 including the GaN-based compound semiconductor having the first conductive type (n-type conductive type), the third compound semiconductor layer (active layer 40) configuring the light emitting region (gain region) 41 and the saturable absorption region 42 including the GaN-based compound semiconductor, and the second compound semiconductor layer 50 including the GaN-based compound semiconductor having the second conductive type (p-type conductive type) different from the first conductive type are sequentially stacked by a well-known MOCVD method on a substrate, specifically, on a (0001) face of the n-type GaN substrate 21 (see FIG. 28A).

[Step-110]

Then, the strip-shaped second electrode 62 is formed on the second compound semiconductor layer 50. Specifically, a Pd layer 63 is deposited on the entire surface by a vacuum deposition method (see FIG. 28B), and then a strip-shaped etching resist layer is formed on the Pd layer 63 by a photolithography technique. Then, the Pd layer 63 in a region uncovered with the etching resist layer is removed using aqua regia, and then the etching resist layer is removed. In this way, a structure illustrated in FIG. 29A may be provided. The strip-shaped second electrode 62 may be formed on the second compound semiconductor layer 50 by a liftoff method.

[Step-120]

Then, at least part of the second compound semiconductor layer 50 is etched (specifically, part of the second compound semiconductor layer 50 is etched) using the second electrode 62 as an etching mask, thereby the ridge structure is formed. Specifically, part of the second compound semiconductor layer 50 is etched using the second electrode 62 as the etching mask by an RIE method using $Cl_2$ gas. In this way, a structure illustrated in FIG. 29B is provided. In this way, the ridge structure is formed in a self-alignment manner using the strip-shaped-patterned second electrode 62 as the etching mask, which prevents misalignment between the second electrode 62 and the ridge structure.

[Step-130]

Then, a resist layer 64 is formed for forming the isolation trench in the second electrode 62 (see FIG. 30). A numerical reference 65 denotes an aperture provided in the resist layer 64 to form the isolation trench. Then, the isolation trench 62C is formed by wet etching in the second electrode 62 with the resist layer 64 as a wet etching mask, thereby the second electrode 62 is separated by the isolation trench 62C into the first portion 62A and the second portion 62B. Specifically, aqua regia is used as an etchant, and the whole structure is immersed in the aqua regia for approximately 10 sec, so that the isolation trench 62C is formed in the second electrode 62. Then, the resist layer 64 is removed. In this way, the structure illustrated in FIGS. 3 and 4 may be obtained. In this way, wet etching is used instead of dry etching, preventing deterioration of optical and electrical characteristics of the second compound semiconductor layer 50. This therefore prevents deterioration of emission characteristics of the mode-locked laser diode device. When dry etching is used, internal loss αi of the second compound semiconductor layer 50 may be increased, leading to a possibility of increase in threshold voltage or reduction in light output. When etching rate of the second electrode 62 is denoted as $ER_0$, and etching rate of the stacked structure is denoted as $ER_1$, the following is established.

$ER_0/ER_1 \approx 1*10^2$

Such high etching selectivity between the second electrode 62 and the second compound semiconductor layer 50 makes it possible to securely etch the second electrode 62 without etching the stacked structure (or with slight etching of the stacked structure). Desirably, $ER_0/ER_1 \geq 1*10$, preferably $ER_0/ER_1 \geq 1*10^2$ is satisfied.

The second electrode may be configured of a stacked structure of a lower metal layer including palladium (Pd) 20 nm in thickness and an upper metal layer including nickel (Ni) 200 nm in thickness. In wet etching using aqua regia, etching rate of nickel, is approximately 1.25 times as high as that of palladium.

[Step-140]

Then, formation of an n-side electrode, cleavage of the substrate, and packaging are performed, thereby the mode-locked laser diode device 10 is produced.

Generally, resistance R (Ω) of a semiconductor layer is expressed as follows using a specific resistance value ρ (Ω·m) of a material configuring the semiconductor layer, length of the semiconductor layer $X_0$ (m), cross section S (m²) of the semiconductor layer, carrier density n (cm⁻³), the quantity of electric charge e (C), and mobility μ (m²/Vsec).

$R = \rho \cdot X_0 / S$ $= X_0/(n \cdot E \cdot \mu \cdot S)$

Since mobility of the p-type GaN-based semiconductor is two or more orders of magnitude smaller than that of the p-type GaAs-based semiconductor, an electric resistance value of the GaN-based semiconductor tends to be increased. From the above expression, a laser diode device having a ridge structure small in cross section, 1.5 μm in width and 0.35 μm in height, has a large electric resistance value.

An electric resistance value between the first portion 62A and the second portion 62B of the second electrode 62 of the produced mode-locked laser diode device 10 was measured by a four-terminal method. As a result, when width of the isolation trench 62C was 20 μm, the electric resistance value between the first portion 62A and the second portion 62B of the second electrode 62 was 15 kΩ. In addition, in the produced mode-locked laser diode device 10, a direct current was applied to the first electrode 61 from the first portion 62A of the second electrode 62 via the light emitting region 41 to produce a forward bias state, and a reverse bias voltage $V_{sa}$ was applied between the first electrode 61 and the second portion 62B of the second electrode 62 to apply an electric field to the saturable absorption region 42, enabling self-pulsation operation. Specifically, the electric resistance value between the first portion 62A and the second portion 62B of the second electrode 62 was 10 times or more as high as the electric resistance value between the second electrode 62 and the first electrode 61, or $1*10^2 \Omega$ or more. Consequently, leakage current from the first portion 62A of the second electrode 62 to the second portion 62B was able to be securely suppressed. As a result, while the light emitting region 41 was in the forward bias state, the saturable absorption region 42 was able to be securely into the reverse bias state, leading to secure self-pulsation operation.

Example 2

Example 2 is a modification of the Example 1. In the Example 1, the external resonator has been configured of the diffraction grating 81. In the Example 2, an external resonator 90 is configured of a partial transmission mirror (reflectance of 20%). FIG. 5A illustrates a conceptual diagram of a laser diode assembly of the Example 2. In the Example 2, the external resonator 90 configured of the partial transmission mirror functions as an output coupler. A long wavelength component of a pulsed laser beam, emitted through the external resonator 90 from the mode-locked laser diode device 10, is extracted by a wavelength selective element 92 including a bandpass filter and output to the outside, as in the Example 1.

Except for this, a configuration or a structure of the laser diode assembly of the Example 2 is basically the same as that of the laser diode assembly of the Example 1, and therefore detailed description thereof is omitted.

A second wavelength selective element 93 may be provided between the mode-locked laser diode device 10 and the external resonator 90 as illustrated in FIG. 5B showing a conceptual diagram of a modification of the laser diode assembly of the Example 2. In this case, wavelength selective spectrum width of the second wavelength selective element 93 is wider than wavelength selective spectrum width of the wavelength selective element 92. Specifically, for example, the wavelength selective spectrum width of the wavelength selective element 92 is Δλ=0.80 nm, and the wavelength selective spectrum width of the second wavelength selective element 93 is Δλ=0.40 nm.

Figure 6A:
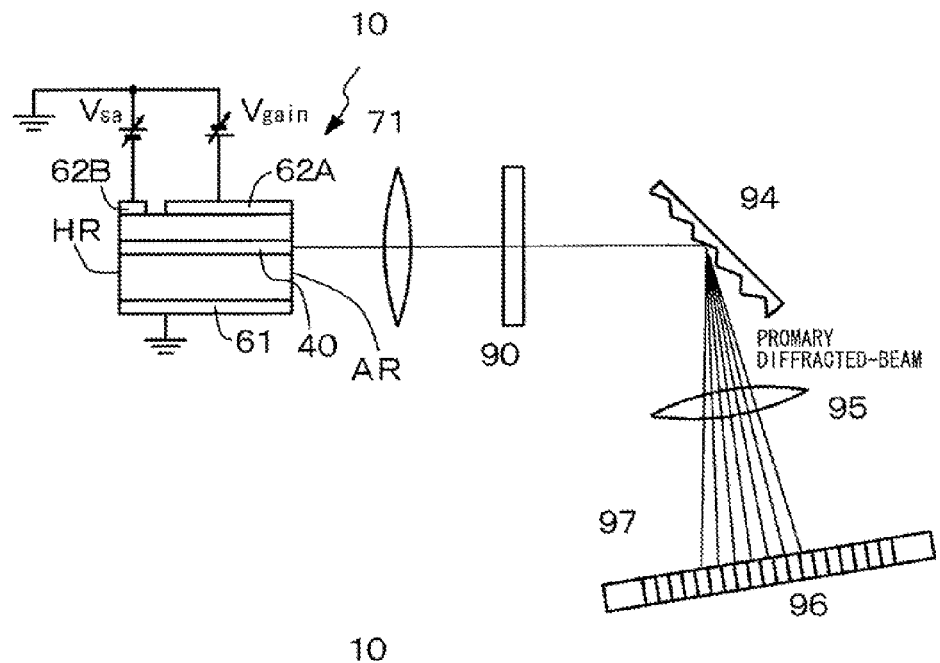
FIGS. 6A and 6B are conceptual diagrams of other modifications of the laser diode assembly of the Example 2.
Figure 6B:
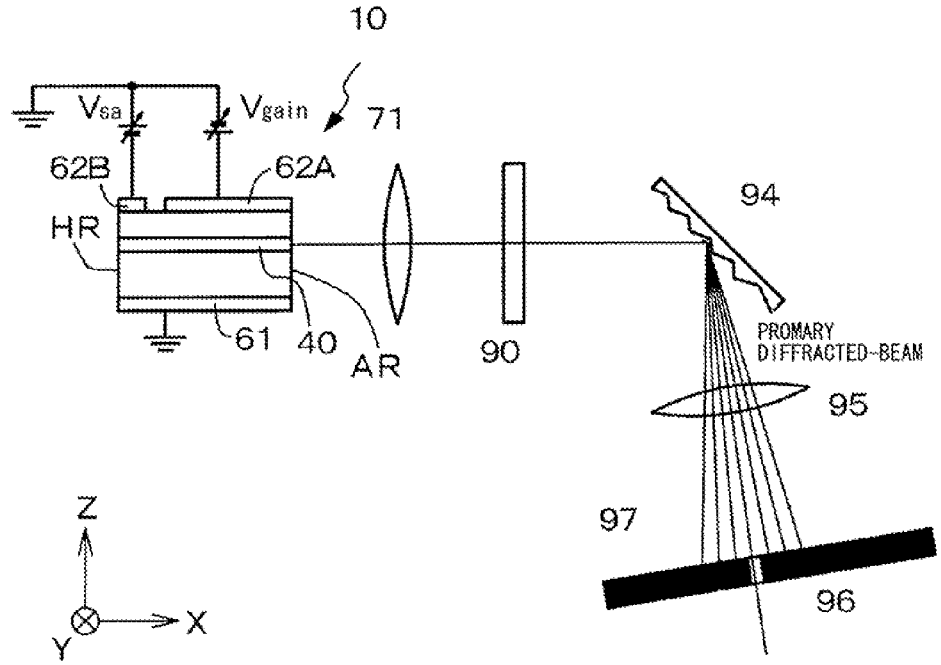

Alternatively, the wavelength selective element may be configured of, instead of the bandpass filter, a diffraction grating 94 and an aperture 96 selecting a primary or higher diffracted-beam output from the diffraction grating 94 (primary diffracted-beam in the Example 2) as illustrated in FIGS. 6A and 6B. The aperture 96 is configured of, for example, a liquid crystal display 97 having a large number of segments. A lens 95 is disposed between the diffraction grating 94 and the aperture 96.

A laser beam emitted from the mode-locked laser diode device 10 has a certain wavelength range. This allows a primary diffracted beam diffracted by the diffraction grating 94 to collide with the aperture 96 at many sites as illustrated in FIG. 6A. Specifically, since a plurality of angles α exist in the expression (A) described before, a plurality of angles β also exist. FIGS. 6A and 6B neglect convergence or divergence of a light path due to the lens 95. In addition, a zero-order diffracted beam output from the diffraction grating 94 is also omitted to be shown. As illustrated in FIG. 6B, a laser beam is transmitted by a desired segment 96 of the transmissive liquid crystal display 97 having the large number of segments, thereby only a laser beam having a desired wavelength emitted from the mode-locked laser diode device 10 is finally output to the outside. In this way, a segment of the aperture 96 is selected, enabling wavelength selection.

The diffraction grating described in the Example 1 may be used as an external resonator to be combined with the second wavelength selective element 93, or as an external resonator to be combined with the diffraction grating 94 and the aperture 96.

Example 3

Example 3 is a modification of the mode-locked laser diode device described in the Example 1, and relates to a third-configuration of mode-locked laser diode device. In the Example 1, the mode-locked laser diode device 10 has been provided on a (0001) plane as a crystal plane having polarity, or C plane, of the n-type GaN substrate 21. When such a substrate is used, saturable absorption may be difficult to be electrically controlled due to the QCSE effect (quantum confined Stark effect) caused by an internal electric field caused by piezoelectric polarization and spontaneous polarization in the active layer 40. Specifically, it has been found that a value of the direct current applied to the first electrode and a value of the reverse bias voltage applied to the saturable absorption region may be necessary to be increased to achieve self-pulsation operation and mode-locked operation, a subpulse component may be generated with a main pulse, or an external signal may be difficult to be synchronized with a light pulse.

In addition, it has been found that thickness of the well layer configuring the active layer 40 and impurity doping concentration of the barrier layer configuring an active layer 40 are preferably optimized to prevent the generation of such a phenomenon.

Specifically, it is desirable that thickness of the well layer configuring the GaInN quantum well active layer be 1 nm or more and 10.0 nm or less, preferably 1 nm or more and 8 nm or less. Thickness of the well layer is reduced in this way, thereby influence of piezoelectric polarization and of spontaneous polarization may be reduced. In addition, impurity doping concentration of the barrier layer is desirably $2*10^{18}$ cm$^{-3}$ or more and $1*10^{20}$ cm$^{-3}$ or less, and preferably $1*10^{19}$ cm$^{-3}$ or more and $1*10^{20}$ cm$^{-3}$ or less. The impurity may include silicon (Si) or oxygen (O). The impurity doping concentration of the barrier layer is adjusted in such a way, thereby the number of carriers in the active layer may be increased, resulting in reduction in influence of piezoelectric polarization and of spontaneous polarization.

In the Example 3, the active layer 40, which is configured of a GaInN quantum well active layer including a three-layer barrier layer ($Ga_{0.98}In_{0.02}N$) and a two-layer well layer ($Ga_{0.92}In_{0.08}N$) in a layer configuration shown in Table 3, is configured as follows. In a mode-locked laser diode device according to a reference example 3, an active layer 40 in a layer configuration shown in Table 3 is configured as follows. Specifically, the active layer 40 is configured in the same way as in the Example 1.

TABLE 3

|  | Example 3 | Reference example 3 |
|---|---|---|
| Well layer | 8 nm | 10.5 nm |
| Barrier layer | 12 nm | 14 nm |
| Impurity doping concentration of well layer | Non-doped | Non-doped |
| Impurity doping concentration of barrier layer Si: | $2*10^{18}$ cm$^{-3}$ | Non doped |

In the Example 3, thickness of the well layer is 8 nm, and the barrier layer is doped with Si of $2*10^{18}$ cm$^{-3}$, so that the QCSE effect is reduced in the active layer. In the reference example 3, thickness of the well layer is 10.5 nm, and no impurity is doped to the barrier layer.

Mode-locked is determined by a direct current applied to the light emitting region and a reverse bias voltage $V_{sa}$ applied to the saturable absorption region as in the Example 1. Reverse-bias-voltage dependence of a relationship between an injection electric current and light output (L-I characteristic) was measured for each of the Example 3 and the reference example 3. As a result, in the reference example 3, as the reverse bias voltage $V_{sa}$ was increased, a threshold current at which laser oscillation started gradually increased, and change occurred at a low reverse bias voltage $V_{sa}$ compared with the Example 3. This suggests that an effect of saturable absorption is further electrically controlled in the active layer of the Example 3 by the reverse bias voltage $V_{sa}$. However, even in the reference example 3, single-mode (single fundamental transverse mode) self-pulsation operation and single-mode mode-locked operation are confirmed in a state that the reverse bias voltage is applied to the saturable absorption region, and therefore it is needless to say that the reference example 3 is also included in the disclosure. In addition, the mode-locked laser diode device described in the Example 3 is applicable to each of mode-locked laser diode devices in the Example 2 and Examples 4 to 7.

Example 4

Figure 7:
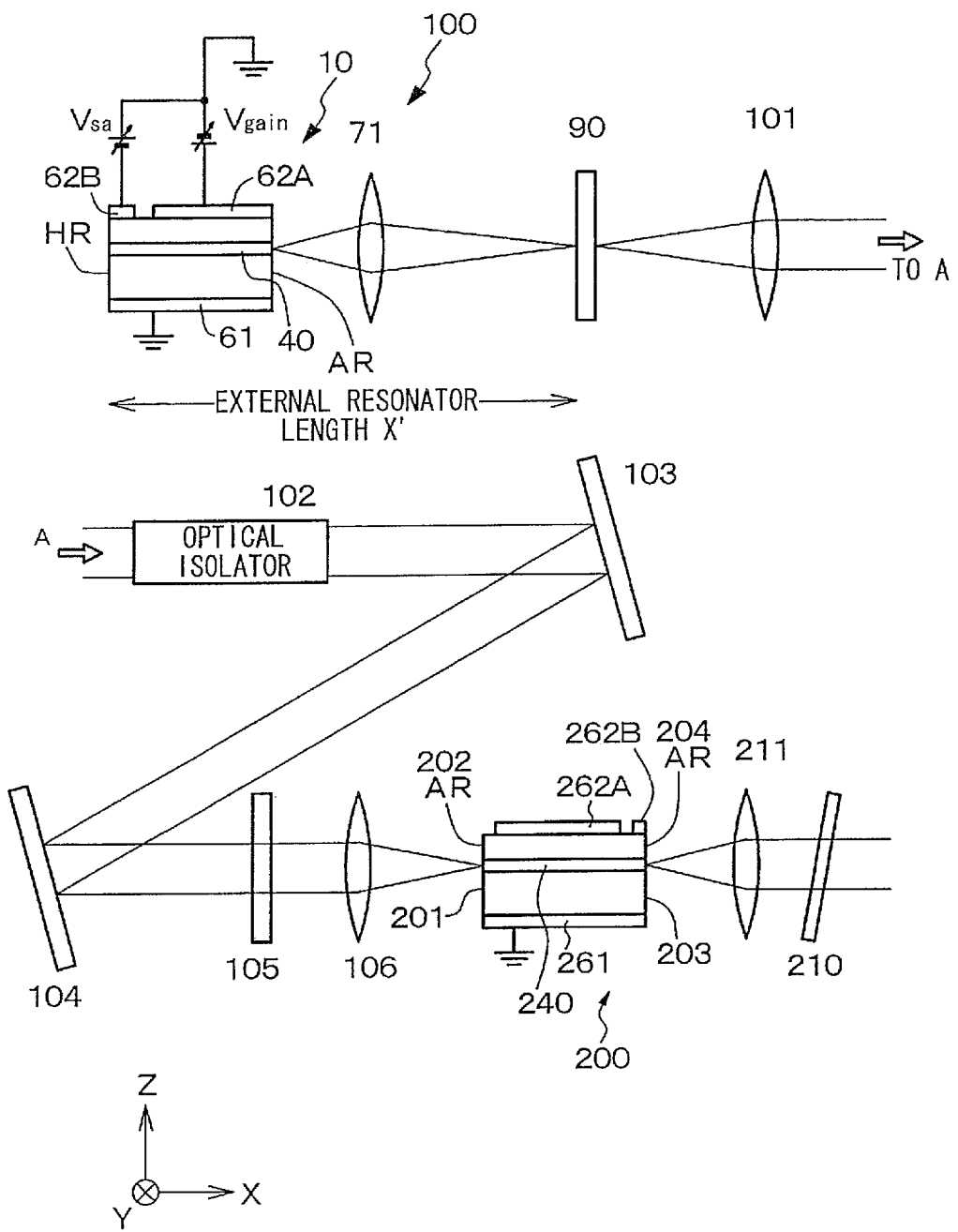
FIG. 7 is a conceptual diagram of a semiconductor optical amplifier assembly of Example 4 including a semiconductor optical amplifier.
Figure 8:
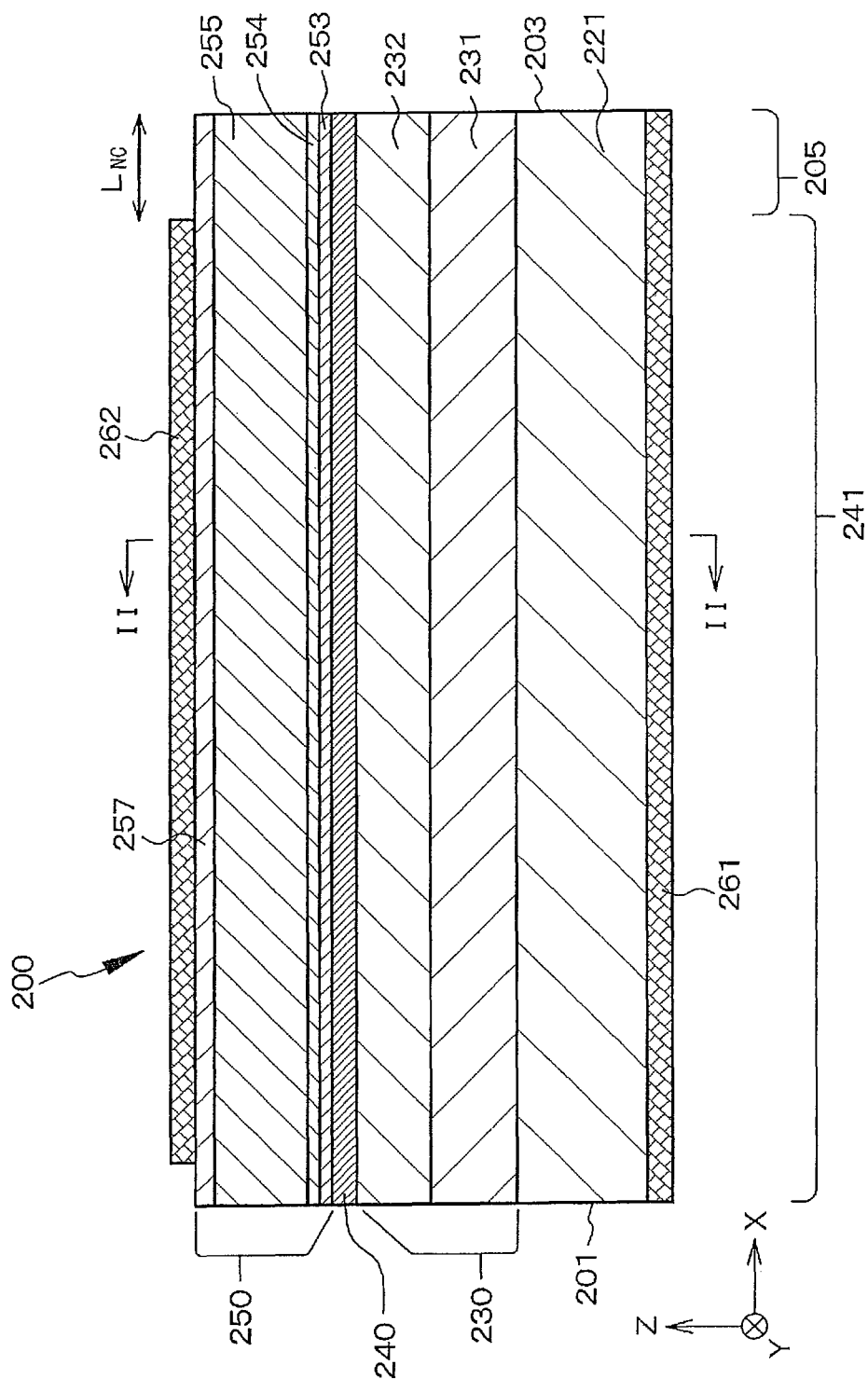
FIG. 8 is a schematic section view of the semiconductor optical amplifier of the Example 4 as cut along a virtual vertical plane (XZ plane) including an axis (X direction) of the semiconductor optical amplifier.
Figure 9:
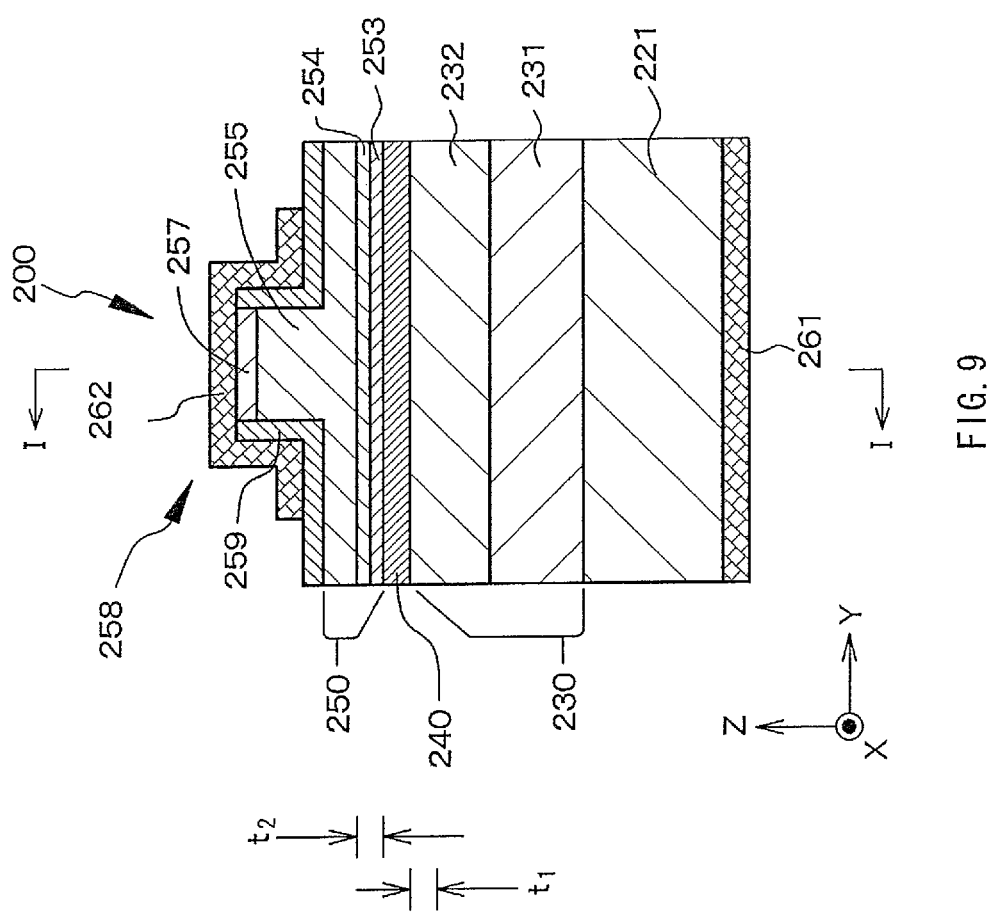
FIG. 9 is a schematic section view of the semiconductor optical amplifier of the Example 4 as cut along a virtual vertical plane (YZ plane) orthogonal to the axis of the semiconductor optical amplifier.
Figure 10:
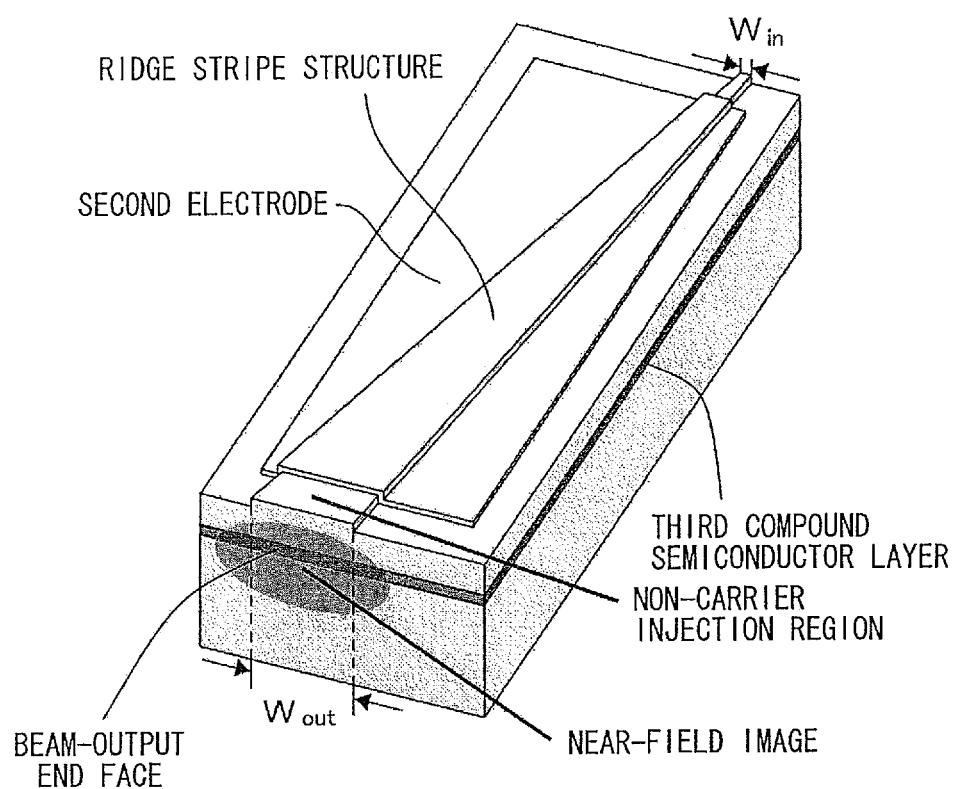
FIG. 10 is a schematic perspective view of the semiconductor optical amplifier of the Example 4.
Figure 11:
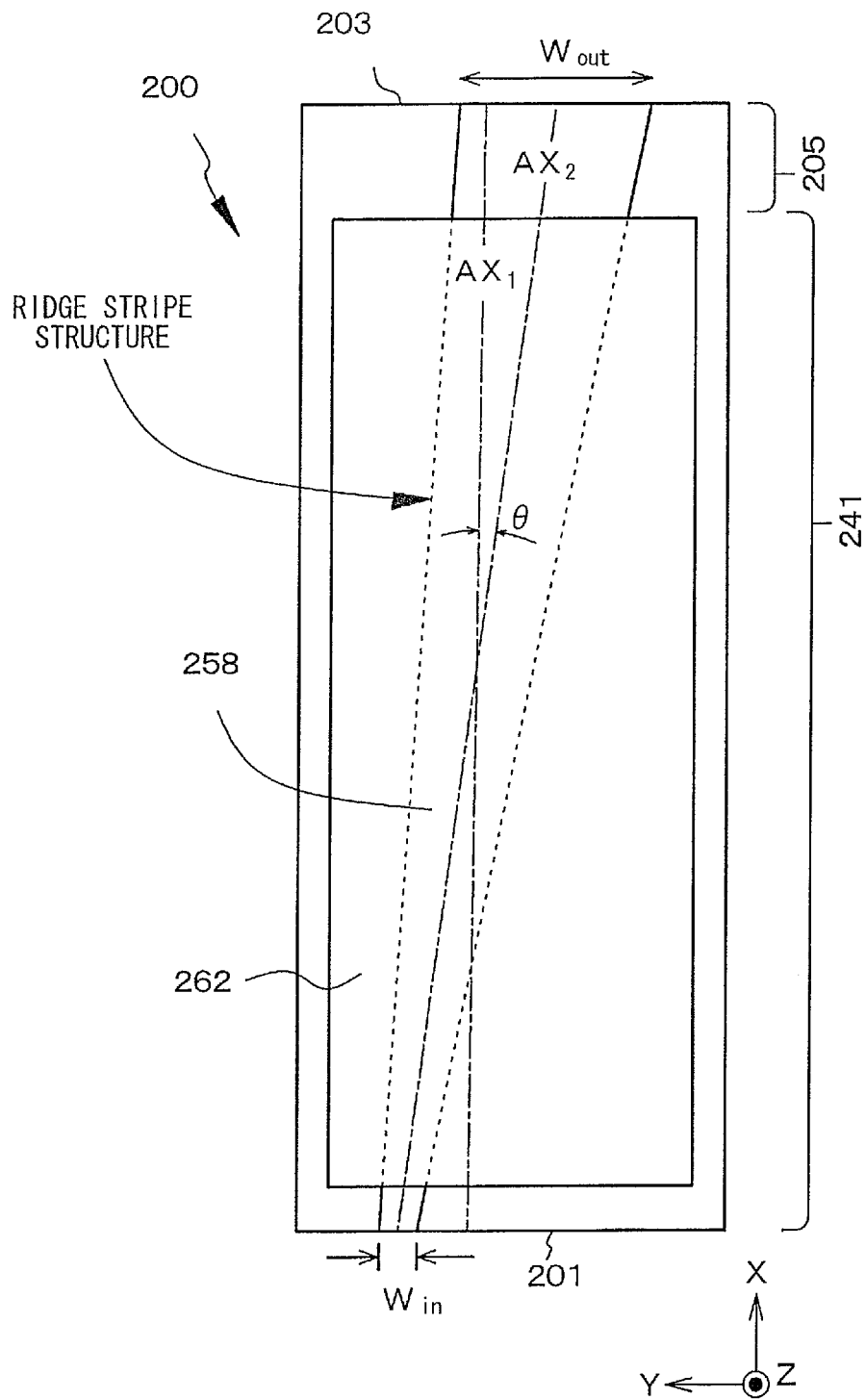
FIG. 11 is a schematic plan diagram of a ridge stripe structure of the semiconductor optical amplifier of the Example 4.

Example 4 relates to a semiconductor optical amplifier assembly according to an embodiment, and specifically relates to a semiconductor optical amplifier assembly according to the first embodiment. FIG. 7 illustrates a conceptual diagram of a semiconductor optical amplifier assembly of the Example 4 including a semiconductor optical amplifier, FIG. 8 illustrates a schematic section view of the semiconductor optical amplifier as cut along a virtual vertical plane (XZ plane) including an axis of the semiconductor optical amplifier (extending direction of a light guide, X direction), and FIG. 9 illustrates a schematic section view of the semiconductor optical amplifier as cut along a virtual vertical plane (YZ plane) orthogonal to the axis of the semiconductor optical amplifier. FIG. 8 is a schematic section view along an arrow I-I in FIG. 9, and FIG. 9 is a schematic section view along an arrow II-II in FIG. 8. FIG. 10 illustrates a schematic perspective view of the semiconductor optical amplifier, and FIG. 11 illustrates a schematic plan diagram of a ridge stripe structure.

The semiconductor optical amplifier assembly of the Example 4 includes a semiconductor optical amplifier 200, where a light output spectrum shows long-wavelength shift by self-phase modulation, and a wavelength selective element 210. In addition, a long wavelength component of a pulsed laser beam output from the semiconductor optical amplifier 200 is extracted by the wavelength selective element 210, and output to the outside.

The semiconductor optical amplifier 200 is configured of a transmissive semiconductor optical amplifier as illustrated in FIG. 7. Low reflective coating layers (AR) 202 and 204 are formed on a beam-input end face 201 of the semiconductor optical amplifier 200 and a beam-output end face 203 opposed to the beam-input end face 201, respectively. Each of the reflective coating layers 202 and 204 has a stacked structure of one titanium oxide layer and one aluminum oxide layer. A laser beam input from a beam-input end face 201 side is amplified within the semiconductor optical amplifier 200, and output from the beam-output end face 203 on an opposite side. The laser beam is guided basically unidirectionally. In the Example 4, a laser light source 100 includes a combination of the mode-locked laser diode device 10 and the external resonator 80 or 90 described in the Examples 1 to 3, and a laser beam emitted by the mode-locked laser diode device 10 (specifically, a laser beam output from the external resonator 80 or 90) enters the semiconductor optical amplifier 200.

In the semiconductor optical amplifier assembly of the Example 4 illustrated in FIG. 7, the laser light source 100 is configured of the mode-locked laser diode device 10, a lens 71, an external resonator 90 (or external resonator 80), and a lens 101. A laser beam emitted from the laser light source 100 enters a reflective mirror 104 through an optical isolator 102 and a reflective mirror 103. The laser beam reflected by the reflective mirror 104 enters a semiconductor optical amplifier 200 through a half-wave plate (λ/2 wavelength plate) 105 and a lens 106. The optical isolator 102 and the half-wave plate 105 are disposed to prevent a return beam from the semiconductor optical amplifier 200 from being directed to the laser light source 100. A pulsed laser beam optically amplified in the semiconductor optical amplifier 200 is output to the outside through a lens 211 and the wavelength selective element 210. The wavelength selective element 210 is configured of a bandpass filter as in the Example 1. However, this is not limiting, and the wavelength selective element may be configured of a diffraction grating 94 and an aperture 96 selecting a primary or higher diffracted-beam (specifically primary diffracted-beam) output from the diffraction grating 94 as described in the modification of the Example 2.

The semiconductor optical amplifier 200 includes: a stacked structure formed in such a manner that a first compound semiconductor layer 230 including a GaN-based compound semiconductor having the first conductive type (specifically, n-type conductive type in the Example 4), a third compound semiconductor layer (active layer) 240 having a light amplification region (carrier injection region and gain region) including a GaN-based compound semiconductor 241, and a second compound semiconductor layer 250 including a GaN-based compound semiconductor having the second conductive type different from the first conductive type (specifically, p-type conductive type in the Example 4) are sequentially stacked; a second electrode 262 formed on the second compound semiconductor layer 250; and a first electrode 261 electrically connected to the first compound semiconductor layer 230.

Specifically, the semiconductor optical amplifier 200 in the Example 4 has substantially the same configuration or structure as the mode-locked laser diode device 10 in the Example 1 except a configuration or structure of the second electrode.

In the semiconductor optical amplifier 200 in the Example 4, the stacked structure has a ridge stripe structure, and when width of the ridge stripe structure on a beam-output end face 203 is denoted as $W_{out}$, and width of the ridge stripe structure on the beam-input end face 201 is denoted as $W_{in}$, $W_{out} > W_{in}$ is satisfied. Specifically, the following is given.

$W_{out}$=15 μm $W_{in}$=1.4 μm

A non-carrier injection region 205 is provided along an axis $AX_1$ of the semiconductor optical amplifier 200 over a certain region of the stacked structure from the beam-output end face 203. When length of the non-carrier injection region 205 along an axis $AX_1$ of the semiconductor optical amplifier 200 (width of the non-carrier injection region 205) is denoted as $L_{NC}$, the following is given.

$L_{NC}$=5 μm

The second electrode 262 is not provided in the non-carrier injection region 205. The overall length of the semiconductor optical amplifier is 2.0 mm. A non-carrier injection region is also provided along the axis of the semiconductor optical amplifier 200 over a certain region of the stacked structure from the beam-input end face 201.

More specifically, the mode-locked laser diode device 200 in the Example 4 has a ridge-stripe-type separate confinement heterostructure (SCH). In addition, the element 200 has the same structure as an index-guide-type GaN-based laser diode structure including AlGaInN. Width of the ridge stripe structure is monotonically gradually expanded in a tapered shape from the beam-input end face 201 to the beam-output end face 203. The axis $AX_1$ of the semiconductor optical amplifier 200 crosses an axis $AX_2$ of the ridge stripe structure at a predetermined angle, specifically, at angle of θ=5.0 degrees. The axes $AX_1$ and $AX_2$ are shown by dashed lines in FIG. 11.

The stacked structure is formed on a compound semiconductor substrate 221. Specifically, the semiconductor optical amplifier 200 is provided on a (0001) plane of the n-type GaN substrate 221. The (0001) plane of the n-type GaN substrate 221, which may be called "C plane", is a crystal plane having polarity. Each of the first compound semiconductor layer 230, the third compound semiconductor layer 240, and the second compound semiconductor layer 250 specifically includes an AlGaInN-based compound semiconductor, and more specifically, has a layer configuration shown in the following Table 4. In Table 4, a compound semiconductor layer listed on a lower side corresponds to a layer nearer to the n-type GaN substrate 221. In the third compound semiconductor layer 240, a bandgap of a compound semiconductor configuring a well layer is 3.06 eV. The third compound semiconductor layer 240 has a quantum well structure having a well layer and a barrier layer, where doping concentration of an impurity (specifically silicon, Si) of the barrier layer is $2*10^{17}$ cm$^{-3}$ or more and $1*10^{20}$ cm$^{-3}$ or less.

TABLE 4

Second compound semiconductor layer 250

(Mg-doped) p-type GaN contact layer 257
(Mg-doped) p-type AlGaN cladding layer 255
(Mg-doped) p-type GaN layer 254
(Mg-doped) p-type AlGaN electron barrier layer 253

TABLE 4-continued

Third compound semiconductor layer 240

GaInN quantum well active layer
(well layer: $Ga_{0.92}In_{0.08}N$/barrier layer: $Ga_{0.98}In_{0.02}N$)
First compound semiconductor layer 230

N-type GaN layer 232
N-type AlGaN cladding layer 231
where
Well layer (double layer): 10 nm (non-doped)
Barrier layer (triple layer): 12 nm (doping concentration (Si):
$2*10^{18}$ $cm^{-3}$) $cm^{-3}$)

Part of the p-type GaN contact layer 257 and part of the p-type AlGaN cladding layer 255 are removed by an RIE method, so that a ridge stripe structure (ridge portion 258) is formed. A stacked insulating film 259 including $SiO_2$/Si is formed on both sides of the ridge portion 258. A $SiO_2$ layer is a lower layer, and a Si layer is an upper layer. A difference in effective refractive index between the ridge portion 258 and the stacked insulating film 259 is $5*10^{-3}$ to $1*10^{-2}$ both inclusive, specifically $7*10^{-3}$.

A second electrode (p-side ohmic electrode) 262 is formed over an area from the p-type GaN contact layer 257 corresponding to a top surface of the ridge portion 258 to part of a top surface of the p-type AlGaN cladding layer 255. A first electrode (n-side ohmic electrode) 261 including Ti/Pt/Au is formed on a back of the n-type GaN substrate 221. In the Example 4, the second electrode 262 is configured of a single Pd layer having a thickness of 0.1 μm.

Thickness of the p-type AlGaN cladding layer 255 is 400 nm, thickness of the p-type GaN layer 254 is 100 nm, thickness of the p-type AlGaN electron barrier layer 253 is 20 nm, and thickness of the p-type GaN contact layer 257 is 100 nm. Furthermore, Mg of $1*10^{19}$ $cm^{-3}$ or more (specifically $2*10^{19}$ $cm^{-3}$) is doped to the p-type AlGaN electron barrier layer 253, the p-type GaN layer 254, the p-type AlGaN cladding layer 255, and the p-type GaN contact layer 257 configuring the second compound semiconductor layer 250. Thickness of the n-type AlGaN cladding layer 231 is 2.5 μm, and thickness of the n-type GaN layer 232 is 200 nm. When thickness of the n-type compound semiconductor layer (thickness of the n-type GaN layer 232) sandwiched between the n-type AlGaN cladding layer 231 and the third compound semiconductor layer 240 is denoted as $t_1$, and thickness of the p-type compound semiconductor layer (total thickness of the p-type GaN layer 254 and the p-type AlGaN electron barrier layer 253) sandwiched between the p-type AlGaN cladding layer 255 and the third compound semiconductor layer 240 is denoted as $t_2$, $t_1$=200 nm, and $t_2$=120 nm are established, satisfying $0.1 \le t_2/t_1 < 1$.

Figure 12A:
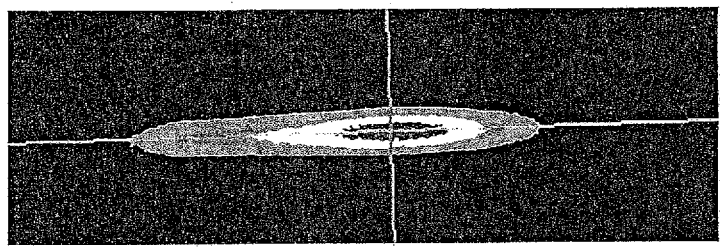
FIGS. 12A and 12B are photographs illustrating near-field images of laser beams output from the semiconductor optical amplifier of the Example 4 and from a semiconductor optical amplifier of comparative example 4A, respectively.

In the Example 4, a single-mode continuous oscillation laser beam having a wavelength of 405 nm (light output: 15 mW) was experimentally input to the semiconductor optical amplifier 200. Then, a direct current of 600 mA was applied from the second electrode 262 to the first electrode 261. The value of the direct current corresponds to $3.7*10^3$ $A/cm^2$ in 1 $cm^2$ of the third compound semiconductor layer 240 configuring the beam-input end face 201. Here, a near-field image of the laser beam output from the semiconductor optical amplifier 200 is shown in FIG. 12A.

Figure 12B:
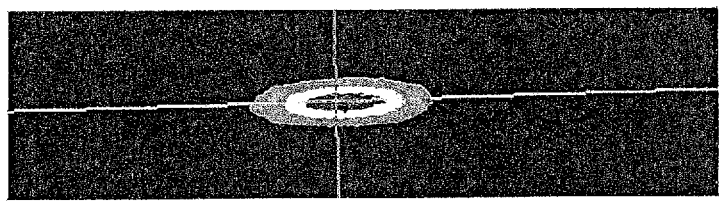

A semiconductor optical amplifier, having the same configuration or structure as in the Example 4 except that the non-carrier injection region 205 was not provided, was produced as a comparative example 4A. FIG. 12B shows a near-field image of a laser beam output from the semiconductor optical amplifier of the comparative example 4A when the direct current of 600 mA was applied from the second electrode to the first electrode. As seen in FIG. 12B, in the semiconductor optical amplifier of the comparative example 4A, width of the near-field image was narrower than $W_{out}$ (15 μm), and $1/e^2$ width was 5 μm (half value width of 3.1 μm). Such a phenomenon is peculiar to a nitride-semiconductor-based semiconductor optical amplifier. Such a narrow near-field image adversely affects saturation or reliability of amplified light output. Light intensity density of a laser beam output from the semiconductor optical amplifier of the comparative example 4A was 47 mW. As seen in FIG. 12A, in the semiconductor optical amplifier 200 of the Example 4, a mode field is expanded, width of a near-field image is large, and $1/e^2$ width was 11.5 μm (half value width of 5.8 μm). Light intensity density of a laser beam output from the semiconductor optical amplifier 200 in the Example 4 was 122 mW, showing that amplified light output was also higher than that of the semiconductor optical amplifier of the comparative example 4A. This revealed that amplified light output was conspicuously increased by providing the non-carrier injection region 205. A value of a ratio of width of the ridge stripe structure on the beam-output end face to width of a laser beam output from the semiconductor optical amplifier was 1.3. The width of a laser beam output from the semiconductor optical amplifier means $1/e^2$ width of a near-field image, namely, width of the near-field image corresponding to $1/e^2$ of peak intensity.

The reason why width of the near-field image of the output laser beam is expanded by providing the non-carrier injection region 205 is supposed as follows. Specifically, when light intensity of an incident laser beam is low, carrier distribution in the stacked structure on the YZ plane has a chevron pattern having one peak. However, when light intensity of the input laser beam becomes high, carriers are hardly injected or diffused following the beam in the stacked structure of the semiconductor optical amplifier, leading to a chevron pattern having two peaks (light intensity pattern of mountain/valley/ mountain). As well known, when the number of carriers decreases in a compound semiconductor layer, a relative refractive index of the compound semiconductor layer becomes higher. Accordingly, a laser beam emitted from the beam-output end face of the semiconductor optical amplifier becomes hard to spread in a width direction, so that width of a near-field image becomes narrow compared with $W_{out}$. In addition, area of a region of a laser beam output from the semiconductor optical amplifier is small in the beam-output end face, making it difficult to achieve high output of the semiconductor optical amplifier.

In the semiconductor optical amplifier in the Example 4, the non-carrier injection region 205, which hardly contributes to light amplification, is provided. This may suppress a phenomenon of increase in relative refractive index due to carrier distribution even if light intensity of an incident laser beam becomes higher. Consequently, a laser beam output from the beam-output end face of the semiconductor optical amplifier easily spreads in the width direction. In addition, area of a region occupied by a laser beam output from the semiconductor optical amplifier is large in the beam-output end face, making it possible to achieve high output of the semiconductor optical amplifier.

Since a laser beam emitted from the mode-locked laser diode device 10 described in the Examples 1 to 3 has a certain wavelength range, a laser beam output from the semiconductor optical amplifier 200 also has a certain wavelength range. Specifically, when the semiconductor optical amplifier 200 performs light amplification, self-phase modulation occurs, so that a light output spectrum shows long-wavelength shift. Such an output laser beam is inconstant in wavelength within duration of the beam, and uneven in phase. In addition, the laser beam contains a large amount of undesired wavelength components. Specifically, the laser beam output from the semiconductor optical amplifier 200 is in a noisy state. In the Example 4, a long wavelength component of such a pulsed laser beam output from the semiconductor optical amplifier 200 is extracted by the wavelength selective element 210, and output to the outside. Accordingly, a laser beam output to the outside may be eliminated in fluctuation of light intensity within duration of the output laser beam, and has a desired wavelength. In addition, pulse duration may be shortened, and coherence of the laser beam may be improved. Furthermore, the laser beam may be compressed while high throughput is maintained, leading to high peak power.

Figure 13A:
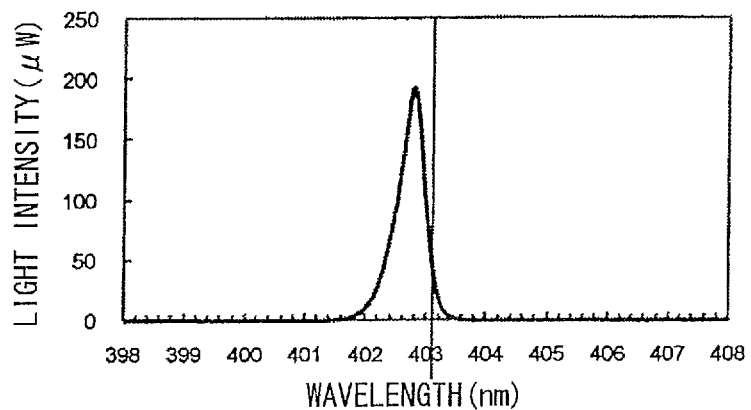
FIGS. 13A to 13C are charts showing light output spectra of a semiconductor optical amplifier assembly of the Example 4.
Figure 13B:
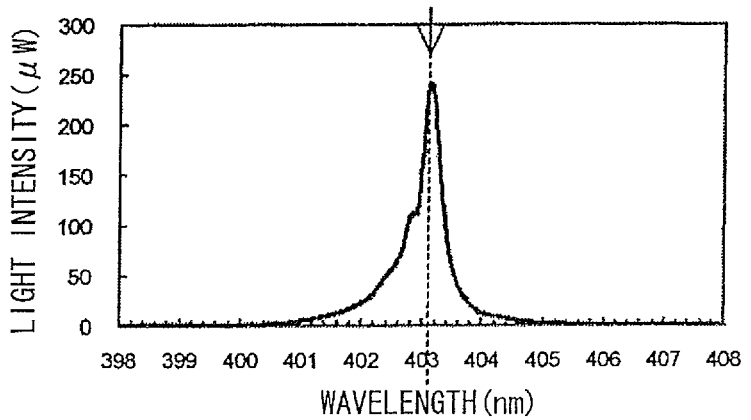
Figure 13C:
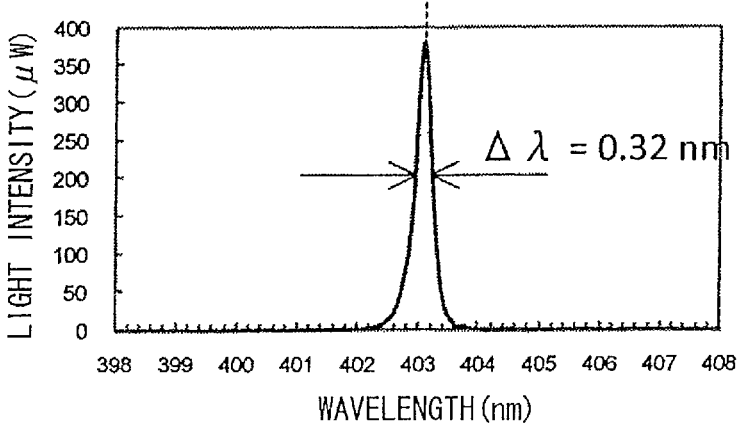

FIGS. 13A to 13C illustrate light output spectra of the semiconductor optical amplifier assembly of the Example 4. FIG. 13A is a chart illustrating a light output spectrum of a laser beam obtained when the mode-locked laser diode device 10 in the Example 4 is continuously oscillated in the case that the laser beam is input to the semiconductor optical amplifier 200 and then output from the amplifier 200, FIG. 13B is a chart illustrating a light output spectrum of a laser beam obtained when the mode-locked laser diode device 10 is pulse-oscillated in the case that the laser beam is input to the semiconductor optical amplifier 200 and then output from the amplifier 200, and FIG. 13C is a chart illustrating a light output spectrum of a laser beam obtained when the mode-locked laser diode device 10 is pulse-oscillated in the case that the laser beam is input to the semiconductor optical amplifier 200 and then output from the amplifier 200, and then input to the wavelength selective element 210 and then output from the wavelength selective element 210. Here, a highest-intensity peak component was extracted by the wavelength selective element 210 from a spectrum shifted to a long wavelength side by self-phase modulation. Various specifications in respective states illustrated in FIGS. 2A to 2C are shown in the following Table 5. In Table 5, "Electric current 2" means an electric current (mA) applied to the second electrode 262.

TABLE 5

| | FIG. 13A | FIG. 13B | FIG. 13C |
|---|---|---|---|
| Electric current 2 | | 1050 mA | 1050 mA |
| Mean power | | 241 mW | 90 mW |
| Peak wavelength | 402.75 nm | 403.10 nm | 403.10 nm |
| Δλ | | | 0.32 nm |
| Pulse width | | 1.20 ps | 1.00 ps |
| Peak power | | 200 W | 90 W |

In this way, when the mode-locked laser diode device 10 is changed from a continuous oscillation state to a pulsed oscillation state, a peak wavelength of the laser beam is shifted by 0.35 nm to a long wavelength side. When the mode-locked laser diode device 10 is pulse-oscillated, pulse width of a laser beam (see FIG. 13B) is 1.20 picoseconds. On the other hand, pulse width of a laser beam (see FIG. 13C) after extracting, by the wavelength selective element 210, a main peak on a long wavelength side from a pulsed laser beam emitted from the mode-locked laser diode device 10 is 1.00 picoseconds, showing that duration of the generated laser beam is reduced as a result of spectrum extraction by the wavelength selective element 210. That is, laser light output, which is coherent and has short pulse duration, is provided. Transmission spectral width of the wavelength selective element 210 used herein is Δλ=0.40 nm. Actual spectral width of light after passing through the wavelength selective element 210 was Δλ=0.32 nm.

Mean power of a laser beam after extracting, by the wavelength selective element 210, a main peak on the long wavelength side from a pulsed laser beam emitted from the mode-locked laser diode device 10 was 90 mW. Mean power of a pulsed laser beam output from the semiconductor optical amplifier 200 was 241 mW. The respective kinds of mean power are expressed to be 90 W or 200 W in peak power characterizing a property of a laser beam. In the laser diode assembly of the Example 4, use of the wavelength selective element 210 allows decrease in peak power to be smaller than decrease in mean power, which contributes to generation of a coherent laser beam. A value of the transmission spectral width of the wavelength selective element 210 is not limited to such a value, and optimum pulse duration may be obtained by appropriately selecting a value in correspondence to spread of a spectrum due to the self-phase modulation.

When a light output spectrum of a pulsed laser beam output from the semiconductor optical amplifier 200 contains a plurality of peaks, one of the peaks may be extracted by the wavelength selective element 210, and output to the outside. For example, when the light output spectrum of the pulsed laser beam mainly contains a plurality of peaks, 403.17 nm, 403.34 nm, and 403.81 nm, a peak of 403.81 nm as one of the plurality of peaks may be extracted by the wavelength selective element 210, and output to the outside.

Example 5

Figure 14:
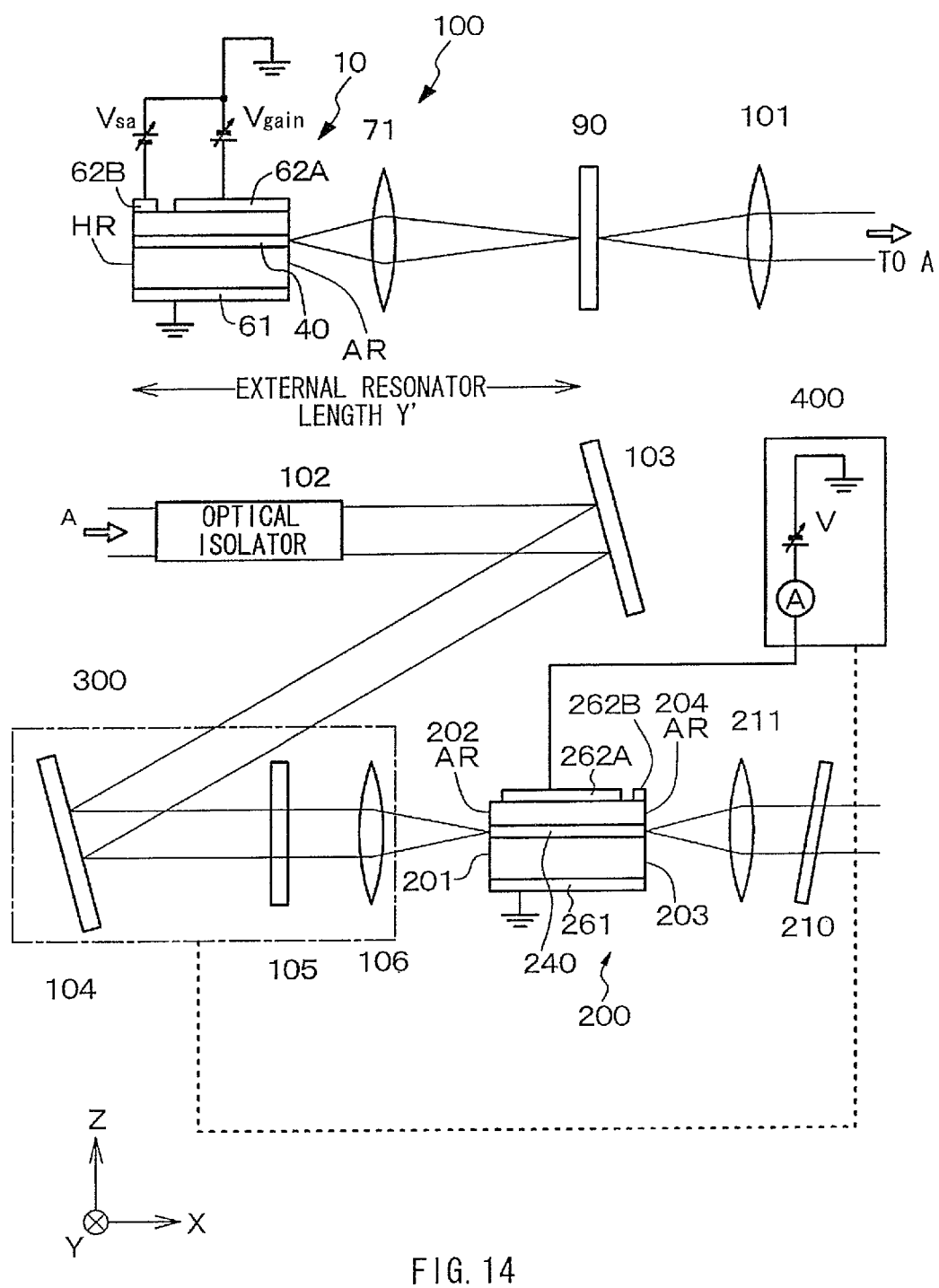
FIG. 14 is a conceptual diagram of a semiconductor optical amplifier assembly of Example 5 including a semiconductor optical amplifier.
Figure 15:
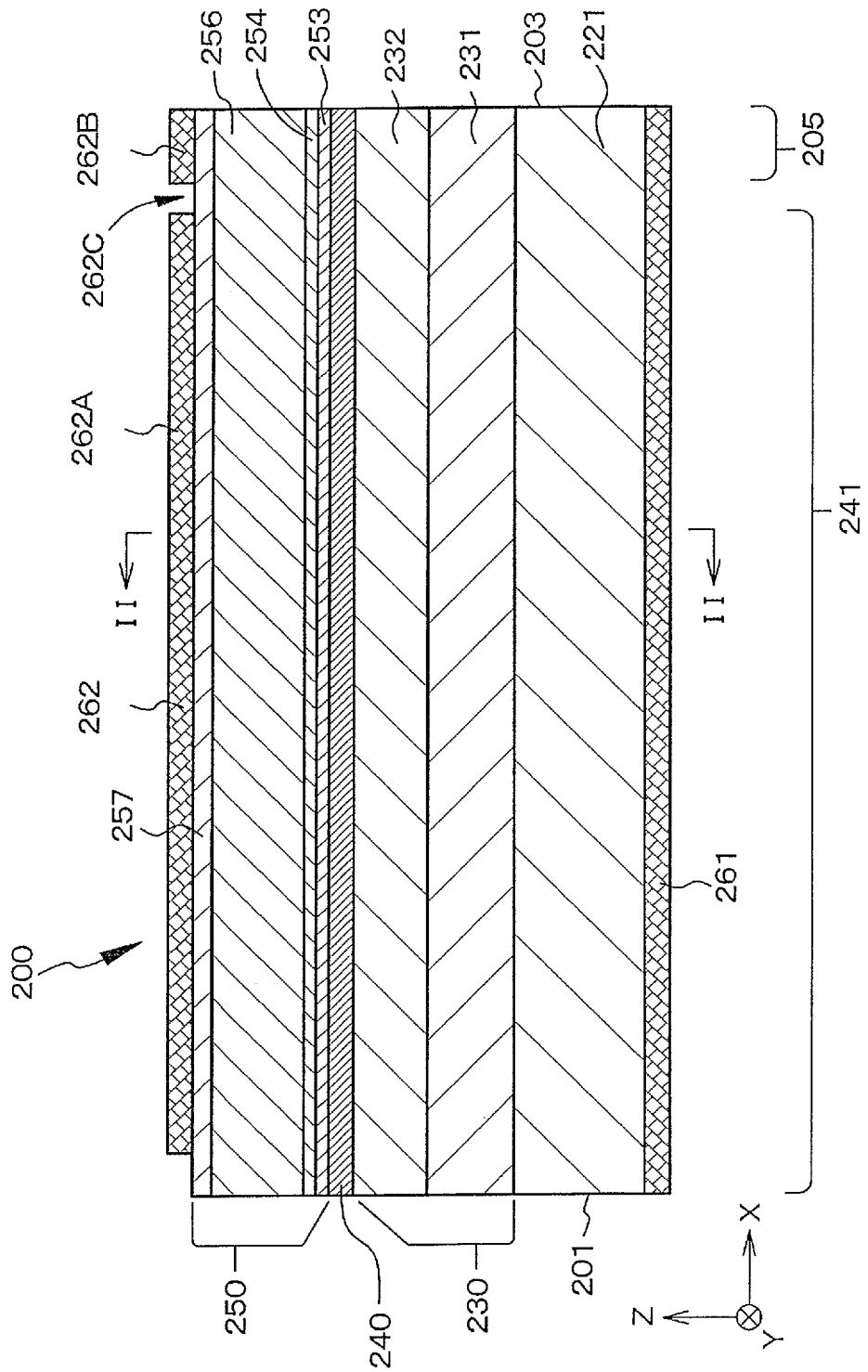
FIG. 15 is a schematic section view of the semiconductor optical amplifier of the Example 5 as cut along a virtual vertical plane (XZ plane) including an axis (X direction) of the semiconductor optical amplifier.
Figure 16:
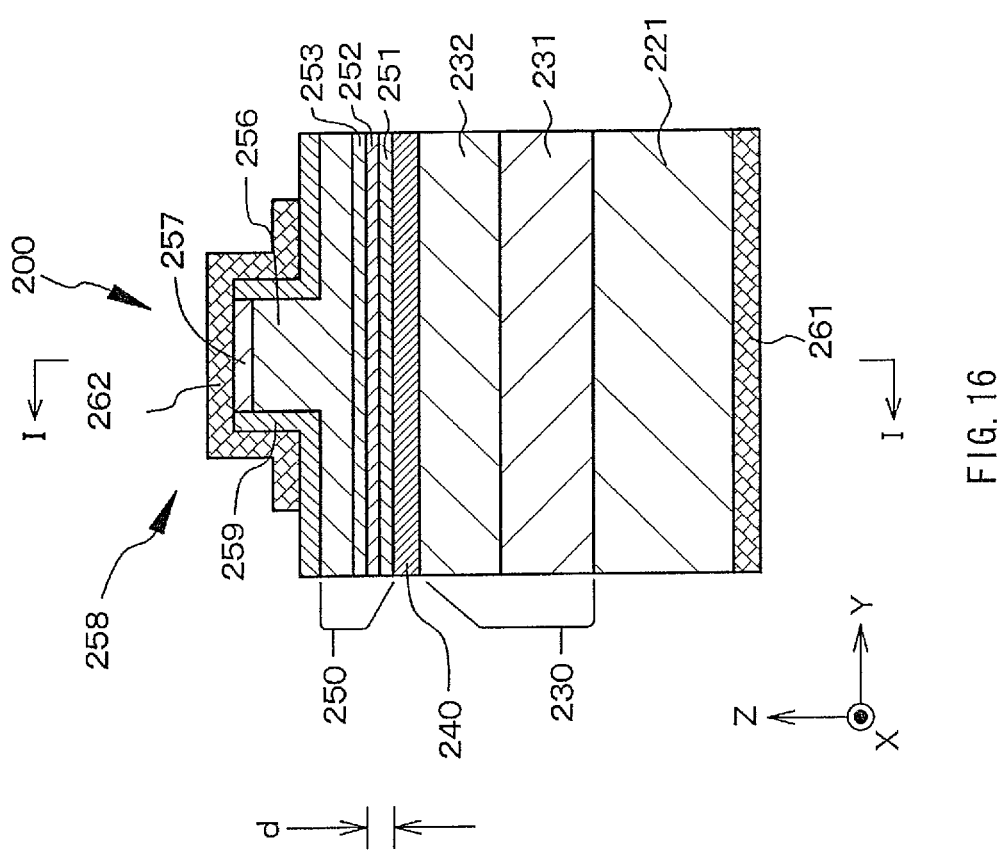
FIG. 16 is a schematic section view of the semiconductor optical amplifier of the Example 5 as cut along a virtual vertical plane (YZ plane) orthogonal to the axis of the semiconductor optical amplifier.
Figure 17:
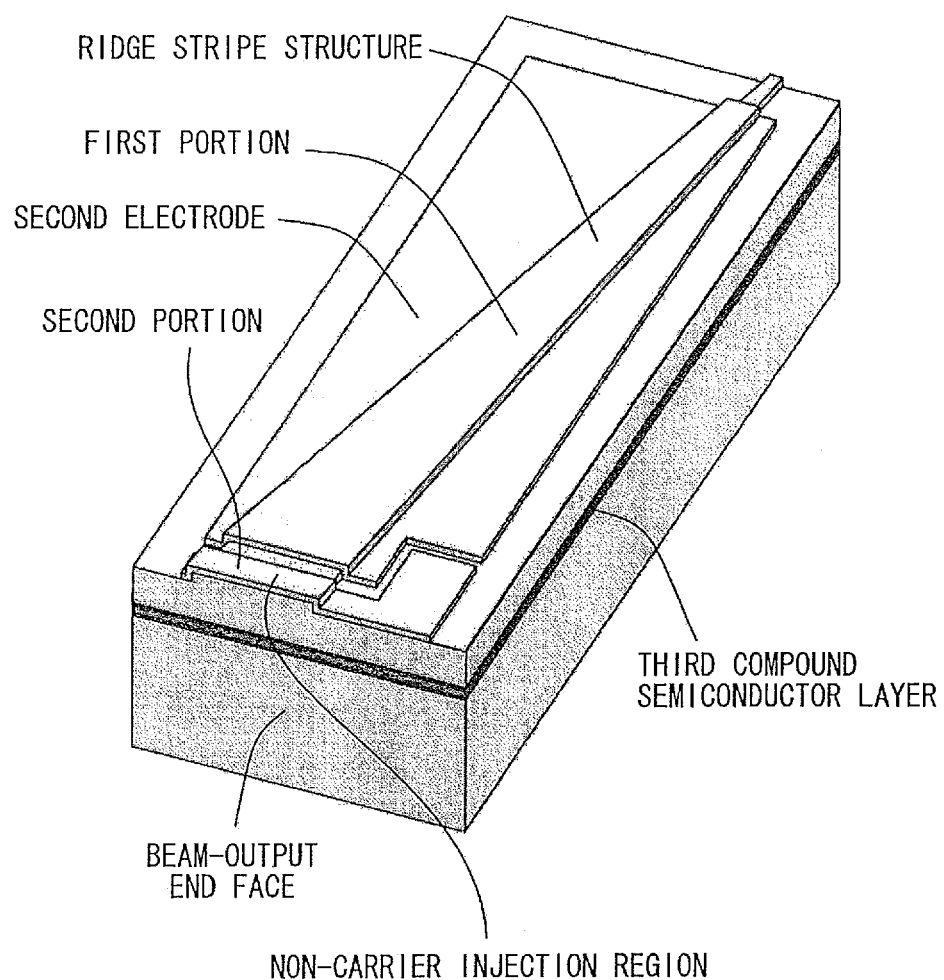
FIG. 17 is a schematic perspective view of the semiconductor optical amplifier of the Example 5.
Figure 18:
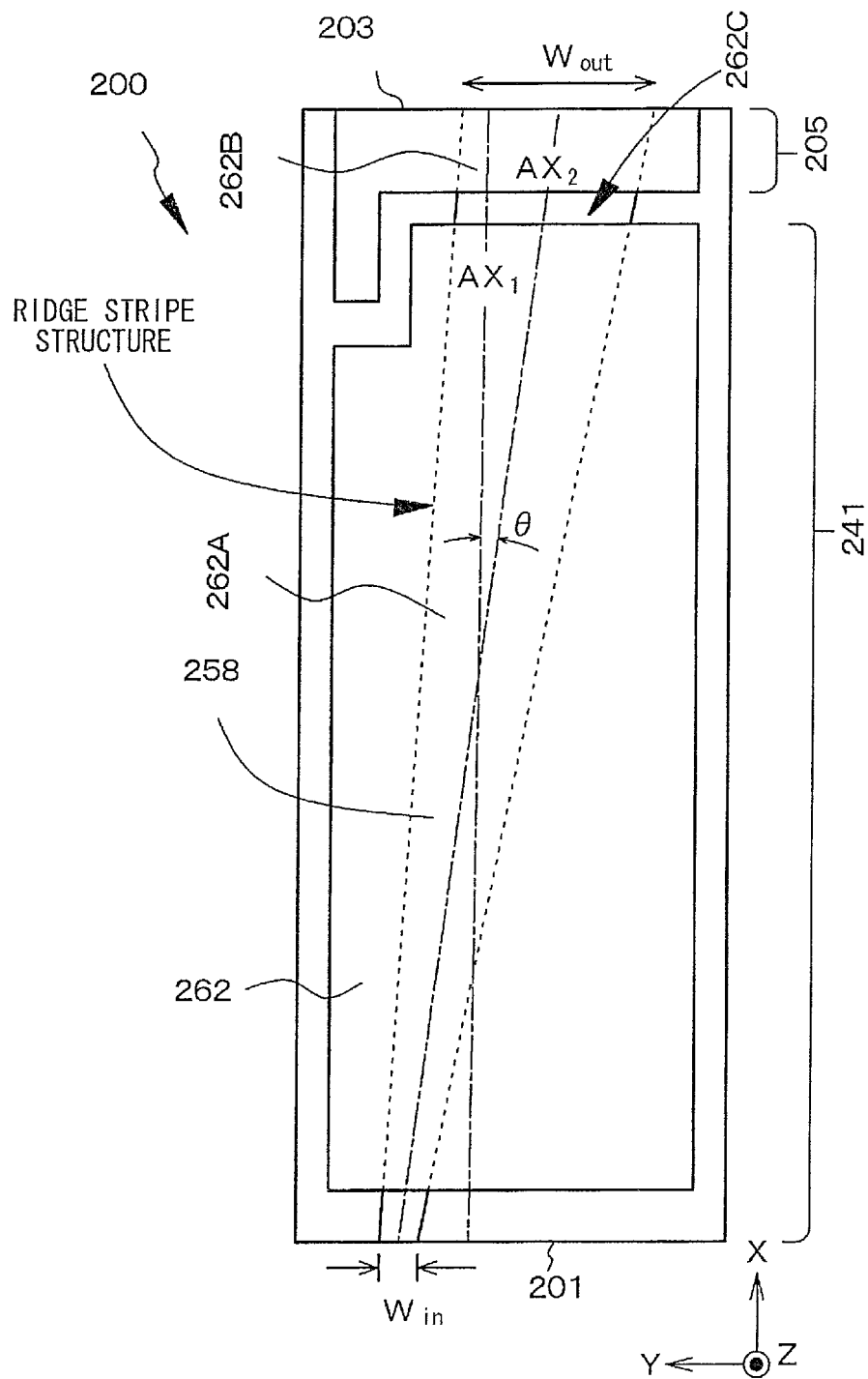
FIG. 18 is a schematic plan diagram of a ridge stripe structure of the semiconductor optical amplifier of the Example 5.

Example 5 is a modification of the Example 4. FIG. 14 illustrates a conceptual diagram of a semiconductor optical amplifier assembly of the Example 5 including a semiconductor optical amplifier, FIG. 15 illustrates a schematic section view of the semiconductor optical amplifier as cut along a virtual vertical plane (XZ plane) including an axis of the semiconductor optical amplifier (X direction), and FIG. 16 illustrates a schematic section view of the semiconductor optical amplifier as cut along a virtual vertical plane (YZ plane) orthogonal to the axis of the semiconductor optical amplifier. FIG. 15 is a schematic section view along an arrow I-I in FIG. 16, and FIG. 16 is a schematic section view along an arrow II-II in FIG. 15. FIG. 17 illustrates a schematic perspective view of the semiconductor optical amplifier, and FIG. 18 illustrates a schematic plan diagram of a ridge stripe structure.

A configuration or a structure of the mode-locked laser diode device configuring a laser light source is the same as that of the mode-locked laser diode device described in each of the Examples 1 to 3. Specifically, in the Example 5, a laser beam emitted by the mode-locked laser diode device enters the semiconductor optical amplifier 200.

In the Example 5, the second electrode is configured of a first portion 262A and a second portion 262B separated from each other by an isolation trench 262C, and the second portion 262B of the second electrode is provided in a non-carrier injection region 205. A voltage equal to or lower than the built-in voltage, specifically 0 V, is applied to the second portion 262B of the second electrode. While voltage is applied to the first portion 262A of the second electrode for light amplification as an original function of the semiconductor optical amplifier 200, voltage is applied to the second portion 262B of the second electrode to allow measurement for position adjustment.

In the Example 5, when length of the first portion 262A is denoted as $L_{Amp-1}$, and length of the second portion 262B is denoted as $L_{Amp-2}$, $$L_{Amp-1}=1.97 \text{ mm, and}$$

$$L_{Amp-2}=0.01 \text{ mm}$$

are established, satisfying $0.001 \leq L_{Amp-2}/L_{Amp-1} \leq 0.01$. Width of the isolation trench is 0.02 mm.

In the Example 5, a low voltage is applied to the second portion of the second electrode compared with to the first portion. This leads to formation of a non-carrier injection region including the second portion, and therefore even if light intensity of an input laser beam becomes higher, a phenomenon of increase in relative refractive index of the compound semiconductor layer may be suppressed. Consequently, a laser beam output from the beam-output end face of the semiconductor optical amplifier easily spreads in a width direction. In addition, area of a region occupied by a laser beam output from the semiconductor optical amplifier is large in the beam-output end face, making it possible to achieve high output of the semiconductor optical amplifier.

The semiconductor optical amplifier assembly of the Example 5 further includes an aligner 300 that adjusts a relative position of the semiconductor optical amplifier to a laser beam input to the semiconductor optical amplifier 200, and a semiconductor optical amplifier controller 400 that controls operation of the semiconductor optical amplifier 200. The semiconductor optical amplifier controller 400 is specifically configured of a combination of a known DC power supply, a known voltmeter, and a known ammeter. A resolution of a voltage monitor of the semiconductor optical amplifier controller 400 is 1 mV or less, more specifically 0.1 mV or less. In addition, a resolution of a current monitor of the semiconductor optical amplifier controller 400 is 100 µA or less, more specifically 10 µA or less.

The semiconductor optical amplifier assembly of the Example 5 illustrated in FIG. 14 has the same configuration as the semiconductor optical amplifier assembly described in the Example 4. A reflective mirror 104, a half-wave plate 105, and a lens 106 are set on the aligner 300. The aligner 300 is specifically configured of an XYZ stage. When a thickness direction of a stacked structure of the following semiconductor optical amplifier 200 is a Z direction, and an axis direction of the semiconductor optical amplifier 200 is an X direction, the reflective mirror 104 and the lens 106 are moved in respective X, Y, and Z directions by the aligner 300.

In the Example 5, while a laser beam is input to the semiconductor optical amplifier 200 from the laser light source 100, a predetermined value of voltage (equal to or lower than built-in voltage) is applied to the second portion 262B of the semiconductor optical amplifier 200. In addition, a relative position of the semiconductor optical amplifier 200 to a laser beam input to the semiconductor optical amplifier 200 is adjusted such that electric current flowing through the semiconductor optical amplifier 200 is maximized.

Specifically, in the Example 5, when a predetermined value of voltage $V_0$ is applied to the semiconductor optical amplifier 200 while a laser beam is not input to the semiconductor optical amplifier 200 from the laser light source 100, an electric current flowing through the second portion 262B of the semiconductor optical amplifier 200 is denoted as $I_1$, and when the predetermined value of voltage $V_0$ is applied to the semiconductor optical amplifier 200 while a laser beam is input to the semiconductor optical amplifier 200 from the laser light source 100, an electric current flowing through the second portion 262B of the semiconductor optical amplifier 200 is denoted as $I_2$, and a relative position of the semiconductor optical amplifier 200 to a laser beam input to the semiconductor optical amplifier 200 is adjusted such that a value of $\Delta I=(I_2-I_1)$ is maximized.

Figure 19:
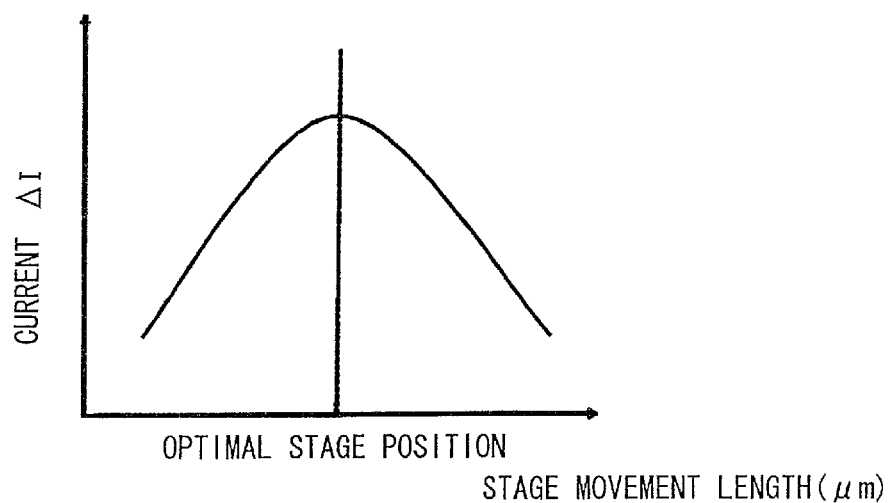
FIG. 19 is a graph schematically showing change of current flowing through the semiconductor optical amplifier of the Example 5 when an XYZ stage is moved in a Y direction while a predetermined value of voltage is applied to the semiconductor optical amplifier while a laser beam is input to the semiconductor optical amplifier from a laser light source.

FIG. 19 schematically shows change of current $\Delta I$ flowing through the semiconductor optical amplifier 200 when the XYZ stage is moved in the Y direction while the predetermined value of voltage is applied to the semiconductor optical amplifier 200 while a laser beam is input to the semiconductor optical amplifier 200 from the laser light source 100. The current $\Delta I$ flowing through the semiconductor optical amplifier 200 increases monotonically with movement of the XYZ stage in the Y direction, and when the current reaches the maximum value, then the current decreases monotonically. Here, change of light output of a laser beam output from the semiconductor optical amplifier 200 shows the same behavior as the change of current. Accordingly, a relative position of the semiconductor optical amplifier 200 to a laser beam input to the semiconductor optical amplifier 200 is adjusted such that an electric current flowing through the semiconductor optical amplifier 200 is maximized, thereby light output of a laser beam emitted from the semiconductor optical amplifier 200 may be maximized.

In the semiconductor optical amplifier 200 of the Example 5, when the predetermined value of voltage $V_0$ is applied to the semiconductor optical amplifier 200 while a laser beam is input to the semiconductor optical amplifier 200 from the laser light source 100, and the XYZ stage is moved in the Y direction, a voltage applied to the semiconductor optical amplifier 200 increase as shown in FIG. 19. That is, light output from the semiconductor optical amplifier 200 increases with movement of the XYZ stage, and when such a phenomenon occurs, since the number of carriers decreases in a light amplification region (carrier injection region and gain region) 241, an electric current flowing through the semiconductor optical amplifier 200 increases to compensate such decrease in number of carriers. In the Example 5, an alignment method of the semiconductor optical amplifier and the semiconductor optical amplifier assembly are provided based on such a phenomenon. The aligner (XYZ stage) 300 may be moved by an operator, or may be automatically moved according to an instruction from the semiconductor optical amplifier controller 400 based on a measurement result of voltage.

In the Example 5, since an electric current applied to the semiconductor optical amplifier 200 is measured to adjust a relative position of the semiconductor optical amplifier 200 to a laser beam input to the semiconductor optical amplifier 200, measurement for position adjustment may be performed without depending on an external monitoring device. Accordingly, the relative position of the semiconductor optical amplifier 200 to the laser beam input to the semiconductor optical amplifier 200 may be accurately adjusted.

The electric currents $I_1$ and $I_2$ flowing through the second portion 262B of the semiconductor optical amplifier 200 are monitored, thereby an operation state of each of the semiconductor optical amplifier 200 and the mode-locked laser diode device 10 may be monitored.

The semiconductor optical amplifier 200 may be manufactured by the same manufacturing method as that of the mode-locked laser diode device 10 described in the Example 1, and therefore detailed description of the method is omitted.

Figure 20:
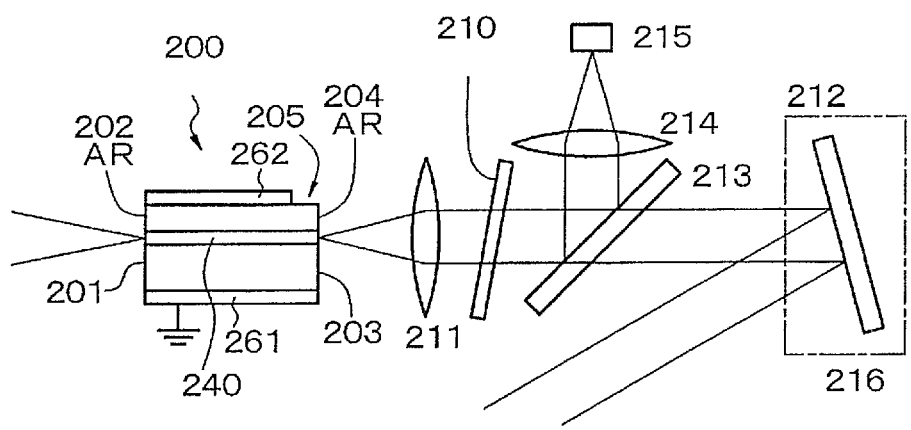
FIG. 20 is a conceptual diagram of a modification of the semiconductor optical amplifier assembly of the Example 5.

As shown in a conceptual diagram of FIG. 20, part of light output of a laser beam output from the semiconductor optical amplifier 200 is extracted using a beam splitter 213, and input to a photodiode 215 through a lens 214, thereby light output of the laser beam output from the semiconductor optical amplifier 200 may be measured.

When the light output is deviated from a desired value, the alignment method of the semiconductor optical amplifier in the Example 5 is performed again. Specifically, while a predetermined value of voltage $V_0$ is applied to the semiconductor optical amplifier 200 while a laser beam is input to the semiconductor optical amplifier 200 from the laser light source 100, a relative position of the semiconductor optical amplifier 200 to the laser beam input to the semiconductor optical amplifier 200 is readjusted such that an electric current flowing through the semiconductor optical amplifier 200 is maximized. When a relative position of the semiconductor optical amplifier 200 to the laser beam input to the semiconductor optical amplifier 200 obtained as a result of such readjustment is the same as a relative position of the semiconductor optical amplifier 200 to the laser beam input to the semiconductor optical amplifier 200 before readjustment, a light path, through which a laser beam output from semiconductor optical amplifier 200 passes, is adjusted. Such adjustment may be performed, for example, by setting a reflective mirror 212 on the XYZ stage 216. The XYZ stage 216 may be moved by an operator, or may be automatically moved according to an instruction from the semiconductor optical amplifier controller 400 based on a measurement result of voltage and on a measurement result by the photodiode 215. In FIG. 20, since components of the semiconductor optical amplifier assembly on an upstream side of the semiconductor optical amplifier 200 are the same as those in the Example 5, illustration of such components of the semiconductor optical amplifier assembly is omitted. Such a method is used, thereby when some change occurs in monitoring of light output, whether or not such change is due to change of the relative position of the semiconductor optical amplifier 200 to the laser beam input to the semiconductor optical amplifier 200 (change of coupling efficiency between an incident laser beam and a light guide of the semiconductor optical amplifier) may be easily determined.

Example 6

Figure 21A:
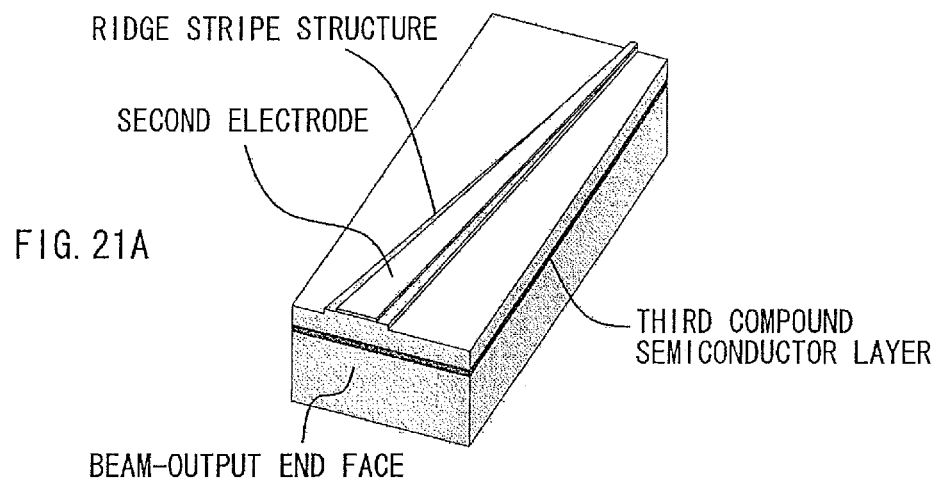
FIGS. 21A and 21B are schematic perspective views of semiconductor optical amplifiers of Examples 6 and 7, respectively.
Figure 22:
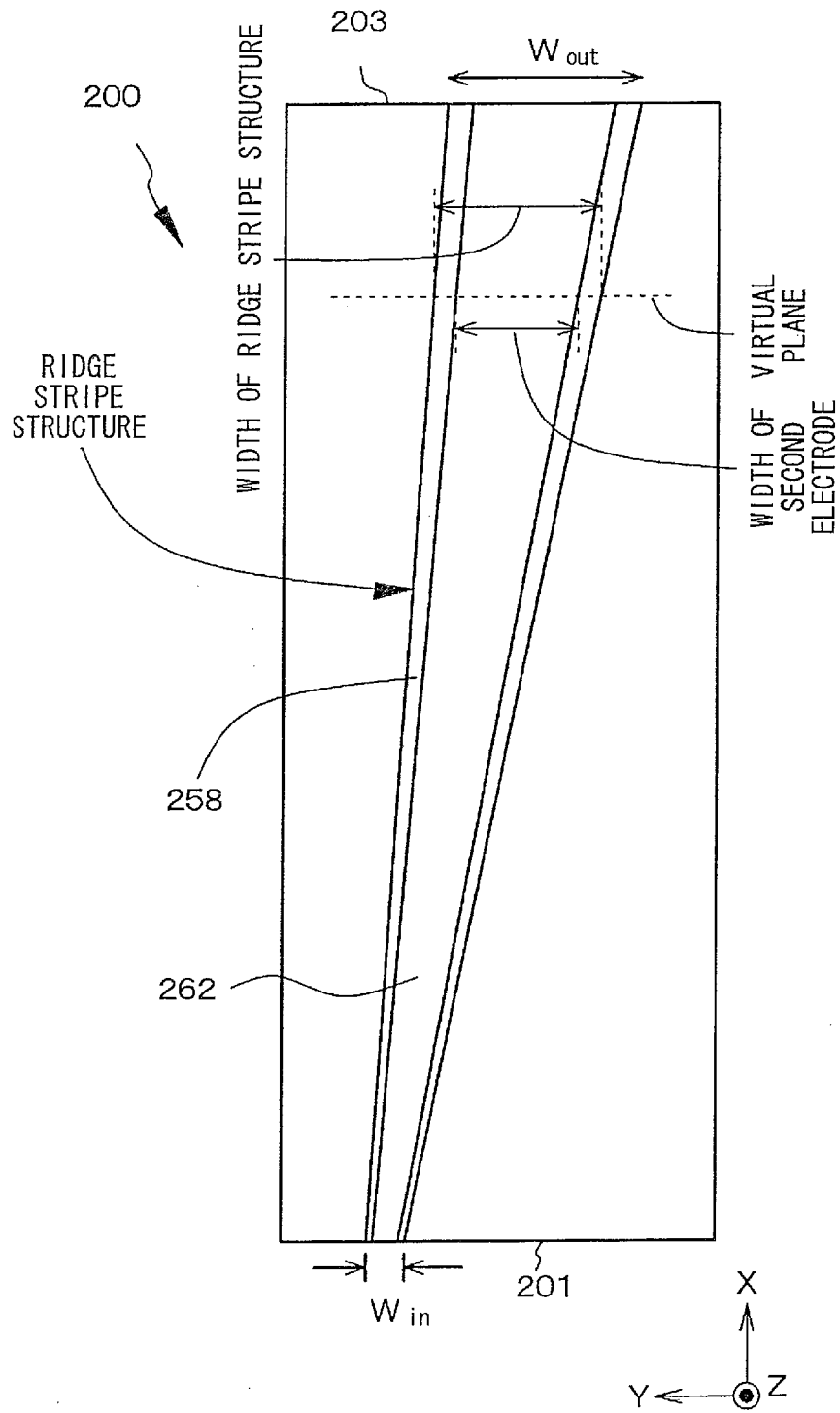
FIG. 22 is a schematic plan diagram of a ridge stripe structure of the semiconductor optical amplifier of the Example 6 illustrated in FIG. 21A.
Figure 23A:
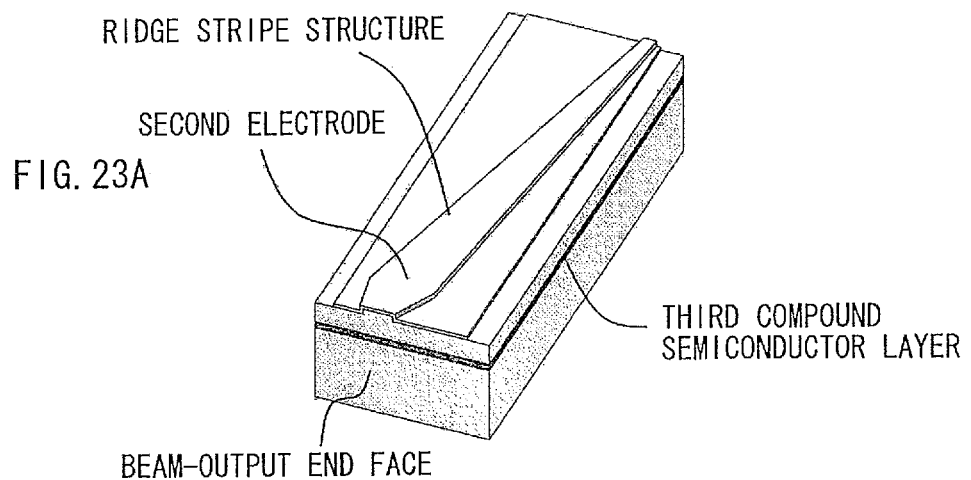
FIGS. 23A and 23B are schematic perspective views of modifications of the semiconductor optical amplifiers of the Examples 6 and 7, respectively.
Figure 24:
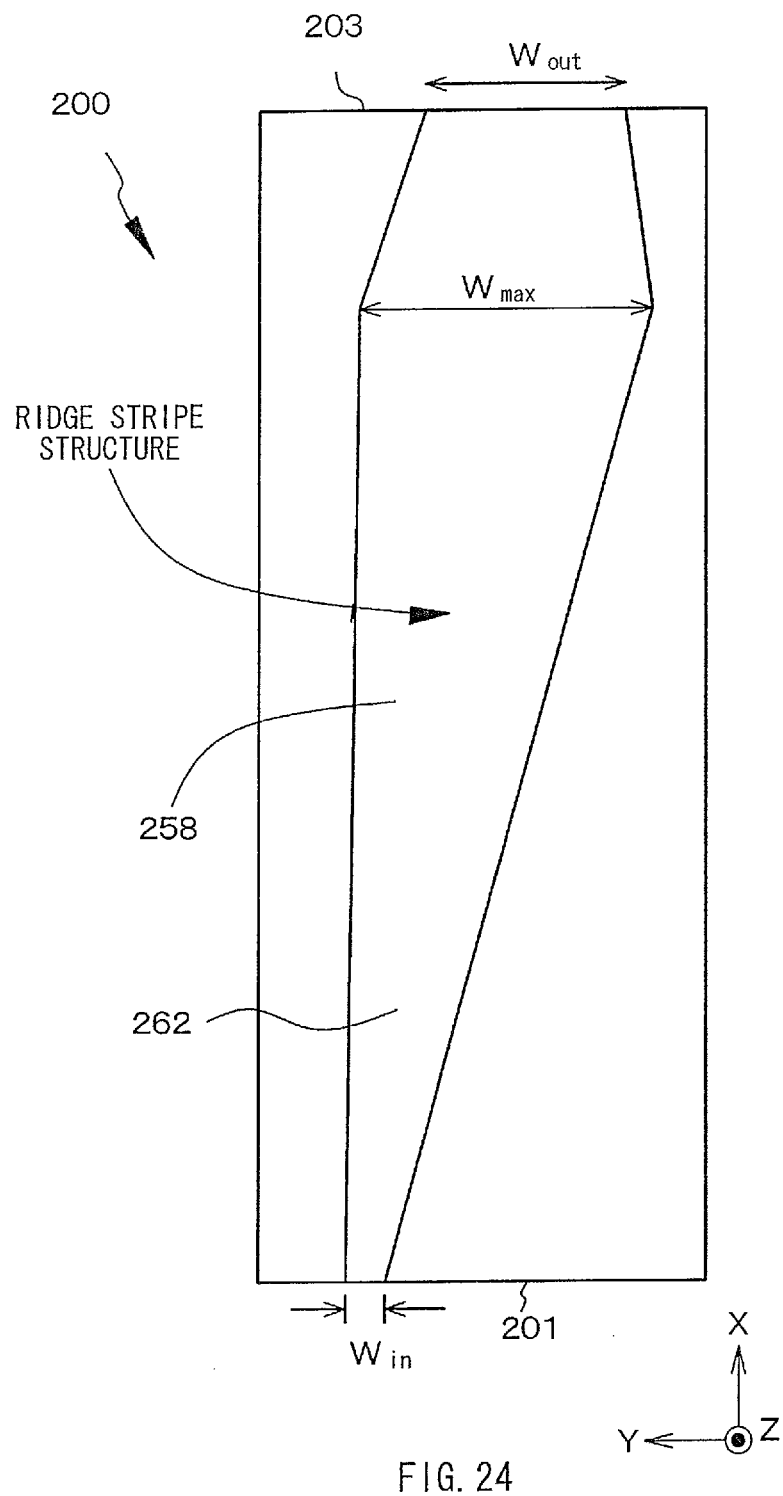
FIG. 24 is a schematic plan diagram of a ridge stripe structure of the modification of the semiconductor optical amplifier of the Example 6 illustrated in FIG. 23A.

Example 6 is a modification of the Example 4, and relates to a semiconductor optical amplifier assembly according to the second and third embodiments. FIGS. 21A and 22 illustrate a schematic perspective view of the semiconductor optical amplifier assembly according to the second embodiment of the Example 6 and a schematic plan diagram of a ridge stripe structure of the assembly, respectively, where width of a second electrode 262 is narrower than width of the ridge stripe structure. Here, a value of a ratio of width of the second electrode to width of the ridge stripe structure satisfies 0.2 to 0.9 both inclusive. Alternatively, FIGS. 23A and 24 show a schematic perspective view of the semiconductor optical amplifier assembly according to the third embodiment of the Example 6 and a schematic plan diagram of a ridge stripe structure of the assembly, respectively, where when maximum width of the ridge stripe structure is denoted as $W_{max}$, $W_{max} > W_{out}$ is satisfied. Here, $0.2 \geq W_{out}/W_{max} \leq 0.9$ is satisfied.

While illustration of the second electrode 262 is omitted in FIG. 24, the second electrode 262 is formed over a region from a p-type GaN contact layer corresponding to a top surface of the ridge portion to a part of a top surface of a p-type AlGaN cladding layer, as in the Example 4.

A configuration or a structure of the semiconductor optical amplifier in the Example 6 may be the same as that of the semiconductor optical amplifier described in the Example 4 except that a non-carrier injection region is not provided, and therefore detailed description thereof is omitted.

As illustrated in FIG. 12B, when width of a near-field image is narrower than $W_{out}$, an optical field may be unstable depending on a drive condition or light output condition such as light density, diffusion length of carriers, and device temperature. In the Example 6, each of the configurations or structures described above is used to reduce instability in mode.

Example 7

Figure 21B:
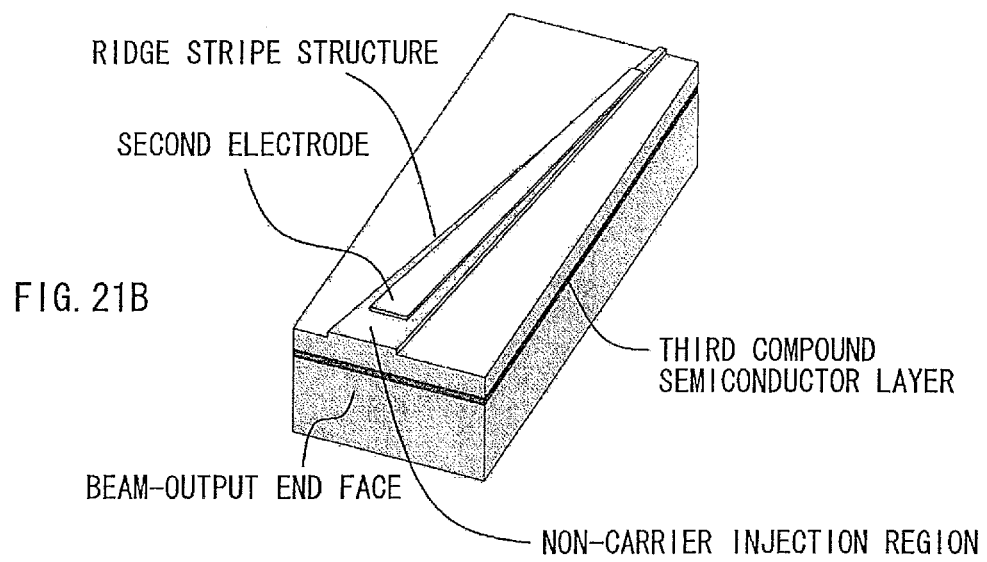
Figure 23B:
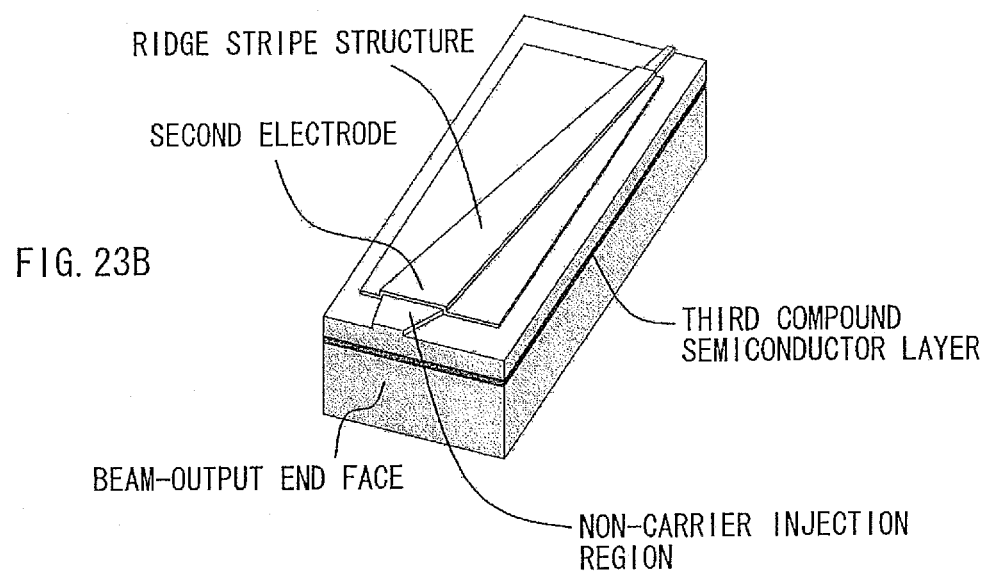

Example 7 is a modification of the Example 6. FIG. 21B illustrates a schematic perspective view of a modification of the semiconductor optical amplifier illustrated in FIGS. 21A and 22, and FIG. 23B illustrates a schematic perspective view of a modification of the semiconductor optical amplifier illustrated in FIGS. 23A and 24. As in the figures, in the Example 7, a non-carrier injection region is provided along an axis of the semiconductor optical amplifier over a certain region of a stacked structure from a beam-output end face, unlike the Example 6. Except for this, a configuration or a structure of the semiconductor optical amplifier of the Example 7 is the same as that of the semiconductor optical amplifier described in the Example 6, and therefore detailed description thereof is omitted. Even in the Example 7, the second electrode may be separated into first and second portions by an isolation trench, as in the Example 5.

While the disclosure has been described with the preferable Examples hereinbefore, the disclosure is not limited to the Examples. The configurations or the structures of the laser diode assembly, the semiconductor optical amplifier assembly, the mode-locked laser diode device, and the semiconductor optical amplifier described in the Examples are merely shown as an example, and may be appropriately modified or altered. While various values have been shown in the Examples, the values are merely shown as an example. For example, it is needless to say that if specifications of a laser diode device or a semiconductor optical amplifier to be used are changed, the configuration or the structure is changed.

Figure 25:
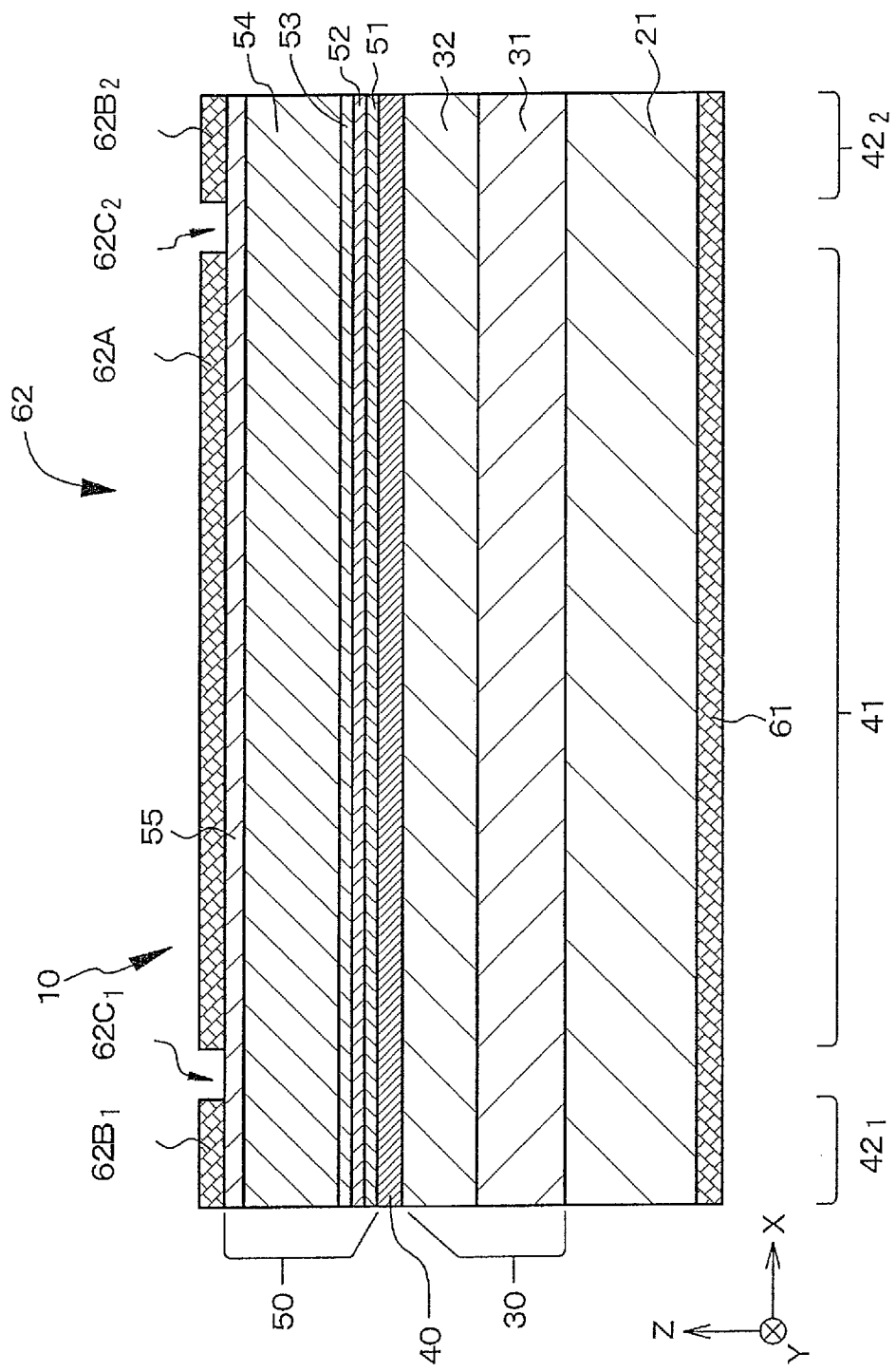
FIG. 25 is a schematic end view, along an extending direction of a resonator, of a modification of the mode-locked laser diode device in the Example 1.
Figure 26:
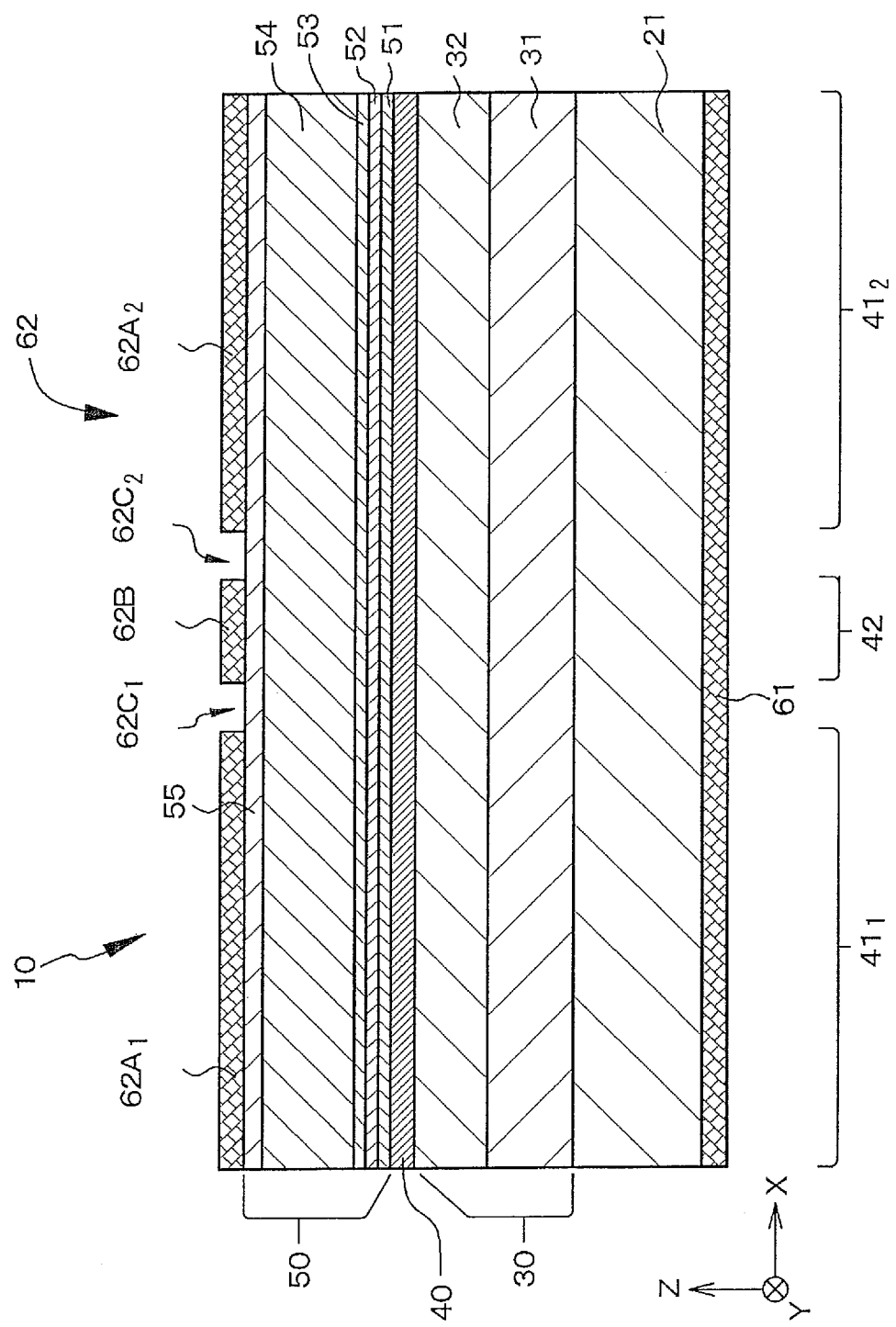
FIG. 26 is a schematic end view, along an extending direction of a resonator, of another modification of the mode-locked laser diode device in the Example 1.

The number of the light emitting region 41 or the saturable absorption region 42 is not limited to one. FIG. 25 illustrates a schematic end view of a mode-locked laser diode device having one first portion 62A of a second electrode and two second portions $62B_1$ and $62B_2$ thereof. In the mode-locked laser diode device, one end of the first portion 62A is opposed to one second portion $62B_1$ across one isolation trench $62C_1$, and the other end of the first portion 62A is opposed to the other second portion $62B_2$ across the other isolation trench $62C_2$. In addition, one light emitting region 41 is interposed between two saturable absorption regions $42_1$ and $42_2$. FIG. 26 illustrates a schematic end view of a mode-locked laser diode device having two first portions $62A_1$ and $62A_2$ of a second electrode and one second portion 62B thereof. In the mode-locked laser diode device, one end of the second portion 62B is opposed to one first portion $62A_1$ across one isolation trench $62C_1$, and the other end of the second portion 62B is opposed to the other first portion $62A_2$ across the other isolation trench $62C_2$. In addition, one saturable absorption region 42 is interposed between two light emitting regions $41_1$ and $41_2$.

Figure 27:
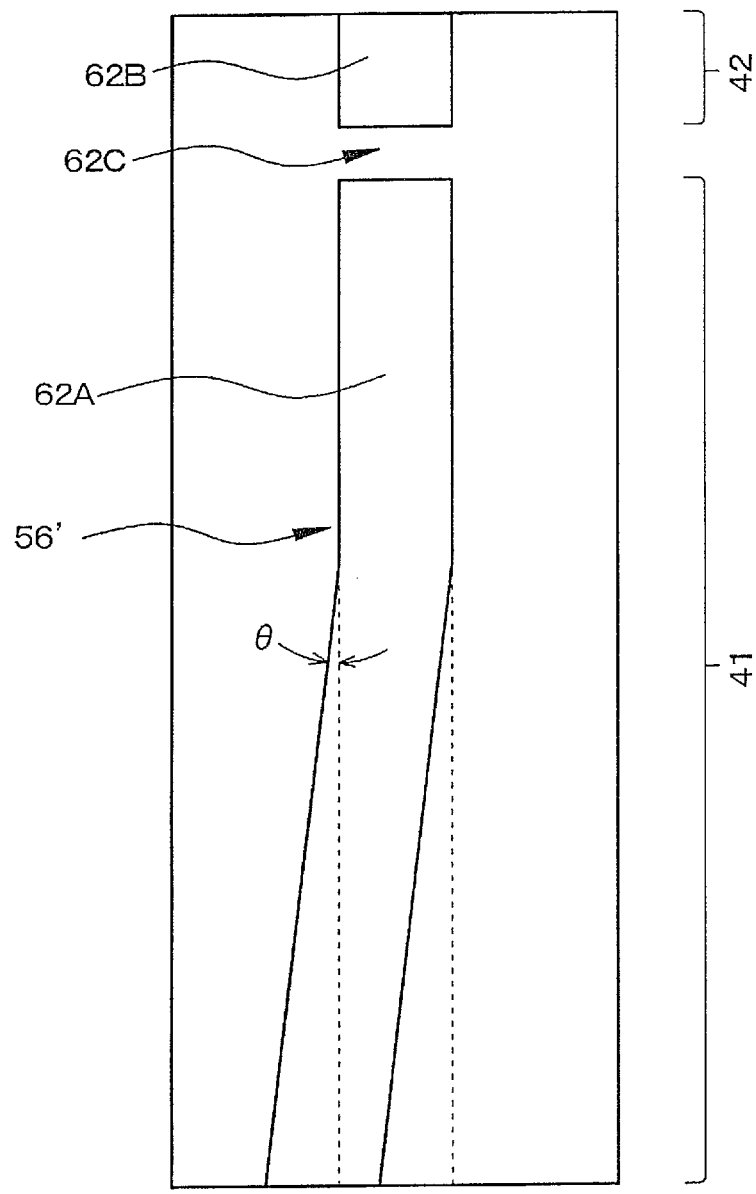
FIG. 27 is a schematic diagram of a ridge portion of still another modification of the mode-locked laser diode device in the Example 1 as viewed from an upper side.

The mode-locked laser diode device may be a slant-ridge-stripe type laser diode device with a separate confinement heterostructure having a slant waveguide. FIG. 27 illustrates a schematic diagram of a ridge portion 56' of such a mode-locked laser diode device as viewed from an upper side. The mode-locked laser diode device has a structure including two linear ridge portions combined with each other, where a value of a crossed axes angle 0 of the two ridge portion is desirably in a range of, for example, $0<\theta \le 10$ (degrees), preferably, $0<\theta \le 6$ (degrees). The slant-ridge-stripe type is used, allowing reflectance of an end face with anti-reflection coating to be close to an ideal value of 0%. As a result, a laser beam may be prevented from circulating within the laser diode, which may advantageously suppress generation of a sub laser beam involved in a main laser beam.

While the mode-locked laser diode device 10 has been provided on the C plane, or the {0001} plane, as a polar plane of the n-type GaN substrate 21 in the Examples, the mode-locked laser diode device 10 may be provided on a nonpolar plane such as an A plane, {11-20} plane, an M plane, {1-100} plane, or a {1-102} plane, or on a semipolar plane such as a {11-2n} plane including {11-24} plane and {11-22} plane, a {10-11} plane, or a {10-12} plane, instead. Consequently, even if piezoelectric polarization and spontaneous polarization occurs in the third compound semiconductor layer of the mode-locked laser diode device 10, piezoelectric polarization hardly occurs in a thickness direction of the third compound semiconductor layer, and occurs in a direction substantially perpendicular to the thickness direction of the third compound semiconductor layer, which may eliminate adverse effects due to piezoelectric polarization or spontaneous polarization. The {11-2n} plane means a nonpolar plane at approximately 40 degrees from the C plane. In addition, when the mode-locked laser diode device 10 is provided on the nonpolar or semipolar plane, the limit of thickness of the well layer (1 nm or more and 10 nm or less) and the limit of impurity doping concentration of the barrier layer ($2*10^{18}$ $cm^{-3}$ or more and $1*10^{20}$ $cm^{-3}$ or less) as described in the Example 3 may be eliminated.

In addition, a modification of the Example 5 may include a configuration where a predetermined value of electric current is applied to a semiconductor optical amplifier while a laser beam is input to the semiconductor optical amplifier from a laser light source, a relative position of the semiconductor optical amplifier to the laser beam input to the semiconductor optical amplifier is adjusted such that voltage applied to the semiconductor optical amplifier is maximized. In this case, light output of a laser beam output from the semiconductor optical amplifier is measured, and when the light output is deviated from a desired value, a predetermined value of current is applied to the semiconductor optical amplifier while a laser beam is input to the semiconductor optical amplifier from the laser light source, a relative position of the semiconductor optical amplifier to the laser beam input to the semiconductor optical amplifier may be readjusted such that voltage applied to the semiconductor optical amplifier is maximized. Furthermore, when a relative position of the semiconductor optical amplifier to the laser beam input to the semiconductor optical amplifier obtained as a result of such readjustment is the same as a relative position of the semiconductor optical amplifier to the laser beam input to the semiconductor optical amplifier before readjustment, a light path, through which a laser beam output from semiconductor optical amplifier passes, may be adjusted. Specifically, the modification may include a configuration where when a predetermined value of current $I_0$ is applied to the semiconductor optical amplifier while a laser beam is not input to the semiconductor optical amplifier from the laser light source, a voltage applied to the semiconductor optical amplifier is denoted as $V_1$, and when the predetermined value of current $I_0$ is applied to the semiconductor optical amplifier while a laser beam is input to the semiconductor optical amplifier from the laser light source, a voltage applied to the semiconductor optical amplifier is denoted as $V_2$, and a relative position of the semiconductor optical amplifier to a laser beam input to the semiconductor optical amplifier is adjusted such that a value of $\Delta V=(V_2-V_1)$ is maximized. The predetermined value of current includes, for example, $0<\Delta I \le 20$ mA.

Alternatively, a modification of the Example 5 may include a configuration where a predetermined value of voltage is applied to a semiconductor optical amplifier while a laser beam is input to the semiconductor optical amplifier from a laser light source, a relative position of the semiconductor optical amplifier to the laser beam input to the semiconductor optical amplifier is adjusted such that electric current applied to the semiconductor optical amplifier is maximized. In this case, light output of a laser beam output from the semiconductor optical amplifier is measured, and when the light output is deviated from a desired value, a predetermined value of voltage is applied to the semiconductor optical amplifier while a laser beam is input to the semiconductor optical amplifier from the laser light source, a relative position of the semiconductor optical amplifier to the laser beam input to the semiconductor optical amplifier may be readjusted such that electric current applied to the semiconductor optical amplifier is maximized. Furthermore, when a relative position of the semiconductor optical amplifier to the laser beam input to the semiconductor optical amplifier obtained as a result of such readjustment is the same as a relative position of the semiconductor optical amplifier to the laser beam input to the semiconductor optical amplifier before readjustment, a light path, through which a laser beam output from semiconductor optical amplifier passes, may be adjusted. Specifically, the modification may include a configuration where when a predetermined value of voltage $V_0$ is applied to the semiconductor optical amplifier while a laser beam is not input to the semiconductor optical amplifier from the laser light source, a current applied to the semiconductor optical amplifier is denoted as $I_1$, and when the predetermined value of voltage $V_0$ is applied to the semiconductor optical amplifier while a laser beam is input to the semiconductor optical amplifier from the laser light source, a current applied to the semiconductor optical amplifier is denoted as $I_2$, a relative position of the semiconductor optical amplifier to a laser beam input to the semiconductor optical amplifier is adjusted such that a value of $\Delta I=(I_2-I_1)$ is maximized. The predetermined value of voltage includes, for example, $0 \le \Delta V \le 5$ V.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laser diode assembly comprising:
    a mode-locked laser diode device, where a light output spectrum shows long-wavelength shift by self-phase modulation;
    an external resonator; and
    a wavelength selective element positioned outside an optical path between the mode-locked laser diode device and the external resonator, wherein a light output spectrum of the pulsed laser beam emitted through the external resonator from the mode-locked laser diode device contains a plurality of peaks, and one of the peaks including a longer wavelength component of a pulsed laser beam emitted through the external resonator from the mode-locked laser diode device is extracted by the wavelength selective element, and output to the outside.

2. The laser diode assembly according to claim 1, wherein the external resonator is configured as a diffraction grating.

3. The laser diode assembly according to claim 1, wherein the external resonator is configured as a partial transmission mirror.

4. The laser diode assembly according to claim 1, wherein the wavelength selective element is configured as a bandpass filter.

5. The laser diode assembly according to claim 1, wherein the wavelength selective element is configured as a diffraction grating and an aperture selecting a primary or higher diffracted-beam output from the diffraction grating.

6. The laser diode assembly according to claim 1, wherein a second wavelength selective element is provided between the mode-locked laser diode device and the external resonator.

7. The laser diode assembly according to claim 6, wherein wavelength selective spectrum width of the second wavelength selective element is wider than that of the wavelength selective element.

8. A semiconductor optical amplifier assembly comprising:
a semiconductor optical amplifier, where a light output spectrum shows long-wavelength shift by self-phase modulation; and
a wavelength selective element positioned outside an optical path between the mode-locked laser diode device and the external resonator,
wherein a light output spectrum of the pulsed laser beam emitted through the external resonator from the mode-locked laser diode device contains a plurality of peaks, and one of the peaks including a longer wavelength component of a pulsed laser beam output from the semiconductor optical amplifier is extracted by the wavelength selective element, and output to the outside.

9. The semiconductor optical amplifier assembly according to claim 8, wherein the wavelength selective element is configured as a bandpass filter.

10. The semiconductor optical amplifier assembly according to claim 8, wherein the wavelength selective element is configured as a diffraction grating and an aperture selecting a primary or higher diffracted-beam output from the diffraction grating.

11. The laser diode assembly according to claim 1, wherein a highest-intensity peak component is extracted by the wavelength selective element, and output to the outside.

12. The laser diode assembly according to claim 1, wherein a peak component having the longest wavelength is extracted by the wavelength selective element, and output to the outside.

13. The laser diode assembly according to claim 1, wherein the wavelength selective element enables a decrease in peak power of the mode-locked laser diode device to be less than a decrease in mean power of the mode-locked laser diode device.

14. The semiconductor optical amplifier assembly according to claim 8, wherein a highest-intensity peak component is extracted by the wavelength selective element, and output to the outside.

15. The semiconductor optical amplifier assembly according to claim 8, wherein a peak component having the longest wavelength is extracted by the wavelength selective element, and output to the outside.

16. The semiconductor optical amplifier assembly according to claim 8, wherein the wavelength selective element enables a decrease in peak power of the mode-locked laser diode device to be less than a decrease in mean power of the mode-locked laser diode device.

* * * * *